United States Patent
Ikeda et al.

(10) Patent No.: US 7,133,996 B2
(45) Date of Patent: Nov. 7, 2006

(54) MEMORY DEVICE AND INTERNAL CONTROL METHOD THEREFOR

(75) Inventors: Shinichiro Ikeda, Kasugai (JP); Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 324 days.

(21) Appl. No.: 10/279,963

(22) Filed: Oct. 25, 2002

(65) Prior Publication Data

US 2003/0088753 A1    May 8, 2003

(30) Foreign Application Priority Data

Nov. 7, 2001  (JP) .............................. 2001-342164
Nov. 9, 2001  (JP) .............................. 2001-345266

(51) Int. Cl.
*G06F 12/06* (2006.01)
(52) U.S. Cl. ..................... 711/206; 711/219; 711/214
(58) Field of Classification Search ............... 711/202, 711/206, 207, 219, 105, 214, 203, 205
See application file for complete search history.

(56) References Cited

U.S. PATENT DOCUMENTS

| | | | |
|---|---|---|---|
| 5,307,320 A | | 4/1994 | Farrer et al. |
| 5,361,339 A | * | 11/1994 | Kadakia et al. ............. 711/211 |
| 5,596,736 A | * | 1/1997 | Kerns ............................ 711/4 |
| 5,706,461 A | * | 1/1998 | Branstad et al. ............ 711/203 |
| 5,724,553 A | | 3/1998 | Shigeeda |
| 5,829,012 A | * | 10/1998 | Marlan et al. ............. 711/102 |
| 6,507,898 B1 | * | 1/2003 | Gibson et al. ............. 711/168 |
| 6,560,685 B1 | * | 5/2003 | Jackson ...................... 711/165 |
| 6,640,296 B1 | * | 10/2003 | Takala ......................... 711/220 |
| 6,675,278 B1 | * | 1/2004 | Chowdhary et al. ....... 711/203 |
| 6,728,860 B1 | * | 4/2004 | Lloyd-Jones ............... 711/206 |
| 6,757,806 B1 | * | 6/2004 | Shim .......................... 711/203 |
| 6,804,771 B1 | * | 10/2004 | Jung et al. .................. 712/220 |
| 2002/0178335 A1 | * | 11/2002 | Selkirk et al. ............. 711/162 |
| 2003/0088753 A1 | * | 5/2003 | Ikeda et al. ................ 711/202 |
| 2003/0093646 A1 | * | 5/2003 | Stark .......................... 711/219 |
| 2004/0049630 A1 | * | 3/2004 | Stark .......................... 711/108 |

FOREIGN PATENT DOCUMENTS

| | | |
|---|---|---|
| JP | 63-201988 | 8/1988 |
| JP | 09-073776 | 3/1997 |
| JP | 2001-101865 | 4/2001 |

* cited by examiner

*Primary Examiner*—Brian R. Peugh
(74) *Attorney, Agent, or Firm*—Arent Fox PLLC

(57) ABSTRACT

A memory device for ensuring efficient access and reduction in current consumption. The memory device includes a plurality of memory cells arranged in accordance with a first address and a second address which define a logical address map indicating a logical shape of the memory array. An address map changing unit is operatively coupled to the memory array, for receiving a first address signal for generating the first address and a second address signal for generating the second address. The address map changing unit is capable of changing the logical address map by altering a part of one of the first address signal and the second address signal.

80 Claims, 52 Drawing Sheets

Fig.20

| | CE2 | /CE1 | /WE | /OE | /LB | /UB | LDQ | UDQ | Mode |
|---|---|---|---|---|---|---|---|---|---|
| 1 | L | * | * | * | * | * | HZ | HZ | PD |
| 2 | H | H | * | * | * | * | HZ | HZ | STB |
| 3 | H | L | H | H | * | * | HZ | HZ | OD |
| 4 | H | L | L | H | L | L | Din | Din | WR |
| 5 | H | L | L | H | L | H | Din | * | LWR |
| 6 | H | L | L | H | H | L | * | Din | UWR |
| 7 | H | L | L | H | H | H | * | * | Non WR |
| 8 | H | L | H | L | L | L | Dout | Dout | RD |
| 9 | H | L | H | L | L | H | Dout | HZ | LRD |
| 10 | H | L | H | L | H | L | HZ | Dout | URD |
| 11 | H | L | H | L | H | H | HZ | HZ | Non RD |

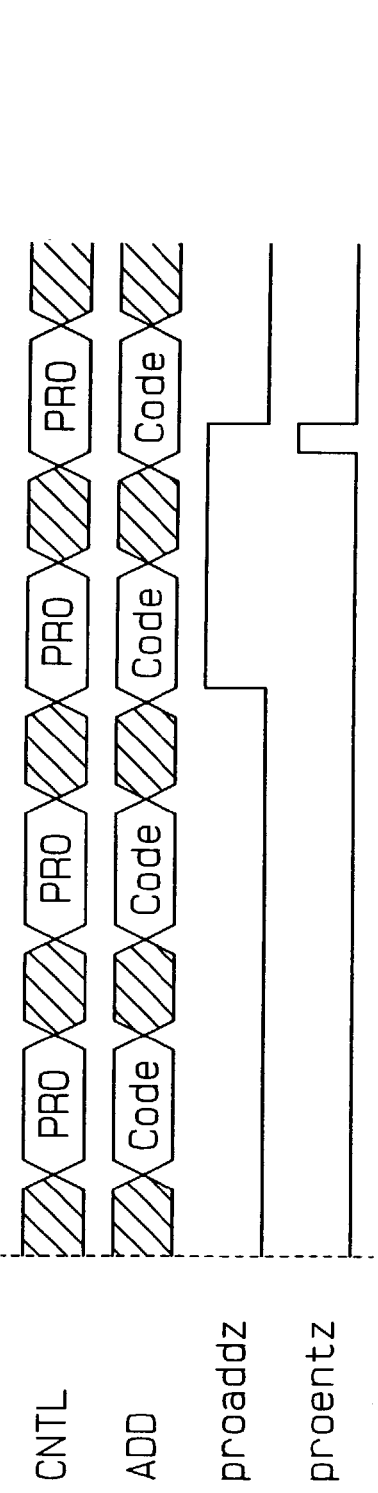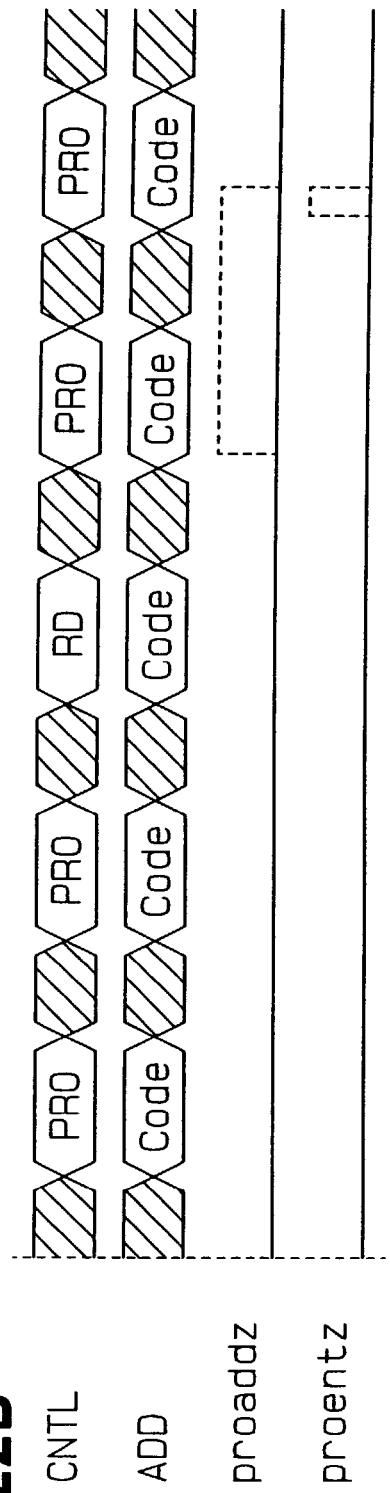

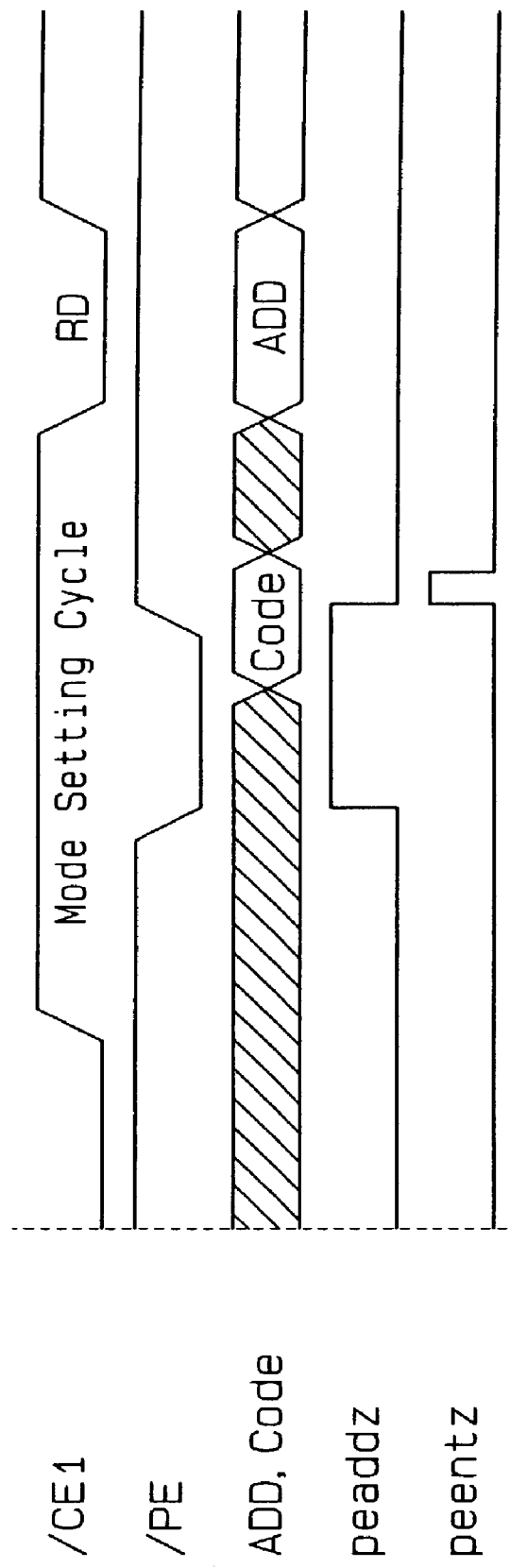

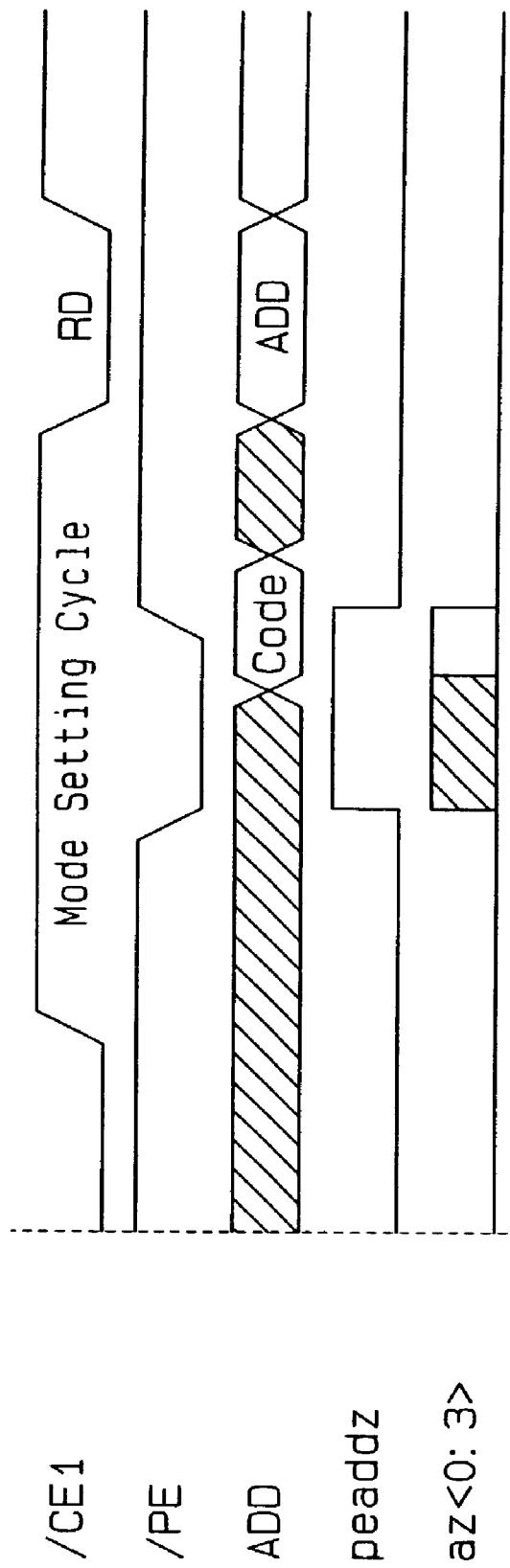

MEMORY DEVICE AND INTERNAL CONTROL METHOD THEREFOR

This application is based upon and claims priority of Japanese Patent Applications No. 2001-342164, filed on Nov. 7, 2001 and No. 2001-345266, filed on Nov. 9, 2001, the contents being incorporated herein by reference.

BACKGROUND OF THE INVENTION

The present invention relates to a memory device, an internal control method therefor, a system and a method of memory control in the system.

Recently, the current consumption of semiconductor memories (dynamic RAMs) that need a refresh operation is inclined to increase due to an increase in the memory capacity demanded by clients (system side), an increase in access speed (higher operational frequency), an increase in I/O bus width (an increase in the number of data bits that are handled in one access) and so forth. The increase in the power consumption of memory devices is likely to cause an increase in the total current consumption of a system in which such a memory device is installed. There exists a need, therefore, to reduce power consumption of memory devices.

The increase in current consumption may raise the chip temperature of a memory device. In general, the data retaining characteristic (i.e., refresh characteristic: TREF) of DRAM cells is impaired (the retaining time becomes shorter) at high temperature. From the viewpoint of the data retaining characteristic, therefore, a reduction in current consumption is desired.

That is, semiconductor memories require that both an improvement in performance, such as larger memory capacity, faster access and extension of the I/O bus width, and a reduction in power consumption should be satisfied.

A memory device has a memory cell array having an array of a plurality of memory cells and sense amplifiers. Each memory cell is operatively coupled to one of a plurality of word lines laid out in, for example, the X direction and one of a plurality of bit lines laid out in the Y direction. Each bit line is provided with a sense amplifier which amplifies information (read data) of a single memory cell and retains the information.

In case of the memory capacity of 1 Mbits, the logical address of the memory device includes an X (row) address of, for example, 10 bits ($2^{10}$=1024 word lines WL) and a Y (column) address of 10 bits ($2^{10}$=1024 bit lines BL (1024 sense amplifiers)). (Note: bit line definition=a pair of complementary bit lines). If the layout pitch of the word lines WL is the same as the layout pitch of the bit lines BL in this case, the logical memory array is characterized as having a square shape.

The following will describe the internal operation of an SDRAM (Synchronous DRAM) synchronous to a system clock CLK as an example of a memory device.

An SDRAM operates in accordance with the falling and rising of an activation/precharge command which is synchronous to a system clock CLK and causes the memory device to be active/inactive, and a write/read command for inputting and output data to and from the memory device.

When receiving an activation command from an external device at the rising edge of the system clock CLK, the SDRAM fetches an X address and decodes the X address in an X decoder. In accordance with the decoded X address, a single word line is selected and the selected word line is enabled. A plurality of memory cells connected to the selected word line output data to the respective bit lines and the respective sense amplifiers amplify and retain (latch) the data.

When receiving a read command from the external device at the rising edge of the system clock CLK with a delay of several clocks from the activation command, the SDRAM fetches a Y address and decodes the Y address in a Y decoder. In accordance with the decoded Y address, data held in a single sense amplifier is outputted from the memory device. When receiving a write command from the external device, the SDRAM fetches a Y address and decodes the Y address in the Y decoder. In accordance with the decoded Y address, write data is written in the associated memory cell via a single sense amplifier. Thereafter, a read/write command is executed as needed and access is made to the memory cell that corresponds to a desired Y address and the external device.

After several clocks from the read/write command, the SDRAM receives the precharge command at the rising edge of the system clock CLK. The precharge command resets (equalizes) the enabled word line, sense amplifier and bit lines and the memory array returns to the initial state to be ready for the next activation command.

An internal time is required until the reset operation and a time (wait) of several clocks is needed for application of a next activation command from the reception of the precharge command. Likewise, a time (wait) of several clocks is needed from the activation command to a read/write command.

Although a description has been given of the case where the number of input/output data bits of the memory array is 1 for the sake of descriptive simplicity, n sense amplifiers are enabled simultaneously by a Y address when the number of input/output data bits is n (written as "n I/O" (e.g., 4 I/O)). The n sense amplifiers are respectively connected to n I/O ports via n I/O buses.

The depth of the Y address is called "page length". The memory device operates sense amplifiers at least equal in number to the I/O bus width×page length in response to a single activation command. In case of an SDRAM whose Y address is set to 8 bits (YA<0:7>), for example, the page length is 256. In case where the SDRAM has an I/O bus width of 32 bits, at least 8192 (=256×32) sense amplifiers operate in response to the activation command.

The SDRAM latches information from a plurality of memory cells connected to the word line that has been selected by the activation command in a plurality of sense amplifiers in accordance with a read command input whenever necessary. As a single word line is enabled, information from memory cells for a page length is properly outputted to an external device. Specifically, a single sense amplifier is selected in accordance with a Y address which accompanies a read/write command supplied as needed, and information is read out from those memory cells which are connected to the selected sense amplifier. With an X address (word line) fixed, the Y address is accessed at random. This operation is called "Y address priority operation". Likewise, information can be written in the memory cell at an arbitrary Y address through the Y address priority operation in response to a write command.

The Y address priority operation efficiently uses plural pieces of data latched in a plurality of sense amplifiers that have been enabled by a single activation command. 256 memory cells are accessed at random using a single word-line charge/discharge current and a single bit-line charge/discharge current provided by each sense amplifier.

The current that is consumed in a single random access is calculated by dividing the current consumption which is the word-line charge/discharge current plus the bit-line charge/discharge current by the number of accesses in pages that are activated at the same time. Therefore, the greater the number of accesses becomes, the smaller the current consumption for a single access becomes.

Further, in the Y address priority operation, the ratio of the number of clocks needed from an activation command to a read/write command to the number of clocks for the entire operation and the ratio of the number of clocks needed from a precharge command to a next activation command to the number of clocks for the entire operation are low. This increases the ratio of data occupying the input/output (I/O) bus (data occupation rate), thereby leading to a higher efficiency of the I/O bus in the system. As the frequency of the system clock becomes higher, therefore, it is possible to increase the data occupation rate of the I/O bus in an SDRAM that needs a large latency.

There is a system which accesses an SDRAM with a shorter bit length (e.g., consecutive 4 bits, 8 bits, etc.). In an access to the SDRAM of the system, only read/write operations that have smaller than the page length are executed during a period from a single activation command to a precharge command, and the X address is changed by a next activation command. This operation is called "X address priority operation" for the sake of convenience. In the X address priority operation, sense amplifiers that are enabled by a single activation command are not used efficiently.

For example, the Y address is changed (with the X address being constant) and four memory cells are accessed. In this case, the charge/discharge current of a single word line and the current corresponding to the number of sense amplifiers (8192 sense amplifiers) to be enabled (including the charge/discharge current of the bit lines associated with the sense amplifiers) are consumed. Given that the consumed current is P(y), then the current consumed in an access to a single memory cell is P(y)/4.

In case where the X address is changed (with the Y address being arbitrary) and four memory cells are accessed, on the other hand, an activation command and a precharge command are required every time the X address is changed. In case of the access method that changes the X address, therefore, the consumed current is four times the current consumed in case of making an access with a constant X address (i.e., 4×P(y)) and the consumed current in an access to a single memory cell is P(y).

In case of a system and an application which frequently use the X address priority operation, therefore, a memory device which uses a shallow (fewer pages) Y address and a deep X address is effective. Depending on the access method of the system or a step of the application which uses a memory device, there may be a case where the X address priority operation and Y address priority operation are mixed. In this case, the use of a memory device which uses a shallow Y address makes the access speed extremely slow depending on the access order, thus hindering improvement in speed. The use of a memory device which uses a shallow X address, on the other hand, hinders reduction in consumed current.

Memory devices whose X address and Y address have different depths differ from the X address and Y address of a standard memory device in pin layout and package size, and cannot be replaced directly with the standard one. This requires that the board or the like on which the memory device is to be mounted be prepared again, thus resulting in a cost increase and longer development stage.

When an operation with large current consumption, such as the X address priority operation, is repeated, the temperature of the chip of the memory device (junction temperature) may rise. In this case, the rise in chip temperature impairs the data retaining characteristic so that the refresh operation should be performed frequently. That is, a rise in chip temperature results in a deteriorated data retaining characteristic and a further increase in consumed current originated from the frequent refresh operation. In case where the data retaining operation is executed asynchronously regardless of the control on the client system side (in case of the self-refresh operation), the refresh operation increases the busy state in which an external access is not responded. This lowers the performance of the system (the data occupation rate of the I/O bus).

SUMMARY OF THE INVENTION

Accordingly, it is an objective of the present invention to provide a memory device, an internal control method therefor, a system and a control method for memory means in the system, all of which can ensure efficient access and reduction in current consumption.

It is another objective of the invention to provide a memory device, an internal control method therefor, a system and a control method for memory means in the system, all of which can ensure efficient access and reduction in current consumption without changing a package.

To achieve the above object, the present invention provides a memory device including a plurality of memory cells arranged in accordance with a first address and a second address which define a logical address map indicating a logical shape of the memory array. An address map changing unit is operatively coupled to the memory array, for receiving a first address signal for generating the first address and a second address signal for generating the second address. The address map changing unit is capable of changing the logical address map by altering a part of one of the first address signal and the second address signal.

A further perspective of the present invention is a memory device including a memory array. The memory array includes a plurality of memory cells arranged in accordance with a first address and a second address which define a logical address map indicating a logical shape of the memory array. An address buffer is operatively coupled to the memory array, for receiving a plurality of address signals which include a first address signal for generating the first address. An address control unit is operatively coupled to the address buffer, for generating the first address or the second address by using a part of the first address signal in accordance with access information for changing the logical address map every time the first address signal is inputted.

A further perspective of the present invention is a memory device including a memory array. The memory array includes a plurality of memory cells arranged in accordance with a first address and a second address which define a logical address map indicating a logical shape of the memory array. An address buffer is operatively coupled to the memory array, for receiving a plurality of address signals which include a first address signal for generating the first address. An address-signal invalidation unit is operatively coupled to the address buffer, for invalidating at least a part of the plurality of address signals in accordance with access information for changing the logical address map every time the first address signal is inputted.

A further perspective of the present invention is an internal control method for changing a logical address map of a memory device. The memory device has a memory array including a plurality of memory cells arranged in accordance with a first address and a second address, which are generated in accordance with a plurality of address signals. The logical address map is fined in accordance with the first address and second address and indicates a logical shape of the memory array. The method includes the steps of receiving the plurality of address signals, receiving access information for changing the logical address map, generating a plurality of first address signals for generating the first address in accordance with the plurality of address signals and the access information, generating a plurality of second address signals for generating the second address in accordance with the plurality of address signals and the access information, and invalidating one of a part of the plurality of first address signals and a part of the plurality of second address signals in accordance with the access information every time the plurality of first address signals are generated.

A further perspective of the present invention is a system including a memory device and a control device. The control device is operatively coupled to the memory device for supplying the memory device with from-moment-to-moment access information. The memory device includes a memory array. The memory array includes a plurality of memory cells arranged in accordance with a first address and a second address which define a logical address map indicating a logical shape of the memory array. An address control circuit is operatively coupled to the memory array, for changing the logical address map of the memory array in accordance with the access information.

A further perspective of the present invention is a control method for a memory device in a system including the memory device and a control device, operatively coupled to the memory device, for controlling the memory device. The memory device includes a memory array including a plurality of memory cells arranged in accordance with a first address and a second address which define a logical address map indicating a logical shape of the memory array. The method includes the steps of causing the control device to supply the memory device with from-moment-to-moment access information; and causing the control device to change the logical address map of the memory array in accordance with the access information.

A further perspective of the present invention is a memory device. The memory device includes a memory array including a plurality of memory cells arranged in accordance with a first address and a second address which define a logical address map indicating a logical shape of the memory array. An address buffer is operatively coupled to the memory array and has a plurality of address input terminals. The address buffer receives an external address to generate the first address or the second address at the plurality of address input terminals. The plurality of address input terminals include input terminals corresponding to either the first address of M bits or the second address of N bits whichever has a greater number of bits.

The memory device further includes an address control circuit or an address invalidation circuit. The address control circuit is operatively coupled to the address buffer and replaces a part of the external address with the first address or the second address in accordance with access information for changing the logical address map. The address invalidation circuit is operatively coupled to the address buffer and invalidates at least a part of the external address in accordance with access information for changing the logical address map.

The plurality of address input terminals may include input terminals for simultaneously receiving the first address of M bits and the second address of N bits.

A further perspective of the present invention is an internal control method for changing a logical address map of a memory device. The memory device has a memory array including a plurality of memory cells arranged in accordance with a first address and a second address which define the logical address map indicating a logical shape of the memory array and a plurality of address input terminals for receiving an external address for generating the first address or the second address. The plurality of address input terminals include input terminals corresponding to either the first address of M bits or the second address of N bits whichever has a greater number of bits or input terminals for simultaneously receiving the first address of M bits and the second address of N bits. The method includes the steps of receiving the external address, receiving access information for changing the logical address map.

The method further includes the step of replacing a part of the external address with the first address or the second address in accordance with the access information or the step of invalidating at least a part of the external address in accordance with the access information.

A further perspective of the present invention is a system including a memory device and a control device operatively coupled to the memory device for supplying the memory device with from-moment-to-moment access information. The memory device includes a memory array, a plurality of address input terminals, and an address control circuit. The memory array includes a plurality of memory cells arranged in accordance with a first address and a second address which define a logical address map indicating a logical shape of the memory array. The plurality of address input terminals receive an external address for generating the first address or the second address. The address control circuit is operatively coupled to the plurality of address input terminals and the memory array. The address control circuit generates the first address in accordance with the external address and changes the logical address map of the memory array in accordance with the access information. The address control circuit generates an increment address of a predetermined number of bits in accordance with a change in the logical address map after generation of the first address.

A further perspective of the present invention is a control method for a memory device in a system including the memory device and a control device. The control device is operatively coupled to the memory device and supplies from-moment-to-moment access information to the memory device. The memory device includes a memory array including a plurality of memory cells arranged in accordance with a first address and a second address which define a logical address map indicating a logical shape of the memory array. The method includes the steps of causing the control device to change the logical address map of the memory array in accordance with the from-moment-to-moment access information and generating an increment address of a predetermined number of bits in accordance with a change in the logical address map after generation of the first address.

A further perspective of the present invention is a memory device including a memory array. The memory array includes a plurality of memory cells arranged in a matrix form in accordance with a first address and a second address which define a logical address map indicating a logical shape of the memory array. A plurality of address input terminals receive a plurality of address signals to generate the first address or the second address. An access information receiving circuit receives access information for changing the logical address map. An address control unit is operatively coupled to the plurality of address input terminals and the access information receiving circuit. The address control unit changes at least one of a depth of the first address and a depth of the second address in accordance with an address change signal to be supplied from at least one of the plurality of address input terminals, in response to the access information.

A further perspective of the present invention is a memory device including a memory array. The memory array includes a plurality of memory cells arranged in accordance with a first address and a second address which define a logical address map indicating a logical shape of the memory array. A plurality of address input terminals receive a plurality of address signals to generate the first address or the second address. An address change terminal receives an address change signal to change at least one of a depth of the first address and a depth of the second address. An access information receiving circuit receives access information for changing the logical address map. An address control unit is operatively coupled to the plurality of address input terminals and the access change terminal. The address control unit changes at least one of the depth of the first address and the depth of the second address in accordance with the address change signal in response to the access information.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 20 is an exemplary diagram of commands of an asynchronous memory device;

FIGS. 22A, 22B, and 23 are operational waveform diagrams for a program mode setting circuit;

FIG. 25 is an operational waveform diagram for a mode setting address buffer;

DETAILED DESCRIPTION OF THE PREFERRED EMBODIMENTS

Figure 1:
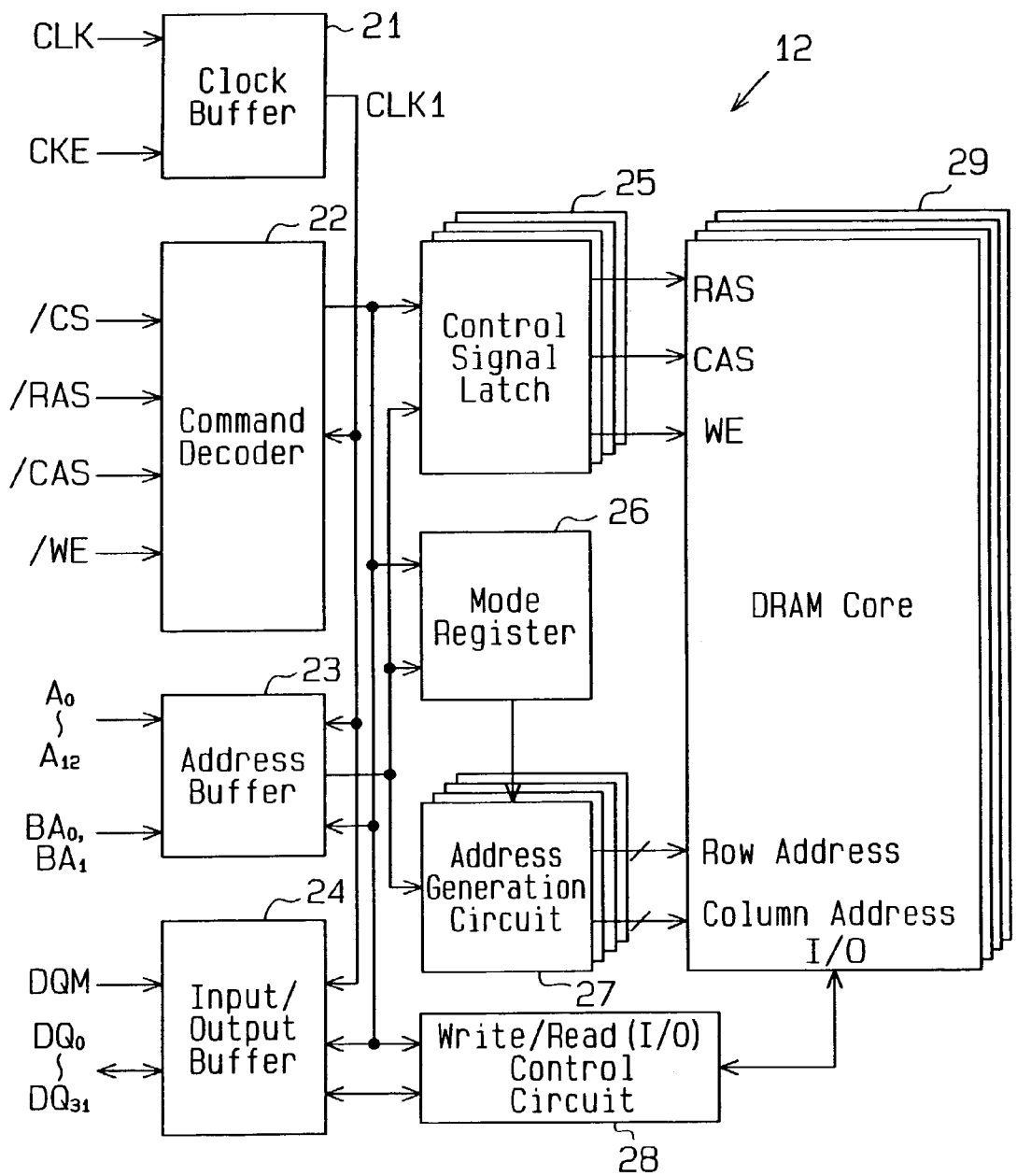
FIG. 1 is a schematic block diagram of a memory device according to a first embodiment of the invention.

In the drawings, like numerals are used for referring to like elements throughout.

Figure 4:
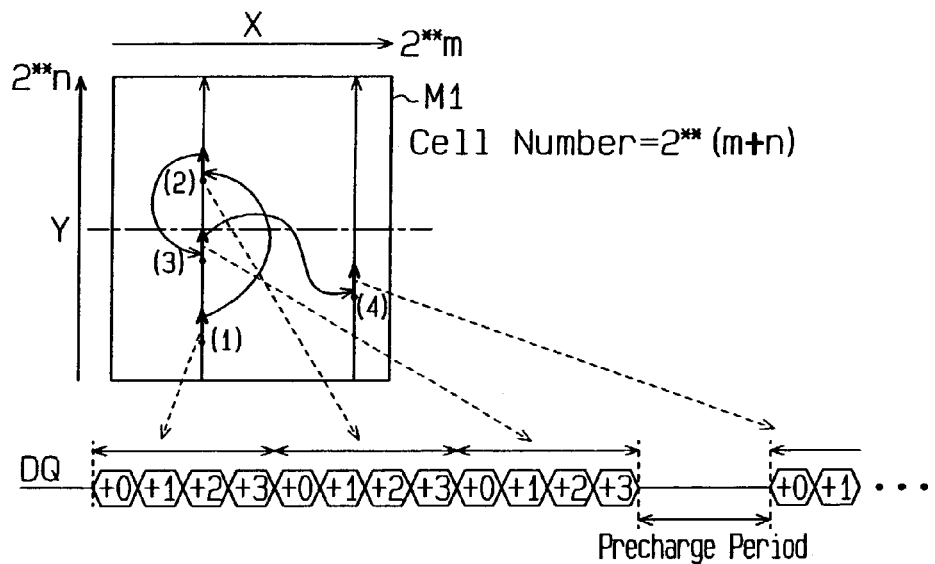
FIG. 4 is an exemplary diagram of the address structure suitable for the Y address priority operation.
Figure 5:
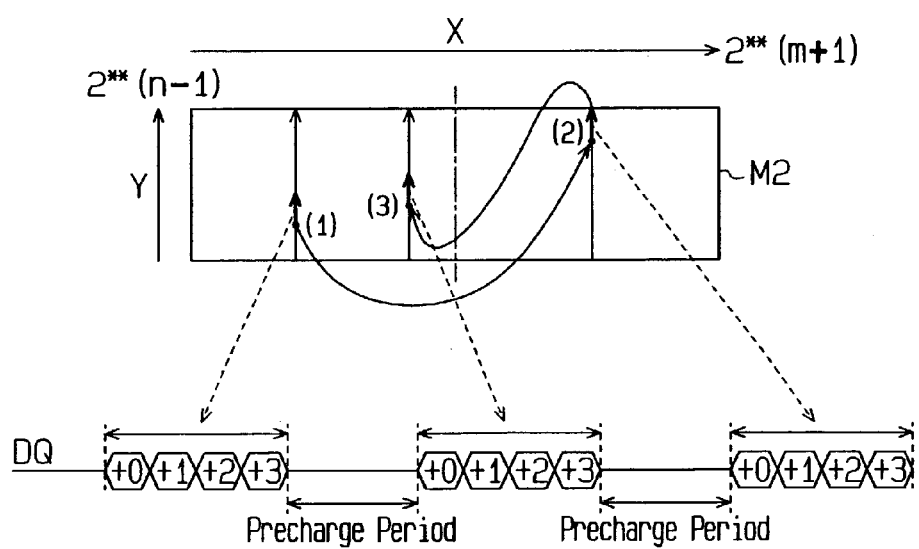
FIG. 5 is an exemplary diagram of the address structure suitable for the X address priority operation.
Figure 29:
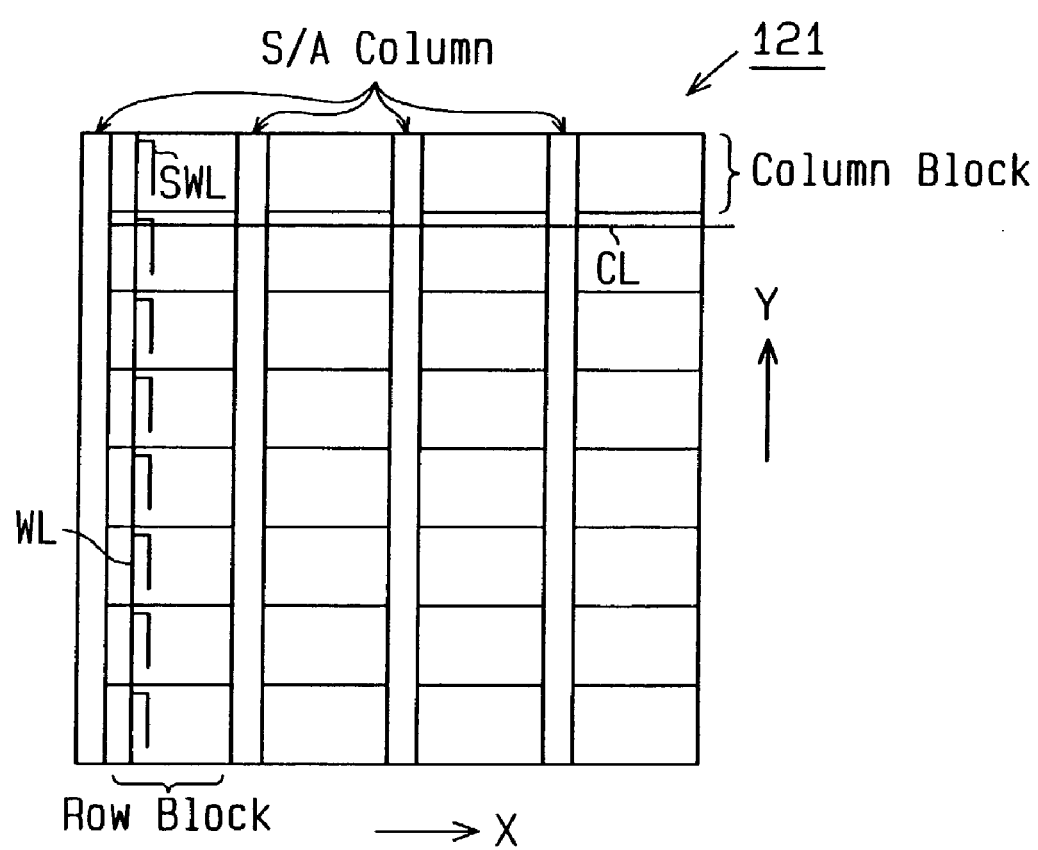
FIG. 29 is a schematic structural diagram of a DRAM core of the memory device in FIG. 28.

In the following description of individual embodiments, an address for selecting a word line (WL) is called "row (X) address (first address)" and an address for selecting a bit line (column line) BL is called "column (Y) address (second address)". FIGS. 4, 5, and 29 show memory devices rotated by 90 degrees with respect to a normally drawn one for the sake of convenience.

The first embodiment of the invention will now be described referring to FIGS. 1 through 8.

Figure 3:
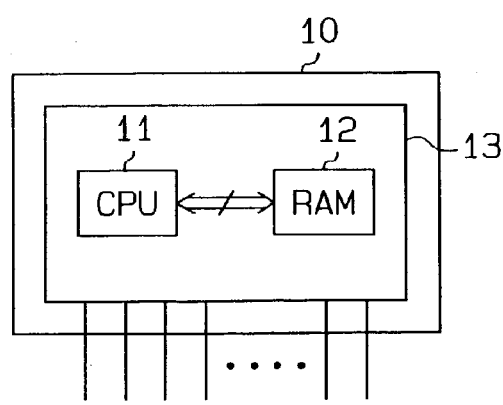
FIG. 3 is a block diagram of a memory system including the memory device of FIG. 1.

FIG. 3 is a schematic structural diagram of a module 10.

The module 10 is an MCM (Multi Chip Module) and includes a CPU 11 and a memory device 12. The CPU 11 and memory device 12 are mounted on a board 13. The CPU 11, which is connected to the memory device 12, accesses the memory device 12.

The CPU 11 supplies the memory device 12 with access type information (access information) once or whenever needed before accessing starts. The memory device 12 has a capability of changing a logical address map in accordance with the access type information. Specifically, the memory device 12 changes the logical address map in response to the access type information, an X (row) address and a Y (column) address, all supplied from an external device (CPU 11). The CPU 11 has a function as a memory controller that controls the logical address map of the memory device 12.

The logical address map is determined by the depths of the X address and Y address. The capacity of the memory cell array is constant. Therefore, the memory device 12 complementarily changes the depth of the X address and the depth of the Y address. The memory device 12 has external address terminals (address input terminals) TA to which address signals having the necessary numbers of bits for respectively designating the maximum value of the X address and the maximum value of the Y address.

In a memory device which has a capacity of 128 Mbits (32 I/O, 4 bank structure), for example, in general (according to the standard specifications), each bank has memory cells of 1 MB for a single I/O. The memory cells are laid out in an array form with plural (4096) word lines which are selected by a 12-bit X address and plural (256) bit lines which are selected by an 8-bit Y address. A memory device, such as SDRAM, receives an X address and Y address in an address multiplex system. An ordinary memory device has 12 address pins to receive a 12-bit X address and receives an Y address from eight of the 12 address pins.

By way of contrast, the memory device 12 according to the first embodiment changes the depth of an X address and the depth of a Y address in accordance with the logical address map.

FIG. 4 illustrates a first memory array M1 that has a logical address map (first map) similar to the logical address map of the ordinary memory device. FIG. 5 illustrates a second memory array M2 that has a logical address map (second map) which has a deeper X address and a shallower Y address than those in FIG. 4.

In the first memory array M1, the depth of an X address in the logical address map is $2^m$ (the number of logical word lines being $2^m$) and the depth of a Y address is $2^n$ (the number of logical word lines being $2^n$). In FIG. 4, $2^m$ is denoted by "2**m". In the second memory array M2, the depth of an X address in the logical address map is $2^{m+1}$ (the number of logical word lines being $2^{m+1}$) and the depth of a Y address is $2^{n-1}$ (the number of logical word lines being $2^{n-1}$).

In the first memory array M1, a logical one of the $2^m$ word lines is selected and enabled. Information in $2^n$ memory cells connected to the selected word line is amplified by the associated sense amplifiers and held.

In the second memory array M2, a logical one of the $2^{m+1}$ word lines is selected and enabled. Information in $2^{n-1}$ memory cells is amplified by the associated sense amplifiers and held.

In response to a random access request along the Y direction, arbitrary memory cell information is accessed in accordance with the Y address that is supplied from the external device.

In case of the first memory array M1 (FIG. 4), the memory device 12 generates four internal Y address signals (Y1+0, Y1+1, Y1+2, Y1+3) in order in accordance with the burst length and a first (indicated by a dot) top Y address Y1 supplied from the external device. The memory device 12 makes a serial access to the external device continuously with respect to the memory cells selected by an internal Y address signal.

Next, the memory device 12 generates four internal Y address signals (Y2+0, Y2+1, Y2+2, Y2+3) in order in accordance with a second top Y address Y2 and continuously makes a serial access to the external device with respect to the memory cells selected by the internal Y address signal.

Further, the memory device 12 generates four internal Y address signals (Y3+0, Y3+1, Y3+2, Y3+3) in order in accordance with a third top Y address Y3 and continuously makes a serial access to the external device with respect to the memory cells selected by the internal Y address signal.

In a serial access, accesses to the individual top addresses Y1, Y2 and Y3 which have the same (common) X address are called "random-access based page operation". Accesses to Y addresses obtained by incrementing each of the top addresses Y1, Y2 and Y3 (by (+0, +1, +2, +3)) are called "burst operation". (While the burst operation has a burst length of 1, 2, 4, 8 or the like, the description has been given of the case where the burst length is 4.)

In case where the X address is changed, the memory device 12 is precharged (equalized) once, then the word line that corresponds to the changed X address is selected and enabled. Those memory cells which are connected to the bit line that corresponds to the Y address are accessed. Although the page operation is terminated at the third time (3×4 =12 accesses) here, the page operation can be performed by a maximum of $2^n/4$ ($2^n$ accesses) times.

In case of the second memory array M2 (FIG. 5), the memory device 12 generates four internal Y address signals (Y1+0, Y1+1, Y1+2, Y1+3) in order in accordance with the burst length and the first (indicated by parentheses) Y address Y1 supplied from the external device. The memory device 12 makes a serial access to the external device continuously with respect to the memory cells selected by the internal Y address signal.

In case where the X address is changed, the memory device 12 performs a precharge (equalize) operation once, then selects and enables the word line that corresponds to the changed X address. The memory device 12 generates four internal Y address signals (Y2+0, Y2+1, Y2+2, Y2+3) in order in accordance with the second Y address Y2 and continuously makes a serial access to the external device with respect to the memory cells selected by the internal Y address signal.

When the X address is changed further, the memory device 12 performs a precharge (equalize) operation once, then selects and enables the word line that corresponds to the changed X address The memory device 12 generates four internal Y address signals (Y3+0, Y3+1, Y3+2, Y3+3) in order in accordance with the third Y address Y3 and continuously makes a serial access to the external device with respect to the memory cells selected by the internal row address signal. Although the page operation is terminated at the first time (4 accesses) here, the page operation can be performed by a maximum of $2^n/4$ ($2^n$ accesses) times.

Let us consider the occupation rate of the I/O bus in the first memory array M1 and second memory array M2. In the first memory array M1, the maximum number of possible series accesses to a single X address is $2^n$ and the occupation rate of the I/O bus can be increased. In the second memory array M2, the number of possible series accesses to a single X address is a half the number for the first memory array M1 or $2^{n-1}$, so that the occupation rate of the I/O bus may be limited to be lower than that for the first memory array M1.

Let us now consider the consumed currents in the first memory array M1 and second memory array M2. The consumed current in each memory array M1 or M2 corresponds to the charge/discharge current originated from the enabling of a word line and the enabling of a sense amplifier.

Figure 6A:
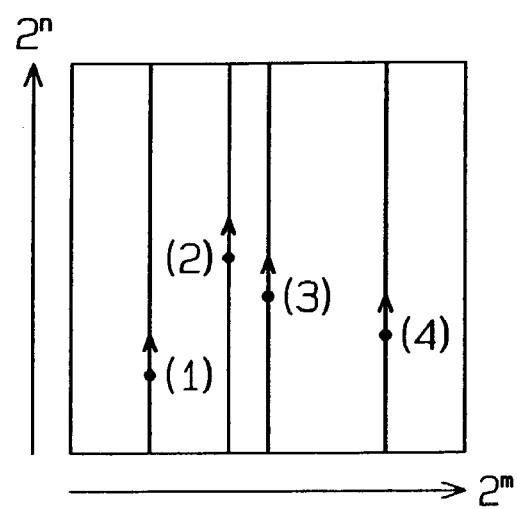
FIGS. 6A and 6B are exemplary diagrams of the consumed current that varies with the address structure and access order.
Figure 6B:
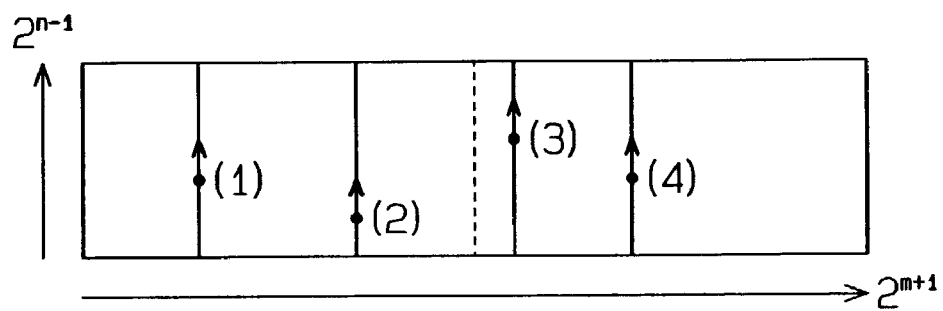

Let P be the consumed current needed to enable a word line and a sense amplifier when the first memory array M1 is precharged once. At this time, the consumed current needed to enable a word line and a sense amplifier when the second memory array M2 is precharged once is P/2. Let us consider the consumed current when the first memory array M1 performs the X address priority operation. When an access is made while changing the X address as shown in FIG. 6A in a single page operation (4 accesses) with a burst length of 4, the average consumed current needed to enable a word line and a sense amplifier per single access is P/4 (=P÷4). When the second memory array M2 is operated likewise as shown in FIG. 6B, the average consumed current needed to enable a word line and a sense amplifier per single access is P/8 (=(P/2)÷4). The second memory array M2 that uses only a part of a page has is advantageous over the first memory array M1 in consumed current. (1), (2) and so forth shown in FIGS. 6A and 6B indicate the initiation points of the individual page operations.

In case where the memory device 12 is accessed in an operation with a priority given to the Y address (page), a high occupation rate of the I/O bus may be acquired by using the logical address map of the first memory array M1. In case where the memory device 12 is accessed in an operation with a priority given to the X address, on the other hand, a high current consumption efficiency can be acquired by using the logical address map of the second memory array M2.

FIG. 1 is a schematic block diagram illustrating of the outline of the memory device (SDRAM) 12.

The SDRAM 12 has a clock buffer 21, a command decoder 22, an address buffer 23, an input/output (I/O) buffer 24, a control signal latch 25, a mode register 26, an address generation circuit 27, a write/read (I/O) control circuit 28 and a DRAM core 29.

The clock buffer 21 receives a clock enable signal CKE and an external clock signal CLK from the external device and generates an internal clock signal CLK1 according to the signals CKE and CLK. The internal clock signal CLK1 is supplied to an internal circuit.

The command decoder 22 receives an external command COM from the external device in response to the internal clock signal CLK1 (CLK). The external command COM includes a chip select signal /CS, a column address strobe signal /CAS, a write enable signal /WE and a row address strobe signal /RAS in the first embodiment. The command decoder 22 decodes various commands, such as a write command, a read command and a refresh command, from the statuses (H level or L level) of the signals /CAS, /WE, /CS and /RAS in response to the internal clock signal CLK1. The command decoder 22 supplies the various decoded commands as internal commands, enable signals and so forth to the address buffer 23, the I/O buffer 24, the control signal latch 25, the mode register 26 and the I/O control circuit 28.

The address buffer 23, which has a buffer function and a latch function, receives address signals $A_0$ to $A_{12}$ and bank address signals $BA_0$ and $BA_1$ from the external device in accordance with internal commands from the command decoder 22. The address buffer 23 amplifies the address signals $A_0$ to $A_{12}$ and bank address signals $BA_0$ and $BA_1$ to generate address data. The address buffer 23 latches the address data and supplies the address data to the control signal latch 25, the mode register 26 and the address generation circuit 27.

A standard memory device which has substantially the same memory capacity as the memory device operates with the 12-bit address signals $A_0$–$A_{11}$ and the 2-bit bank address signals $BA_0$ and $BA_1$. Therefore, the memory device receives an extra 1-bit address signal (address change signal) $A_{12}$ as compared with the standard memory device.

The I/O buffer 24 is enabled in accordance with the enable signal from the command decoder 22 and receives write data $DQ_0$ to $DQ_{31}$ and a mask control signal DQM from the external device. The I/O buffer 24 supplies the write data $DQ_0$ to $DQ_{31}$ to the I/O control circuit 28 in response to the internal clock signal CLK1. The I/O buffer 24 receives the write data $DQ_0$ to $DQ_{31}$ from the I/O control circuit 28 in response to the internal clock signal CLK1 and supplies the write data $DQ_0$ to $DQ_{31}$ to the external device. The I/O buffer 24 masks the write data $DQ_0$ to $DQ_{31}$ in response to the mask control signal DQM.

The control signal latch 25 receives an internal command from the command decoder 22 and address data from the address buffer 23. In accordance with the internal command and address data, the control signal latch 25 generates control signals to control various kinds of operations (such as writing of write data, reading of read data, refresh and self-refresh) and supplies the control signals to the DRAM core 29.

The mode register 26 receives an internal command (mode-register setting command) from the command decoder 22 and address data from the address buffer 23. In accordance with the internal command and address data, the mode register 26 holds the mode of an operation to the DRAM core 29. The mode register 26 generates a control signal in accordance with information of the held mode.

The information of the mode in the mode register 26 includes access type information. The access type information indicates the logical address map of the DRAM core 29. The mode register 26 generates an address structure select signal in accordance with the access type information and supplies the address structure select signal to the address generation circuit 27.

The address generation circuit 27 receives address data according to the address signals $A_0$–$A_{12}$ from the address buffer 23. The address generation circuit 27 generates row address data and column address data in accordance with the mode of the mode register 26, the address structure select signal and the from-time-to-time logical address map of the DRAM core 29, and supplies those address data to the DRAM core 29. The address generation circuit automatically generates a column address which is the input address incremented in accordance with the burst length set in the mode register 26.

The I/O control circuit 28 controls inputting or outputting of data in accordance with an internal command from the command decoder 22. The I/O control circuit 28 sends out write data (32 bits) from the I/O buffer 24 to the DRAM core 29 and sends out read data (32 bits) from the DRAM core 29 to the I/O buffer 24.

The DRAM core 29 includes plural (four in the embodiment) banks each of which receives a control signal from the control signal latch 25 and row address data and column address data from the address generation circuit 27. The address buffer 23 receives the bank address signals $BA_0$ and $BA_1$ corresponding in number to the banks of the DRAM core 29. The control signal latch 25 and the address generation circuit 27 are provided for each bank.

The DRAM core 29 executes various processes, such as writing of write data, reading of read data, refresh and self-refresh, with respect to an incorporated memory cell array. The DRAM core 29 writes the write data $DQ_0$ to $DQ_{31}$ input to the I/O buffer 24 in memory cells at predetermined addresses in accordance with the control signal and address data.

Figure 2:
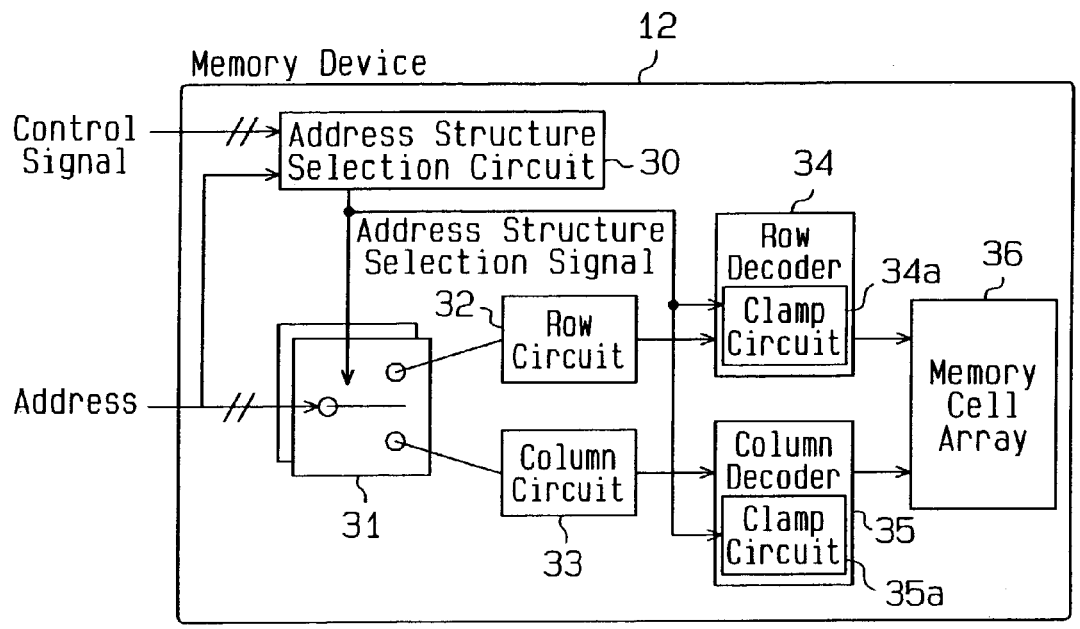
FIG. 2 is a schematic block diagram of a circuit associated with selection of the address structure of the memory device of FIG. 1.

FIG. 2 is a principle diagram illustrating the function that changes the logical address map in accordance with the access type information.

The memory device 12 includes an address structure selection circuit 30, a changeover switch 31, a row circuit 32, a column circuit 33, first and second decoders 34 and 35 and a memory cell array (memory array) 36. The address structure selection circuit 30 includes, for example, the command decoder 22 and the mode register 26 in FIG. 1. The changeover switch 31, the row circuit 32 and the column circuit 33 are included in, for example, the address generation circuit 27 in FIG. 1, and the first and second decoders 34 and 35 and the memory cell array 36 are included in, for example, the DRAM core 29. Note that the structure may be modified as needed. The memory device 12 may individually include the address structure selection circuit 30.

The address structure selection circuit 30 receives a plurality of control signals and a plurality of address signals. The address structure selection circuit 30 analyzes a command supplied externally at that time in accordance with a plurality of control signals. In case where the command is a command to change the logical address map, the address structure selection circuit 30 generates the address structure select signal (hereinafter simply called "select signal") ASS for changing the logical address map in accordance with the address signal and supplies the select signal ASS to the changeover switch 31 and the first and second decoders 34 and 35.

The changeover switch 31 receives a changeover address signal and the select signal ASS. In accordance with the select signal ASS, the changeover switch 31 supplies the changeover address signal to the row circuit 32 or the column circuit 33. The changeover address signal is an external address signal which is added to the external address signal that is to be supplied to a standard memory device which has the same memory capacity as the memory device 12. In case of the memory device 12 in FIG. 1, the external address signal $A_{12}$ is equivalent to the changeover address signal. The memory device 12 supplies the external address signal $A_{12}$ to the row circuit 32 or the column circuit 33 in response to the access type information.

The row circuit 32 generates an X address signal in accordance with the supplied address signal and supplies the X address signal to the first (X) decoder 34. The column circuit 33 generates a Y address signal in accordance with the supplied address signal and supplies the Y address signal to the second (Y) decoder 35.

The X decoder 34 decodes the supplied X address signal and generates a word-line select signal to select a word line corresponding to the X address signal. The X decoder 34 supplies the word-line select signal to the memory cell array 36. The number of selectable word lines varies depending on the logical address map to be selected and is $2^{m+1}$ (m=12) at a maximum from the address signals $A_0$–$A_{12}$ (FIG. 1) in the first embodiment as shown in FIG. 5. The X decoder 34 generates a select signal to select one of $2^{m+1}$ word lines.

The X decoder 34 includes a clamp circuit 34a. The clamp circuit 34a is provided to invalidate the address signal that is not needed by the logical address map.

In case where the first logical address map (first memory array M1) shown in FIG. 4 is selected, a word-line select signal to select one of $2^m$ word lines is generated according to the address signals $A_0$–$A_m$. In case where the second logical address map (second memory array M2) shown in FIG. 5 is selected, a word-line select signal to select one of $2^{m+1}$ word lines is generated according to the address signals $A_0$–$A_{m+1}$.

When the first memory array M1 is selected, the clamp circuit 34a clamps the input address signal $A_{m+1}$ in order to stabilize the operation of the circuit portion that receives the address signal $A_{m+1}$ (actually to simultaneously select a plurality of sub word lines (SWL) according to the logical address map).

The clamp circuit 34a invalidates a predetermined address signal in order to change the compression rate of the X decoder 34.

The number of word lines to be selected is changed by changing the number of sub word lines that are driven at a time. The memory cell array 36 includes main word lines, which are driven by a word-line select signal generated by the X decoder 34, and sub word lines, which are connected to the word lines via a plurality of gates and are driven secondarily by driving the main word lines. For example, the sub word lines are provided for each column block. When a main word line is driven, the gate that responds to the driving drives the associated sub word line. Therefore, the sub word lines whose quantity corresponds to the access type information are driven by performing a logical operation of the driving of the main word line and the access type information by means of the gate that drives the associated sub word line. This allows the logical address map to be substantially changed in accordance with the access type information.

The Y decoder 35 decodes the supplied Y address signal, generates a bit-line select signal to select a bit line corresponding to the Y address signal and supplies the bit-line select signal to the memory cell array 36. The number of selectable bit lines varies depending on the logical address map to be selected and is $2^n$ (n=8) at a maximum from the address signals $A_0$–$A_7$ (FIG. 1) in the first embodiment. The Y decoder 35 generates a select signal to select one of $2^n$ bit lines. The Y decoder 35 includes a clamp circuit 35a. The clamp circuit 35a is provided to invalidate the address signal that is not needed by the logical address map.

In case where the logical address map (first memory array M1) shown in FIG. 4 is selected, a select signal to select one of $2^n$ bit lines (one of $2^n$ sense amplifiers) is generated according to the address signals $A_0$–$A_{n-1}$. In case where the logical address map (second memory array M2) shown in FIG. 5 is selected, a bit-line select signal to select one of $2^{n-1}$ bit lines (actually two of $2^n$ bit lines) is generated according to the address signals $A_0$–$A_{n-2}$.

When the second memory array M2 is selected, the clamp circuit 35a clamps the input address signal $A_{n-1}$ in order to stabilize the operation of the circuit portion that receives the address signal $A_{n-1}$ (actually to simultaneously select a plurality of bit lines according to the logical address map).

For example, the Y decoder 35 to which four bit lines are connected selects one of four bit lines in accordance with the 2-bit address signals $A_0$ and $A_1$. The number of lines to be selected with respect to the number of lines connected to the Y decoder 35 is called a compression rate. The compression rate of the Y decoder 35 in this case is ¼.

The clamp circuit 35a fixes one of the address signals (e.g., $A_1$) at a predetermined level (H level when the decoder is of a type which uses the NAND logic and L level when the type uses the NOR logic) to invalidate that address signal. In this case, the Y decoder 35 selects two of the connected four bit lines by the 1-bit address signal $A_0$. The compression rate of the Y decoder 35 in this case is ½.

Figure 7:
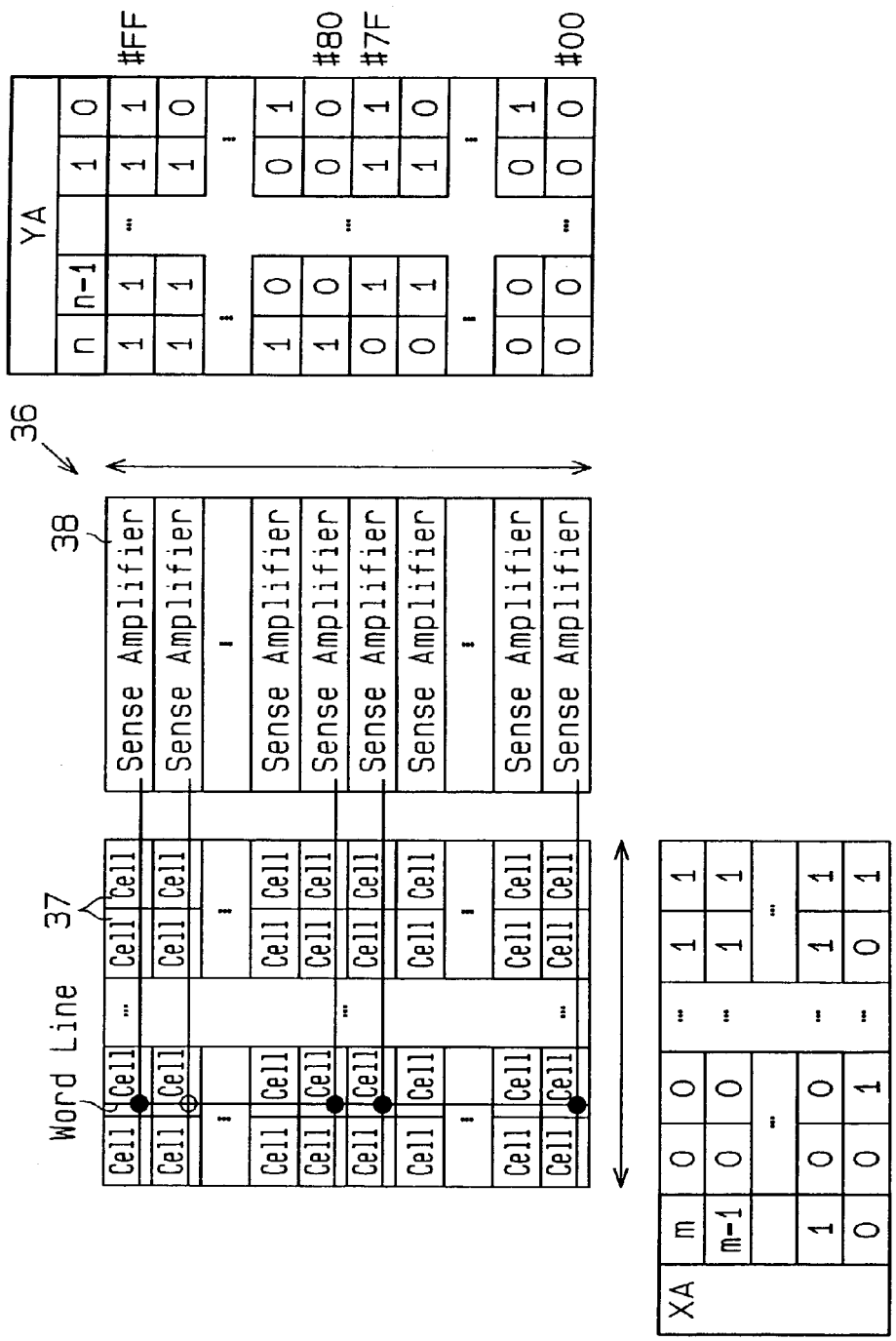
FIGS. 7 and 8 are exemplary diagrams of an address map.

FIG. 7 is an exemplary diagram illustrating the structure of the memory cell array 36 and selection corresponding to the first memory array M1 (see FIG. 4).

The memory cell array 36 has a plurality of cells 37 arranged in an array by $2^m$ word lines and $2^n$ bit lines and sense amplifiers 38 connected to the respective bit lines. In accordance with the logic of an X address signal XA<0:m> (address signals $A_0$–$A_{11}$), the X decoder 34 (FIG. 2) enables one of a plurality of word lines. $2^n$ sense amplifiers 38 that correspond to $2^n$ cells 37 connected to the selected word line are enabled. At this time, cell information is read from the $2^n$ cells 37 into the associated sense amplifiers 38.

In accordance with the logic of a Y address signal YA<0:n> (address signals $A_0$–$A_7$), the Y decoder 35 (FIG. 2) connects one of a plurality of sense amplifiers 38 to an unillustrated data bus line. A read or write operation is performed on the selected cell 37 via the sense amplifier 38 connected to the data bus line.

Figure 8:
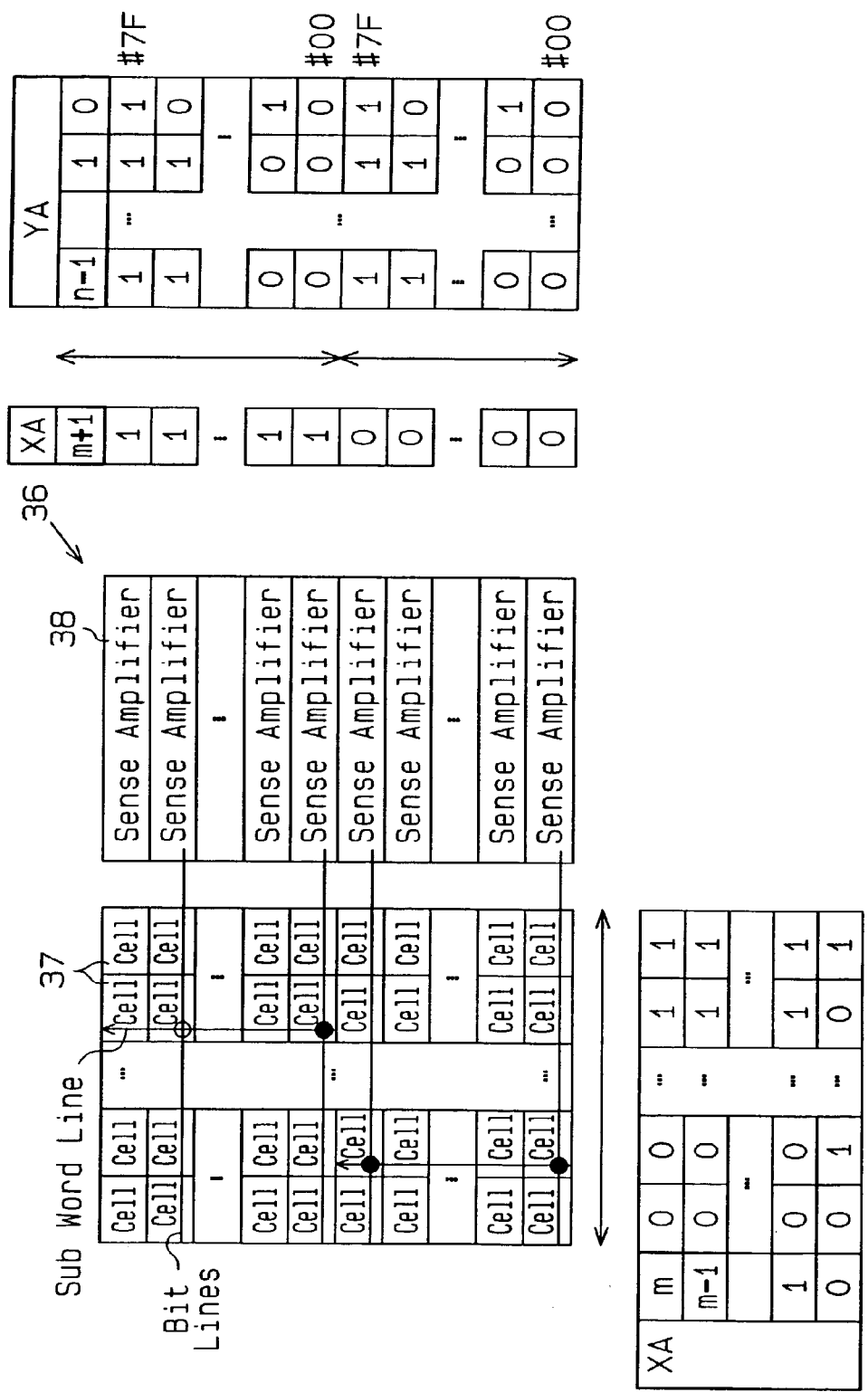

FIG. 8 is an exemplary diagram illustrating the structure of the memory cell array 36 and selection corresponding to the second memory array M2 (see FIG. 5).

The memory cell array 36 is separated into two column blocks each of which is selected by an address signal $XA_{m+1}$. Each block has $2^m$ sub word lines and $2^{n-1}$ sense amplifiers 38. The memory cell array 36 has two sub word lines that are selected by substantially the same X address and are equivalent to a single word line in FIG. 7.

In accordance with the logic of an X address signal XA<0:m+1> (address signals $A_0$–$A_{12}$), the X decoder 34 enables one of a plurality of sub word lines. $2^{n-1}$ sense amplifiers 38 that correspond to $2^{n-1}$ cells 37 connected to the selected sub word line are enabled. At this time, cell information is read from the $2^{n-1}$ cells 37 into the associated sense amplifiers 38. In accordance with the logic of a Y address signal YA<0:n-1> (address signals $A_0$–$A_6$), the Y decoder 35 connects one of a plurality of sense amplifiers 38 to an unillustrated data bus line. A read or write operation is performed on the selected cell 37 via the sense amplifier 38 connected to the data bus line.

In the memory cell array 36 shown in FIG. 7, therefore, cell information from $2^n$ cells 37 connected to the word line which is enabled according to a single X address is latched in the respective sense amplifiers 38. Therefore, an access to those cells 37 which are selected by a single X address is executed simply by designating an Y address, so that the access time is short and the consumed current is small.

In the memory cell array 36 corresponding to the logical address map shown in FIG. 8, cell information from $2^{n-1}$ cells 37 connected to a single enabled sub word line is latched in the respective sense amplifiers 38. The sub word line to be enabled has half the length of the word line in FIG. 7. The number of sense amplifiers 38 to be enabled is half the number in the case shown in FIG. 7. Although the number of cells 37 accessible by a single X address is a half of the number of accessible cells 37 in the memory cell array 36 shown in FIG. 7, therefore, the amount of the consumed current also becomes a half.

In FIG. 8, one of the two column blocks that constitute the memory cell array 36 is selected by an extended X address signal $XA_{m+1}$. The changeover switch 31 can switch where to supply the X address signal $XA_{m+1}$ from the row circuit 32 to the column circuit 33. The X address signal $XA_{m+1}$ given from the external device is used to select a bit line. That is, in the memory device 12 a column block is selected in accordance with the X address signal $XA_{m+1}$ and a bit line and sense amplifiers 38 are selected in the selected column block in accordance with the Y address signal YA<0:n-1>. In the selected column block, a sub word line is selected in accordance with the X address signal XA<0:m>.

The memory device 12 according to the first embodiment has the following advantages.

(1) The memory device 12 can change the logical address map. The CPU 1 controls the logical address map of the memory device 12 in accordance with the access type. It is therefore possible to perform efficient memory access in accordance with the access type.

(2) In the memory device 12, the number of sense amplifiers 38 to be enabled by the use of a part of X address signals is changed in accordance with the logical address map. The consumed current can therefore be reduced.

(3) In accordance with the logical address map, a part of address signals supplied from the external device is changed from a signal for selecting an X address to a signal for selecting a Y address or vice versa. It is therefore possible to easily change the logical address map.

(4) The setting of the address structure is changed by the mode-register setting command. This eliminates the need for a special terminal and suppresses an increase in the shape of the memory device 12.

The first embodiment may be modified in the following form.

Figure 9:
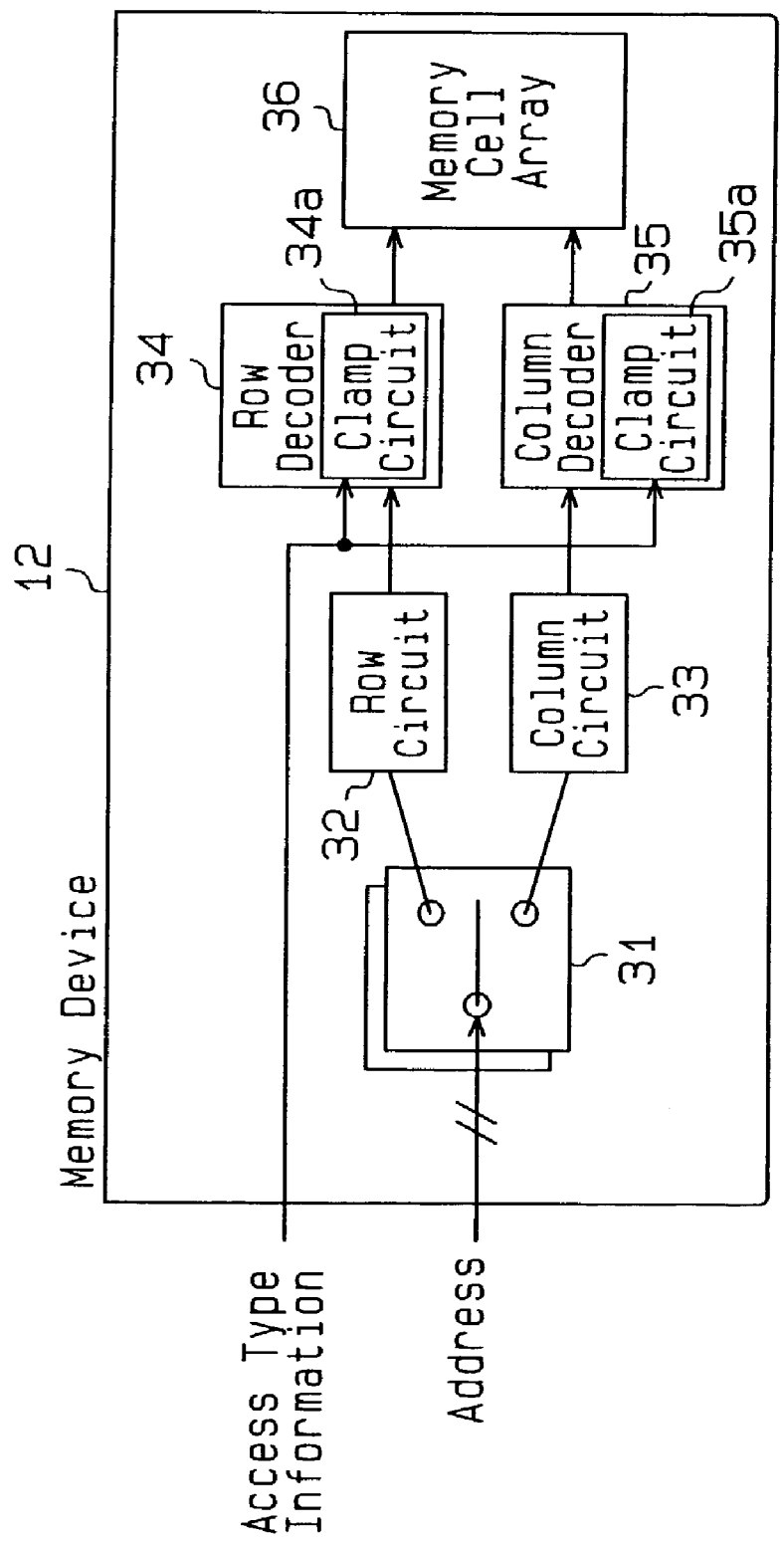
FIG. 9 is a schematic block diagram of a modified circuit associated with selection of the address structure of the memory device of FIG. 1.

As shown in FIG. 9, the changeover switch 31 and the first and second decoders 34 and 35 may receive access type information supplied from the external device and may change the logical address map in direct response to the received information.

The second embodiment of the invention will now be described referring to FIGS. 10 through 12.

Figure 10:
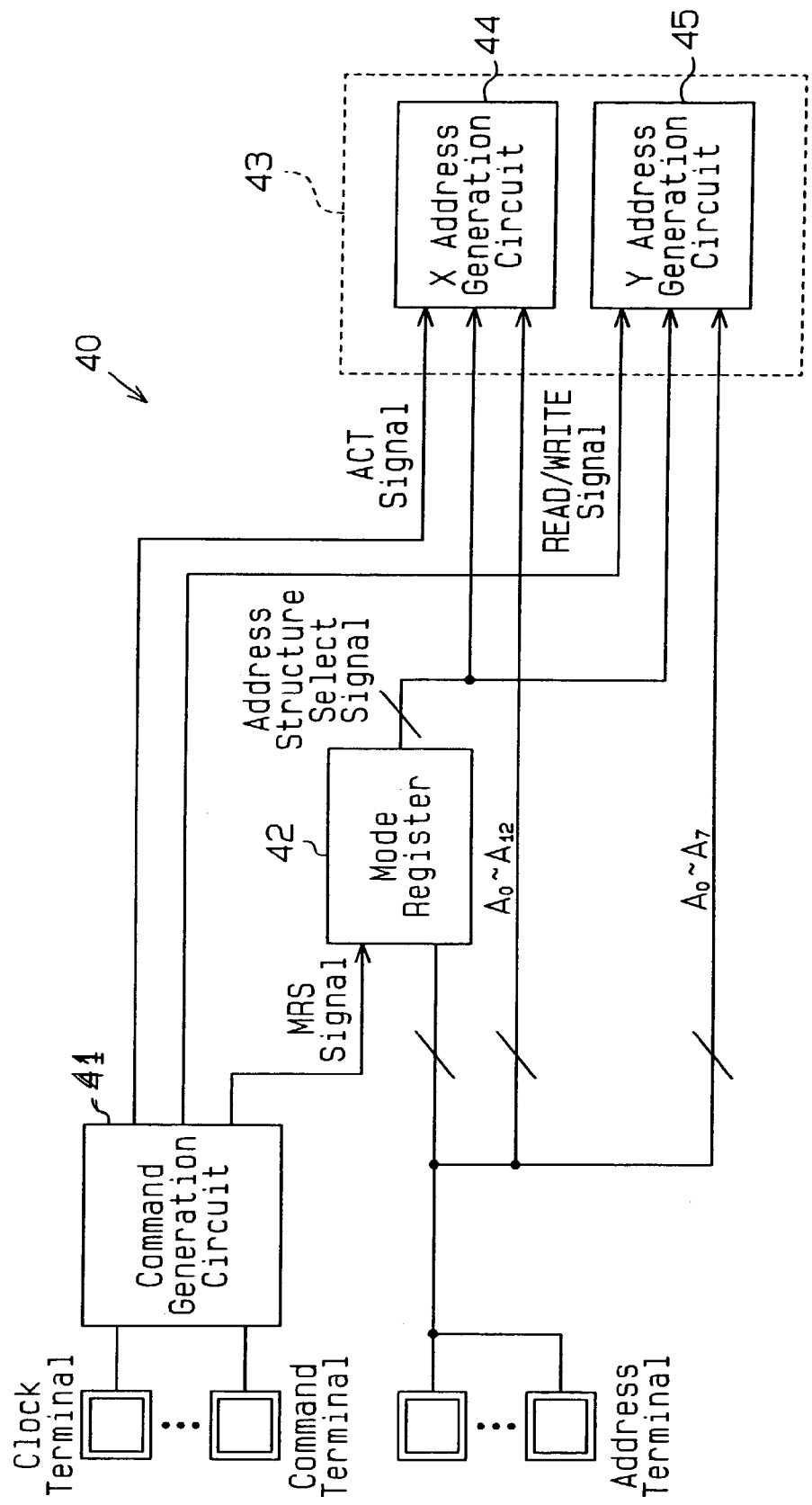
FIG. 10 is a schematic block diagram of a memory device according to a second embodiment of the invention.

FIG. 10 is a schematic block diagram of a memory device 40 according to the second embodiment.

The memory device 40 includes a command generation circuit 41, a mode register 42 and an address generation circuit 43. The command generation circuit 41 includes, for example, the clock buffer 21 and command decoder 22 shown in FIG. 1. The circuit of the memory device 40 may be modified as needed as long as it has a capability of changing the logical address map.

The command generation circuit 41, which is connected to a clock terminal and a command terminal, receives the clock signal CLK and external commands COM (signals /CAS, /WE, /CS and /RAS; see FIG. 1) shown in FIG. 1. In response to the clock signal CLK, the command generation circuit 41 decodes various commands in accordance with the signals /CAS, /WE, /CS and /RAS. The command generation circuit 41 generates an ACT signal when the decoded command is an activation command, generates a READ/WRITE signal (hereinafter referred to as "RD/WR signal") when the decoded command is a read/write command and generates an MRS signal when the decoded command is a mode-register setting command.

The mode register 42, connected to address terminals, receives address signals $A_0$–$A_{12}$. In accordance with the MRS signal and address signals $A_0$–$A_{12}$, the mode register 42 holds mode information of an operation on the DRAM core 29. The mode information includes access type information. The mode register 42 retains the access type information that is supplied from an external device (CPU 11 in FIG. 3). The mode register 42 generates the select signal ASS corresponding to the retained access type information.

The address generation circuit 43 includes an X address generation circuit 44 and a Y address generation circuit 45. The X address generation circuit 44 receives the ACT signal, the select signal ASS and the address signals $A_0$–$A_{12}$. The X address generation circuit 44 accepts the address signals $A_0$–$A_{12}$ as an X (row) address in response to the ACT signal and supplies the X address to the DRAM core 29. At this time, the X address generation circuit 44 renders a part of the address signals $A_0$–$A_{12}$ valid or invalid in accordance with the select signal ASS.

In case of the first logical address map (first memory array M1), a word line is selected and enabled by the address signals $A_0$–$A_{11}$. In case of the second logical address map (second memory array M2), a word line (sub word line) is selected and enabled by the address signals $A_0$–$A_{12}$.

In case where the logical address map is set to the first logical address map, therefore, the X address generation circuit 44 invalidates the address signal $A_{12}$ and generates an X address in accordance with the address signals $A_0$–$A_{11}$. In case where the logical address map is set to the second logical address map, the X address generation circuit 44 validates the address signal $A_{12}$ and generates an X address in accordance with the address signals $A_0$–$A_{12}$.

The Y address generation circuit 45 receives the ACT signal, the select signal ASS and the address signals $A_0$–$A_7$. The Y address generation circuit 45 receives the address signals $A_0$–$A_7$ in response to the ACT signal and generates a Y (column) address in accordance with the address signals $A_0$–$A_7$. The Y address is supplied to the DRAM core 29. At this time, the Y address generation circuit 45 renders a part of the address signals $A_0$–$A_7$ valid or invalid in accordance with the select signal ASS.

In case of the first logical address map, a bit line is selected and enabled in accordance with the address signals $A_0$–$A_7$. In case of the second logical address map, a bit line is selected and enabled in accordance with the address signals $A_0$–$A_6$.

In case where the logical address map is set to the first logical address map, therefore, the Y address generation circuit 45 validates the address signal $A_7$ and generates a Y address in accordance with the address signals $A_0$–$A_7$. In case where the logical address map is set to the second logical address map, the Y address generation circuit 45 invalidates the address signal $A_7$ and generates a Y address in accordance with the address signals $A_0$–$A_6$.

Figure 11:
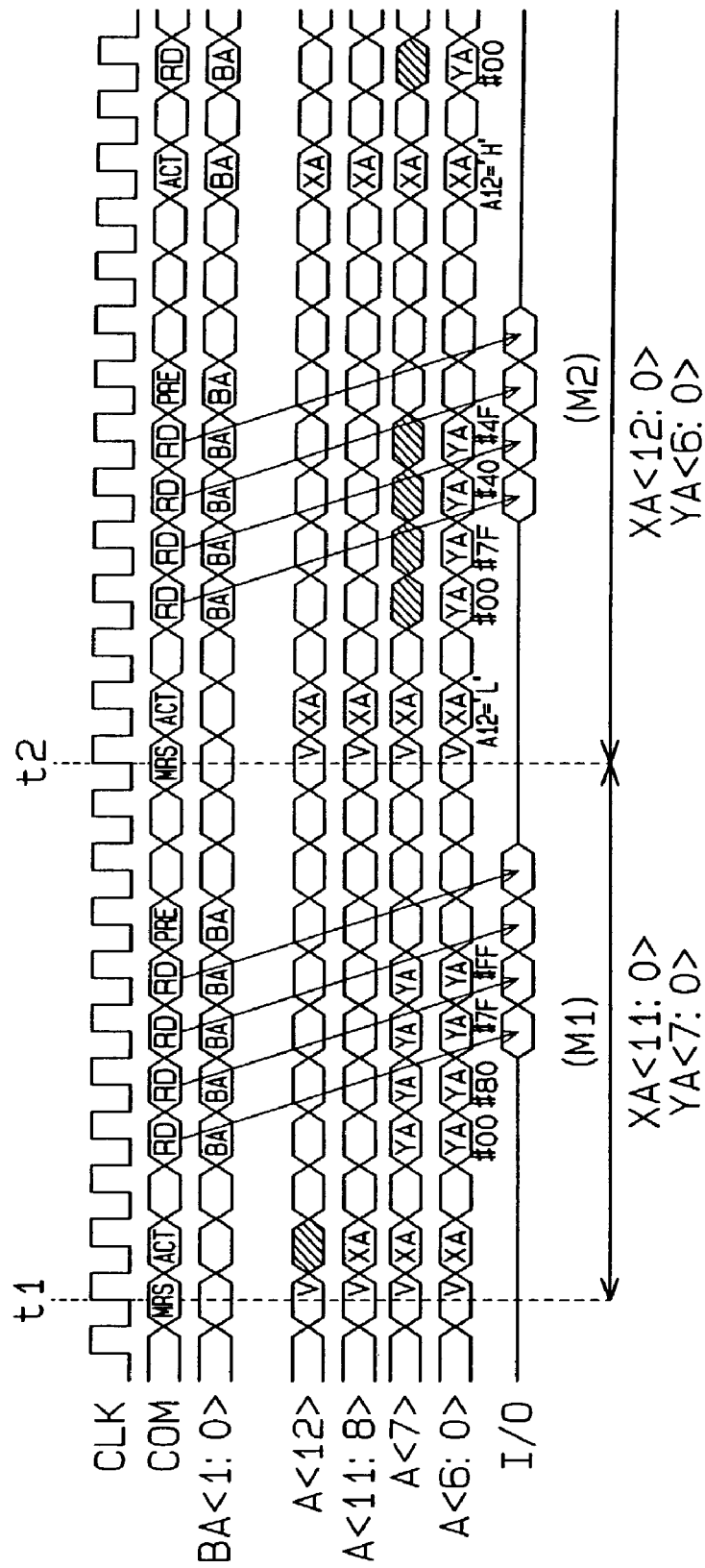
FIG. 11 is a timing chart illustrating the operation of the memory device in FIG. 10.

FIG. 11 is an operational waveform diagram for the memory device 40.

In response to the rising of the clock signal CLK, the memory device 40 receives and outputs a signal from and to the external device. In case where the external command COM is a mode-register setting command (MRS), the memory device 40 receives the bank address signals $BA_0$ and $BA_1$ and $A_0$ to $A_{12}$ or a part thereof as register setting information V and sets various modes in accordance with the register setting information V.

At time t1 in FIG. 11, the memory device 40 sets the logical address map to the first logical address map M1 according to the register setting information V. In response to a next activation command (ACT), the memory device 40 invalidates a part (address signal $A_{12}$) of the address signals $A_0$–$A_{12}$ received and enables a single word line selected from 4096 word lines in accordance with the address signals $A_0$–$A_{11}$. Each cell information of each of a plurality of memory cells connected to the enabled word line is read into the associated sense amplifier.

Next, in response to a read command (RD), the memory device 40 receives the address signals $A_0$–$A_7$ and connects sense amplifiers (e.g., the sense amplifiers 38 at a Y address (#00) shown in FIG. 7), selected from the 256 sense amplifiers, to a data bus line in accordance with the address signals $A_0$–$A_7$. At this time, the cell information of the memory cells that correspond to the address signals $A_0$–$A_7$ (Y address) received from the read command (RD) is outputted to the external device.

Thereafter, the memory device 40 receives the read command RD and address signals $A_0$–$A_7$ continuously or intermittently for each system clock CLK, then performs a page operation (e.g., #80→#7F→#FF). At this time, read data from a maximum of 256 memory cells is successively read out to the I/O data bus. Therefore, the occupation rate of the I/O data bus by the read data is high.

At time t2, the memory device 40 sets the logical address map to the second logical address map M2 according to the register setting information V received in response to the mode-register setting command (MRS). In response to a next activation command (ACT), the memory device 40 selects and enables one of 8192 sub word lines in accordance with the address signals $A_0$–$A_{12}$ ($A_{12}$ ($XA_{m+1}$ in FIG. 8)="L"). Cell information of the memory cells that are connected to the enabled sub word line is read into the associated sense amplifiers.

Next, in response to the read command (RD), the memory device 40 receives the address signals $A_0$–$A_7$ and invalidates a part of the address signals $A_0$–$A_7$ (address signal $A_7$). The memory device 40 connects sense amplifiers (e.g., the sense amplifiers 38 at the lowermost Y address (#00) shown in FIG. 8), selected from the 128 sense amplifiers, to a data bus line in accordance with the address signals $A_0$–$A_6$. As a result, the cell information of the memory cells that correspond to the address signals $A_0$–$A_6$ (Y address) received from the read command is outputted to the external device.

Thereafter, the memory device 40 receives the read command RD and address signals $A_0$–$A_7$, then performs a page operation (e.g., #7F→#40→#4F). Next, the memory device 40 disables the word line (sub word line) and the sense amplifiers by a precharge command (PRE) and returns to the standby mode. Then, the memory device 40 receives the address signals $A_0$–$A_{12}$ ($A_{12}$="H") in response to the activation command (ACT) after specific clocks (four clocks in FIG. 11) and selects and enables one of 8192 sub word lines in accordance with the address signals $A_0$–$A_{12}$. The cell information of the memory cells that are connected to the sub word line is read into the associated sense amplifiers.

Next, in response to the read command (RD), the memory device 40 receives the address signals $A_0$–$A_7$ and invalidates a part of the address signals $A_0$–$A_7$ (address signal $A_7$). The memory device 40 selects one of the 128 sense amplifiers (e.g., the sense amplifier 38 at a middle Y address (#00) shown in FIG. 8) and connects the selected sense amplifier 38 to a data bus line in accordance with the address signals $A_0$–$A_6$. At this time, the cell information of the memory cells that correspond to the address signals $A_0$–$A_6$ (Y address) received from the read command (RD) is outputted to the external device.

At this time, the length of the sub word line to be enabled is shorter than the length of the word lines of the first memory array M1 and the number of sense amplifiers to be enabled is smaller than the number of those of the first memory array M1. Although the second memory array M2 has the page length restricted to a half, therefore, the consumed current in the activation and precharge operations needed for the same number of accesses is reduced by a half as compared with that of the first memory array M1.

Figure 12:
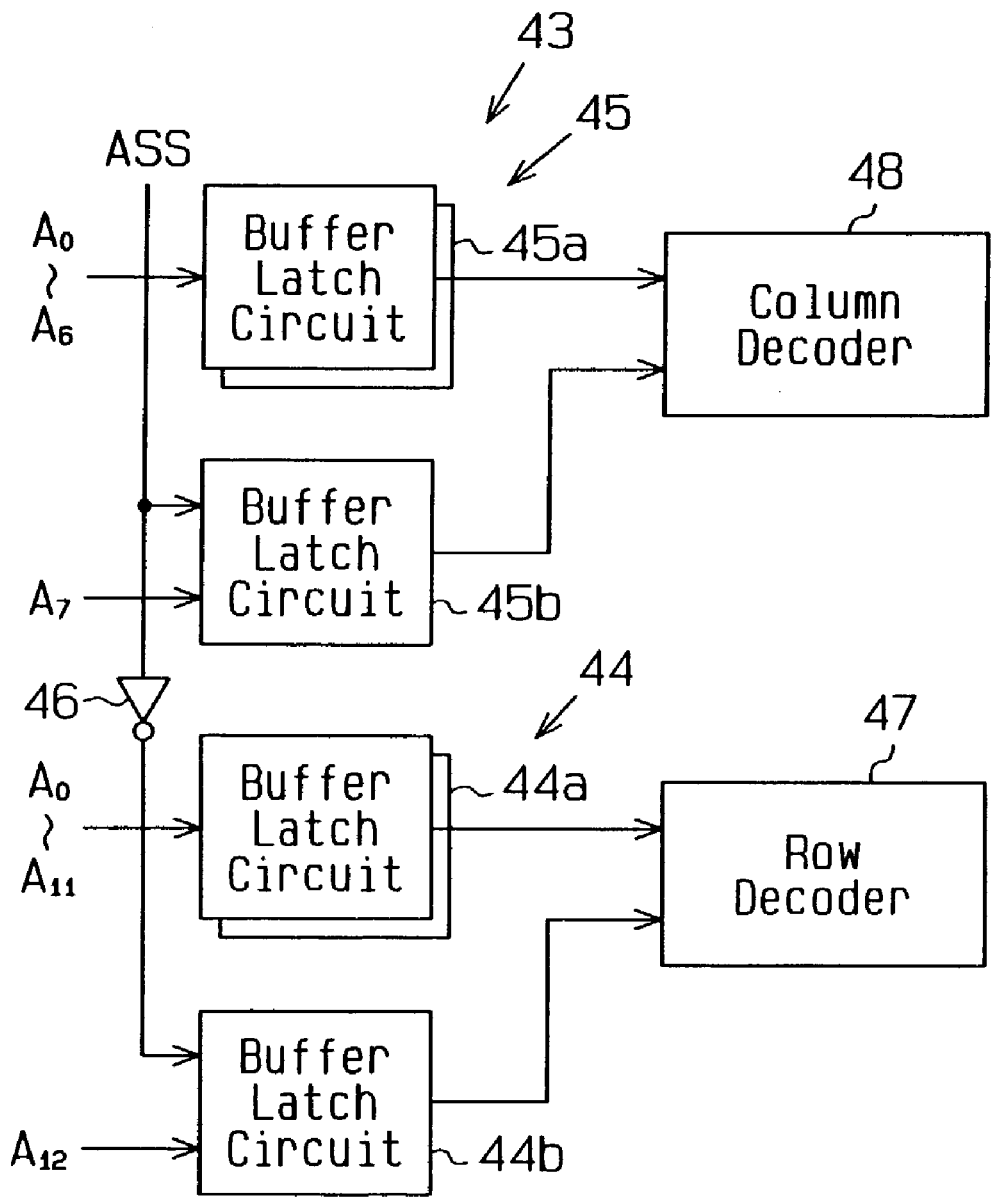
FIG. 12 is a schematic block diagram of an address generation circuit of the memory device in FIG. 10.

FIG. 12 is a schematic block diagram showing one example of the address generation circuit 43.

The address generation circuit 43 includes the X address generation circuit 44, the Y address generation circuit 45 and an inverter circuit 46.

The X address generation circuit 44 includes twelve first buffer latch circuits 44a corresponding to the address signals $A_0$–$A_{11}$ and a second buffer latch circuit 44b corresponding to the address signal $A_{12}$. The second buffer latch circuit 44b includes a first clamp circuit (not shown) which invalidates the address signal $A_{12}$. The first clamp circuit may be provided in an X (row) decoder 47 or may be connected to the second buffer latch circuit 44b as a separate circuit.

The Y address generation circuit 45 includes seven first buffer latch circuits 45a corresponding to the address signals $A_0$–$A_6$ and a second buffer latch circuit 45b corresponding to the address signal $A_7$. The second buffer latch circuit 45b includes a second clamp circuit (not shown) which invalidates the address signal $A_7$. The second clamp circuit may be provided in a Y (column) decoder 48 or may be connected to the second buffer latch circuit 45b as a separate circuit.

The inverter circuit 46 logically inverts the received select signal ASS to generate an inverted select signal and sends the inverted select signal to the second buffer latch circuit 44b of the X address generation circuit 44. The second buffer latch circuit 45b of the Y address generation circuit 45 receives the select signal ASS. The second buffer latch circuits 44b and 45b operate complementarily.

In the X address generation circuit 44, the first buffer latch circuits 44a respectively latch the address signals $A_0$–$A_{11}$ and supply the latched signals to the X decoder 47. The second buffer latch circuit 44b latches the address signal $A_{12}$ and sends out the latched signal or the clamped address signal $A_{12}$ in response to the inverted select signal.

In the Y address generation circuit 45, the first buffer latch circuits 45a respectively latch the address signals $A_0$–$A_6$ and supply the latched signals to the Y decoder 48. The second buffer latch circuit 45b latches the address signal $A_7$ and sends out the latched signal or the clamped address signal $A_7$ in response to the select signal ASS.

The memory device 40 according to the second embodiment has the following advantage.

In the memory device 40, the logical address map is changed by invalidating a part of the X address signal or the Y address signal. It is therefore possible to eliminate the work of changing the external address input signal to be supplied to the memory device 40 in accordance with the shape of the address map.

The second embodiment may be modified as follows.

The X address generation circuit 44 may have a clamp circuit which clamps the output signal such that a circuit at the subsequent stage (e.g., the X decoder 47) corresponding to the invalidated address signal $A_{12}$ should not malfunction. The Y address generation circuit 45 may have a clamp circuit which clamps the output signal such that a circuit at the subsequent stage (e.g., the Y decoder 48) corresponding to the invalidated address signal $A_7$ should not malfunction.

Figure 13:
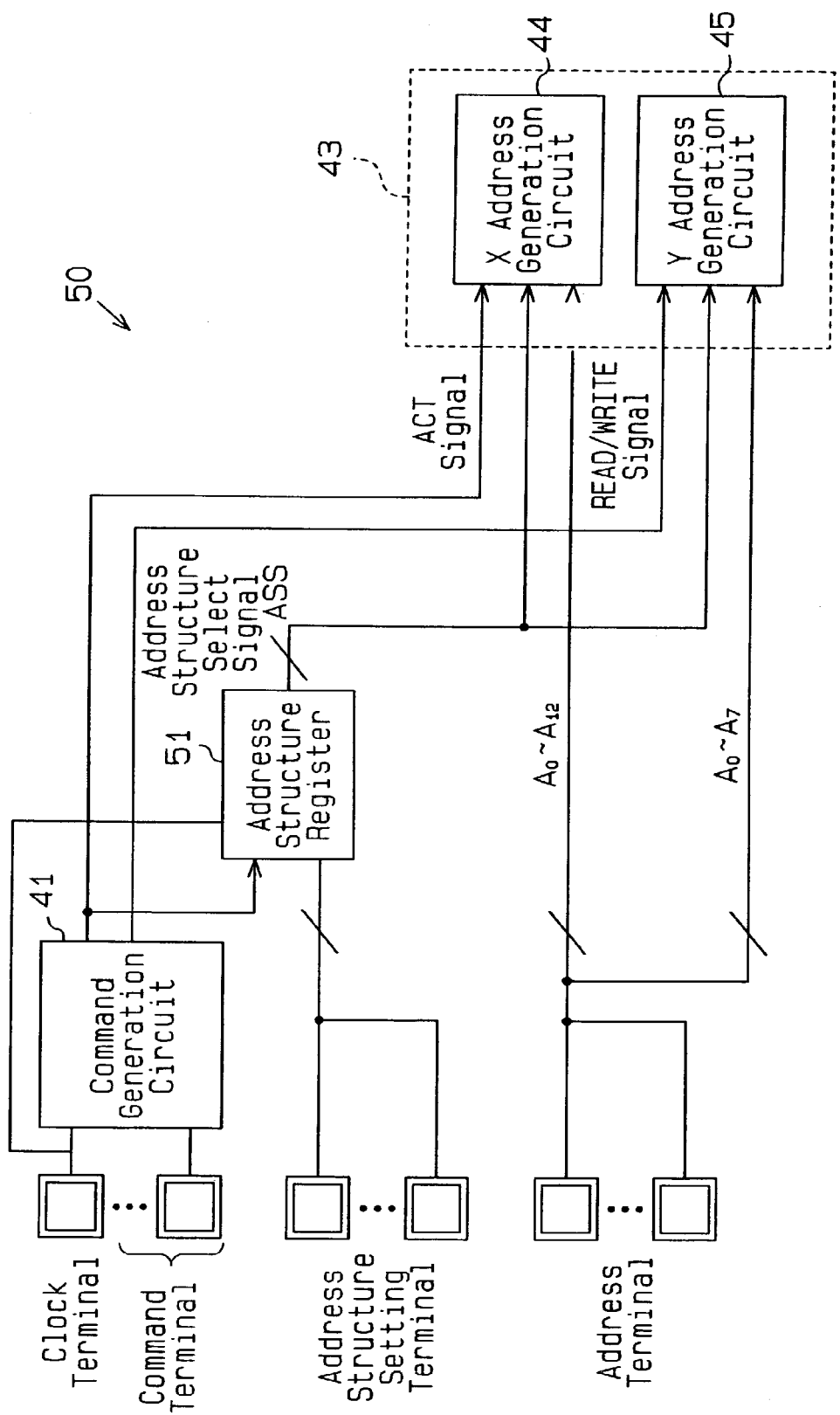
FIG. 13 is a schematic block diagram of a memory device according to a third embodiment of the invention.
Figure 14:
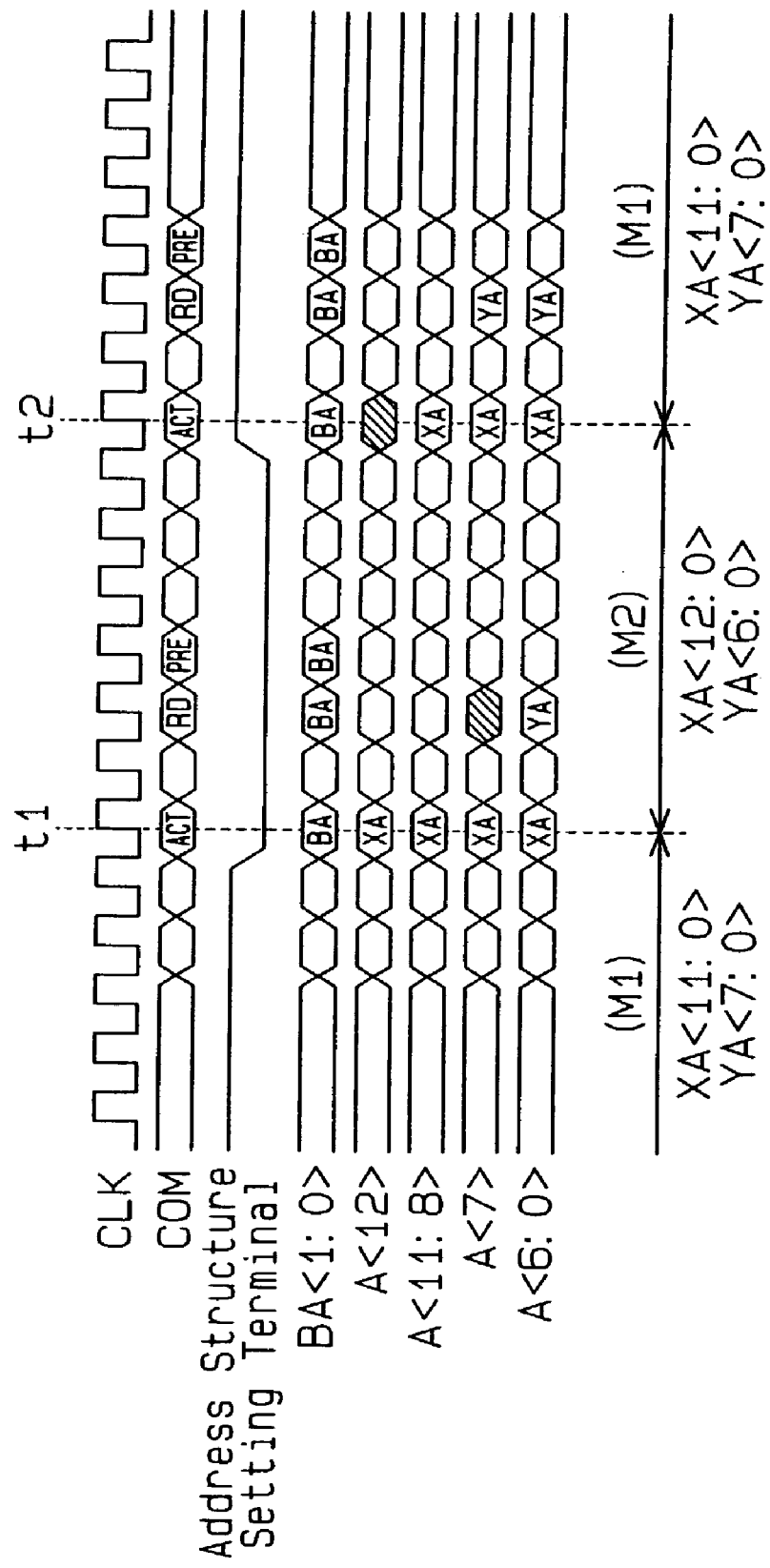
FIG. 14 is a timing chart illustrating the operation of the memory device in FIG. 13.

A memory device 50 according to the third embodiment of the invention will be discussed referring to FIGS. 13 and 14. FIG. 13 is a schematic block diagram of the memory device 50 and FIG. 14 is an operational waveform diagram for the memory device 50.

The memory device 50 includes the command generation circuit 41, an address structure register 51 and the address generation circuit 43.

The address structure register 51, connected to an address structure setting terminal, receives an address structure setting signal AST. The address structure register 51 receives the ACT signal from the command generation circuit 41.

In response to the ACT signal, the address structure register 51 determines whether the address structure setting signal AST has been changed or not. The address structure setting signal AST has a logic level corresponding to the logical address map and is supplied from the external device (e.g., the CPU 11 in FIG. 3). The address structure register 51 determines whether or not the logical address map has been changed or not every time it accepts an activation command according to the ACT signal, and stores address structure setting in accordance with the result of the decision. The address structure register 51 generates the select signal ASS corresponding to the setting of the address structure.

The memory device 50 can change the logical address map without using the mode-register setting command (MRS). In the third embodiment, therefore, the cycle (the number of clocks) for accepting an activation command becomes shorter than those in the first and second embodiments, thereby improving the access speed as a whole.

The third embodiment may be modified as follows.

The setting of the address structure may be determined in response to the system clock CLK. The address structure register 51 is connected to the clock terminal to receive the system clock CLK. In response to the rising (or the falling or both the rising and falling) of the system clock CLK, the address structure register 51 determines whether or not the logical address map has been changed or not in accordance with the address structure setting signal AST. In accordance with the result of the decision, the address structure register 51 stores address structure setting and generates the select signal ASS corresponding to the setting. In this case, the logical address map can be changed more easily as done in the case of using the mode-register setting command (MRS). Further, the select signal ASS is generated in accordance with the clock signal CLK of an earlier timing than the timing at which the command generation circuit 41 accepts various commands. Therefore, the operation of the address generation circuit 43 that receives the address signals is not delayed, thereby making it possible to prevent access delay.

Figure 15:
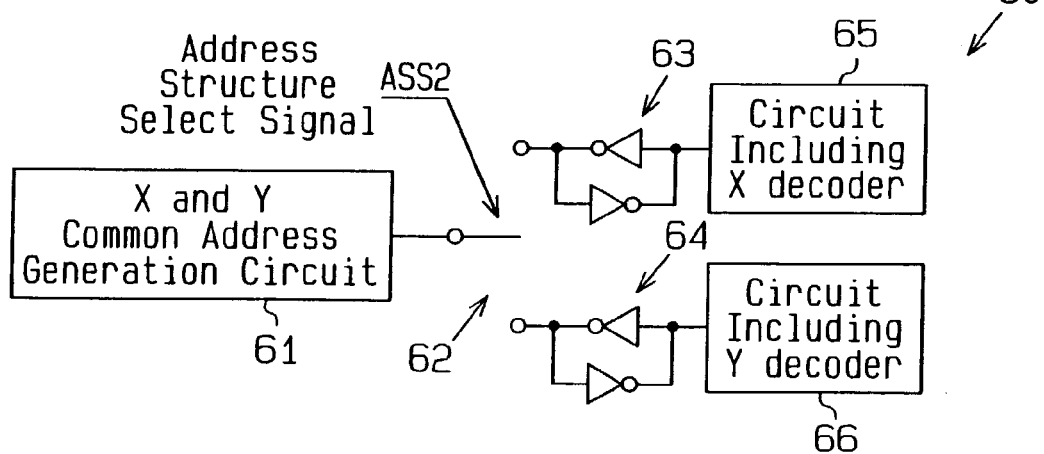
FIG. 15 is a schematic block diagram of a different implementation of the memory device described heretofore.

In the second and third embodiments, the X address generation circuit and the Y address generation circuit may be shared. As shown in FIG. 15, a memory device 60 includes an X and Y common address generation circuit 61, a changeover switch 62, latch circuits 63 and 64, a row circuit 65 and a column circuit 66. The changeover switch 62 is provided in association with the address signals $A_0$–$A_{12}$ and connects the common address generation circuit 61 to the row circuit 65 or the column circuit 66 in response to an address structure select signal ASS2.

The row circuit 65 includes an X decoder and the column circuit 66 includes a Y decoder. The latch circuit 63 is connected between the column circuit 65 and the changeover switch 62. The latch circuit 64 is connected between the column circuit 66 and the changeover switch 62.

The address structure select signal ASS2 controls the switching of the changeover switch 62. In accordance with the switching control of the changeover switch 62, the output signal (address signal) of the common address generation circuit 61 is supplied to the row circuit 65 or the column circuit 66. The control logic of the address structure select signal ASS2 is equal to that of the address structure select signal ASS.

Figure 16:
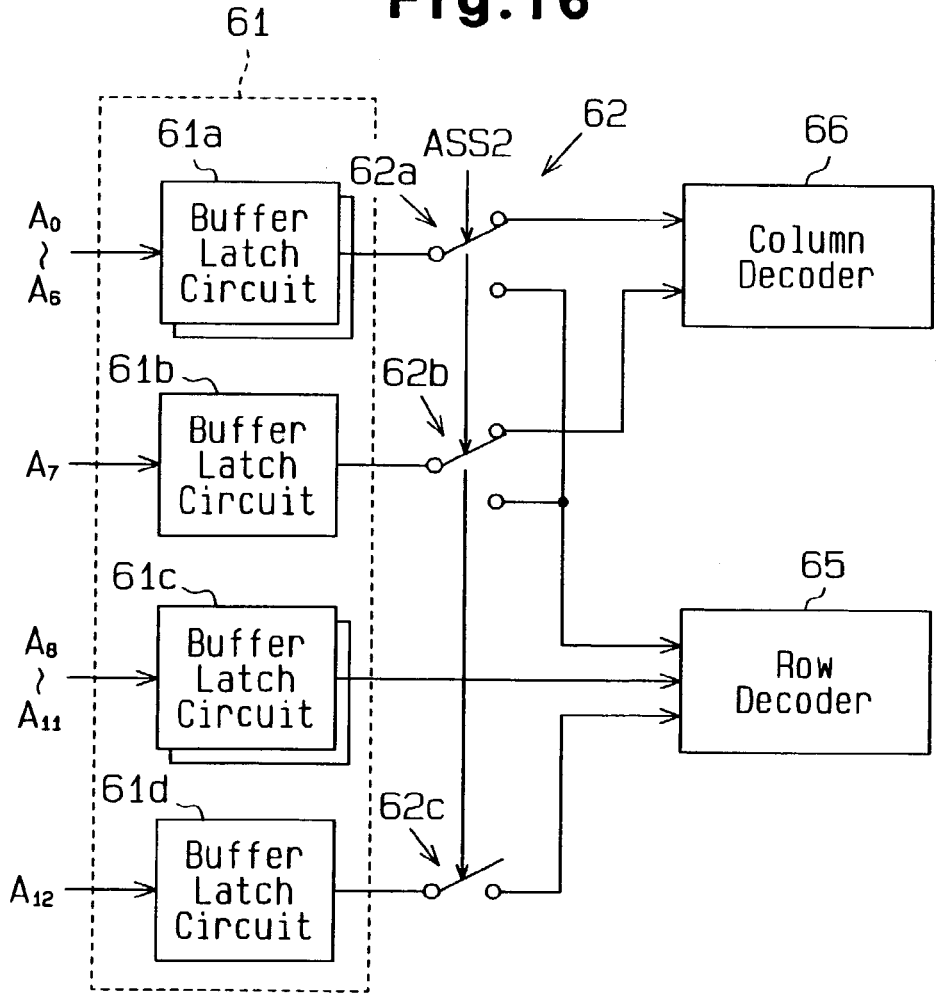
FIG. 16 is a schematic block diagram of an address generation circuit of the memory device of FIG. 15.

FIG. 16 is a block diagram showing one example of the common address generation circuit 61.

The common address generation circuit 61 includes seven first buffer latch circuits 61a corresponding to the address signals $A_0$–$A_6$, a second buffer latch circuit 61b corresponding to the address signal $A_7$, four third buffer latch circuits 61c corresponding to the address signals $A_8$–$A_{11}$, and a fourth buffer latch circuit 61d corresponding to the address signal $A_{12}$.

The changeover switch 62 includes first to third switches 62a to 62c. The first switch 62a supplies the output signals of the first buffer latch circuits 61a to the row circuit 65 or the column circuit 66. The second switch 62b supplies the output signal of the second buffer latch circuit 61b to the row circuit 65 or the column circuit 66 or invalidates that output signal with respect to the column circuit 66. The third switch 62c renders the output signal of the fourth buffer latch circuit 61d invalid or valid with respect to the column circuit 66.

The common address generation circuit 61 can help reducing the area occupied by the address generation circuit and is effective in miniaturizing the memory device.

The fourth embodiment of the invention will now be described referring to FIGS. 17 through 27.

The fourth embodiment is an example adapted to an asynchronous memory device which changes the logical address map by making a predetermined address signal invalid or valid. Because the schematic structure of the asynchronous memory device is well known, its illustrations and explanation will be omitted herein.

Figure 17:
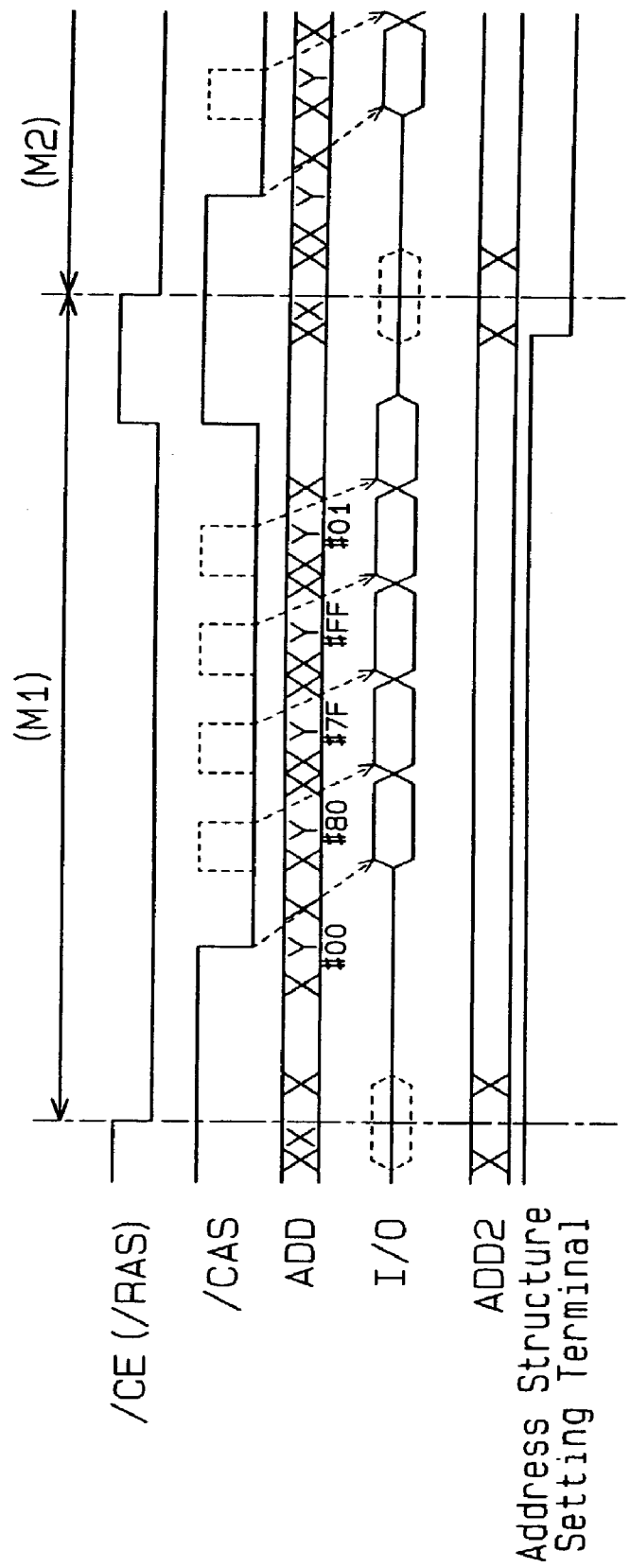
FIG. 17 is a timing chart illustrating the operation of an asynchronous memory device according to a fourth embodiment of the invention.

The asynchronous memory device (hereinafter called "asynchronous memory") settles an address signal ADD as an X (row) address signal according to the falling of a chip enable signal (/CE) or row address strobe signal (/RAS) and determines an X address according to the X address signal. Then, the asynchronous memory settles the address signal ADD as a Y (column) address signal according to the read or write control signal and determines a Y address according to the Y address signal. The cell that is designated by the X and Y addresses is accessed. The operational waveform shape of the asynchronous memory is illustrated in FIG. 17.

The alteration of the logical address map involves the use of terminals which are not used in the memory device when the chip enable signal /CE (or the row address strobe signal /RAS) falls. For example, an I/O terminal, an extended address terminal ADD2 and the address structure setting terminal are used.

Figure 18:
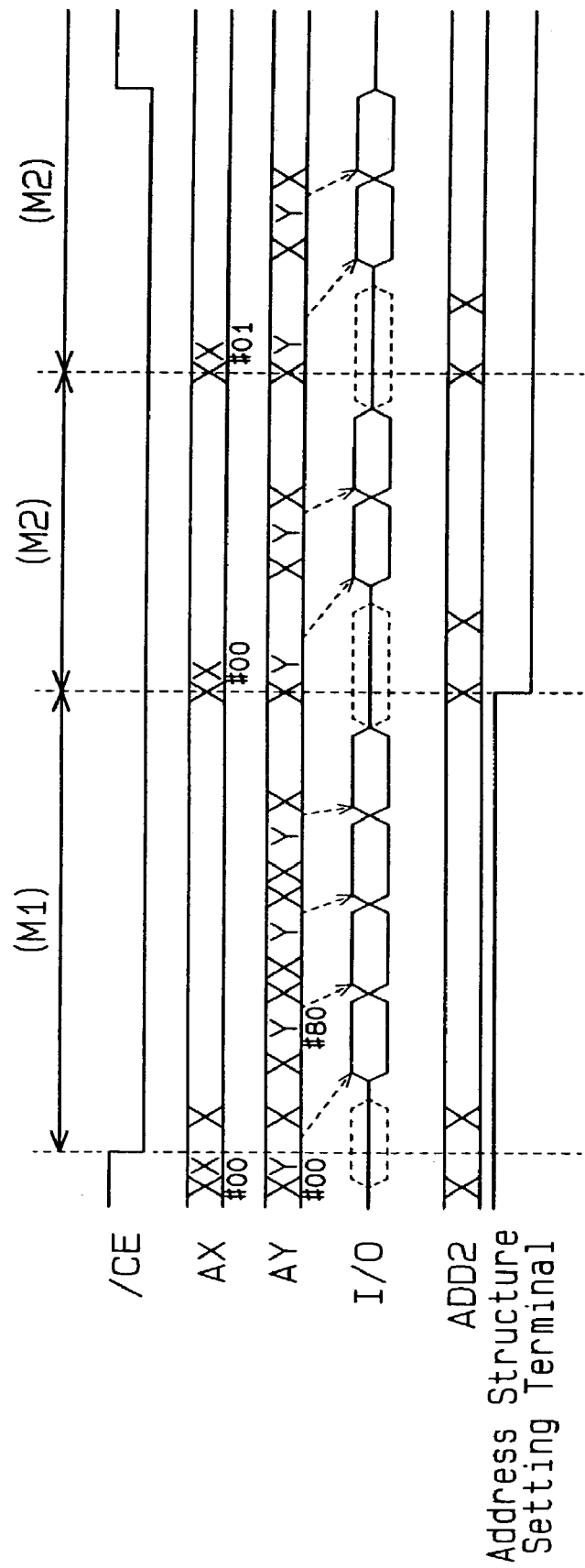
FIG. 18 is a timing chart illustrating the operation of a complete asynchronous memory device.

In a complete asynchronous memory, such as an SPAM (Static RAM) or flash memory, the logical address map may be changed. FIG. 18 shows the operational waveform of the complete asynchronous memory device.

In an asynchronous memory, the address map may be controlled according to the following illegal entry system (control method by an external device which is not used in normal access).

In an illegal entry system, the address structure select signal ASS inside the memory device is generated earlier than the word-line enabling signal produced from the chip enable signal /CE as in the case where the mode-register setting command (MRS) is used in a synchronous memory device. The access delay is therefore prevented without delaying the operation of the X address generation circuit or the changeover switch (see FIG. 15) which switches the output thereof.

The illegal entry system will be elaborated below.

Figure 19:
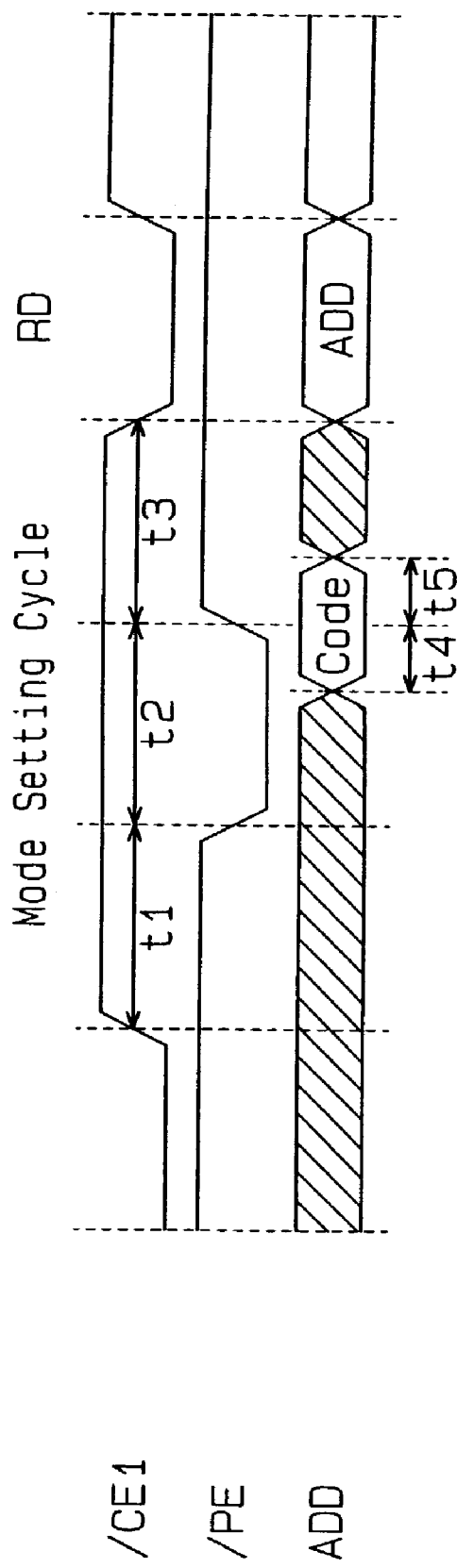
FIG. 19 is a waveform diagram illustrating a mode setting cycle.

FIG. 19 is a waveform diagram illustrating a mode setting cycle for the address structure.

An asynchronous memory includes a special terminal for mode setting for the address structure. As the asynchronous memory receives, from that special terminal, information necessary to determine the type of the address structure, an external access delay can be prevented and malfunction is prevented to guarantee the reliable operation of the normal operation.

When the chip enable signal /CE1 is at an H level, the asynchronous memory does not conduct normal operation and receives the address signal ADD including an address code Code in response to a program mode signal /PE (=address structure setting signal) received from the special terminal. Specifically, the asynchronous memory enables the input of the address code in response to the falling of the program mode signal /PE and latches address code information in response to the rising of the program mode signal /PE.

When the chip enable signal /CE1 falls to an L level, the asynchronous memory receives an address signal ADD corresponding to an external access.

In FIG. 19, t1 to t5 are timing conditions for the external specification. In FIG. 19, when the program mode signal /PE falls, an input circuit of the external special terminal is enabled and decoding of the address signal starts. When the program mode signal /PE rises, the decoding result is settled and the input circuit of the external special terminal is disabled. This operation can contribute to reducing the power consumption.

The logic level of the program mode signal /PE may be inverted in a mode setting cycle for the address structure. An address code may be supplied from a data terminal (called DQ or I/OPin). The mode may be settled after the program cycle based on the code system is repeated several times.

FIG. 20 is an exemplary diagram of commands. In case of using commands, the asynchronous memory identifies a command and performs an external access operation with respect to the reference clock (system clock CLK or chip enable signal /CE1).

In the asynchronous memory which does not operate in response to a command with respect to the chip enable signal /CE shown in FIG. 17 or FIG. 18, therefore, the address should be handled simply as information for determining the type of the address structure and should be used as the number of times for setting the mode.

The commands (1) to (6) and (8) to (10) are used in the normal operation and the commands (7) and (11) do not have a significance in the normal operation. Although the command (7) is for a write (WR) operation, data is not inputted (data is masked) because signals /LB and /UB have H levels. Although the command (11) is for a read (RD) operation, data is not outputted because signals /LB and /IB have H levels.

The reception of commands (illegal commands) which are not used in the normal operation as information for determining the type of address structure can ensure the setting of information without providing a special terminal.

Figure 21:
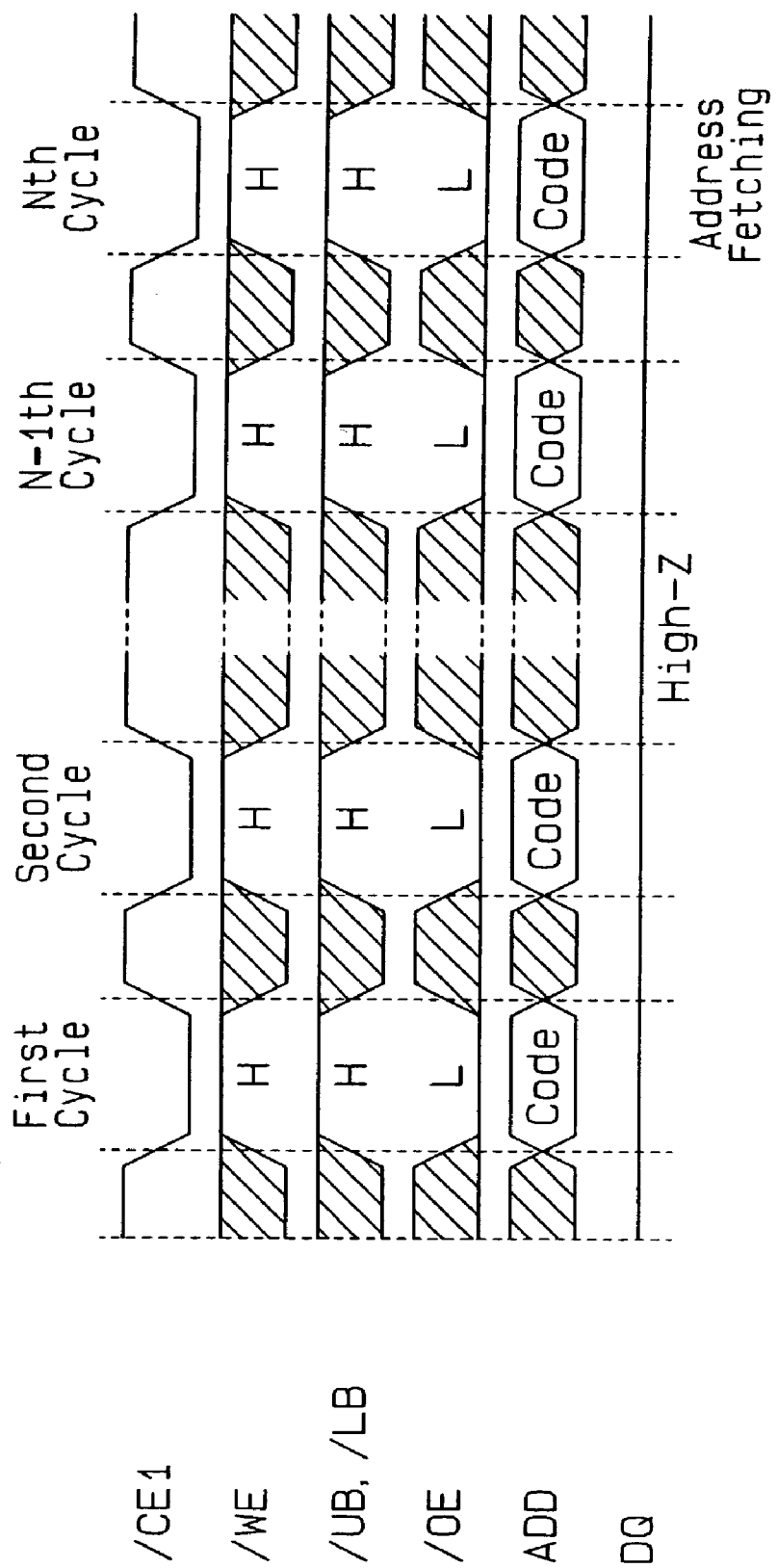
FIG. 21 is a waveform diagram illustrating a mode setting cycle.

FIG. 21 is a waveform diagram illustrating a mode setting cycle for the address structure. FIG. 21 shows a case where as the command (11) in FIG. 20 is received plural times consecutively, information necessary for mode setting for the address structure is supplied as an address code.

In response to the command (11), the asynchronous memory receives the address signal ADD as the address code Code N times. In case where all the N address codes Code fetched coincide with one another, the asynchronous memory determines that the address code Code is valid and performs mode setting for the address structure.

In case where the commands (11) has had (N−1) matches, mode setting for the address structure may be performed in accordance with the address code Code that is fetched in association with the N-th command (11). The fetching of the address code Code may be carried out in a different arbitrary cycle (e.g., the first cycle). Various other modifications are possible. The number of the bits of the address code for setting the mode has only to be settled in association with the number of the types of the address structures.

In case of N mode setting cycles as in FIG. 21, a counter circuit is used inside the device. If the upper bits of the counter circuit are changed with respect to an entry of the N mode setting cycles, the circuit structure for settling the mode is provided.

FIGS. 22A and 22B are operational waveform diagrams for an entry control circuit as a mode setting circuit for the program address structure.

As shown in FIG. 22A, a first entry circuit generates a first address enable signal proaddz of an H level in the third cycle and generates a first entry signal proentz in the fourth cycle. The first entry circuit resets the first address enable signal proaddz and the first entry signal proentz simultaneously. At this time, information of the address structure settled previously is changed to information of the latest address structure. The information of the latest address structure is supplied in the fourth cycle in accordance with the first entry signal proentz.

As shown in FIG. 22B, the first entry circuit resets counting when receiving another command (an activation command to enable the device or read/write command) during counting. As a result, the first address enable signal proaddz and the first entry signal proentz are held at L levels.

If the same command is not received consecutively for a specified number of times in the mode setting to determine the type of the address structure, the mode setting is canceled (the memory device maintains the information of the address structure settled previously).

FIG. 23 is an operational waveform diagram for an entry control circuit (second entry circuit) or a mode setting circuit for the program address structure and corresponds to the waveform diagram of FIG. 19.

The second entry circuit generates an address enable signal peaddz of an H level in response to the program mode signal /PE of an L level. Thereafter, the second entry circuit generates an H-level entry signal peentz in response to the program mode signal /PE of an H level and receives address code information in accordance with the entry signal peentz. The information of the address structure settled previously is changed to information of the latest address structure according to the received address code information.

Figures 24A, 24B:
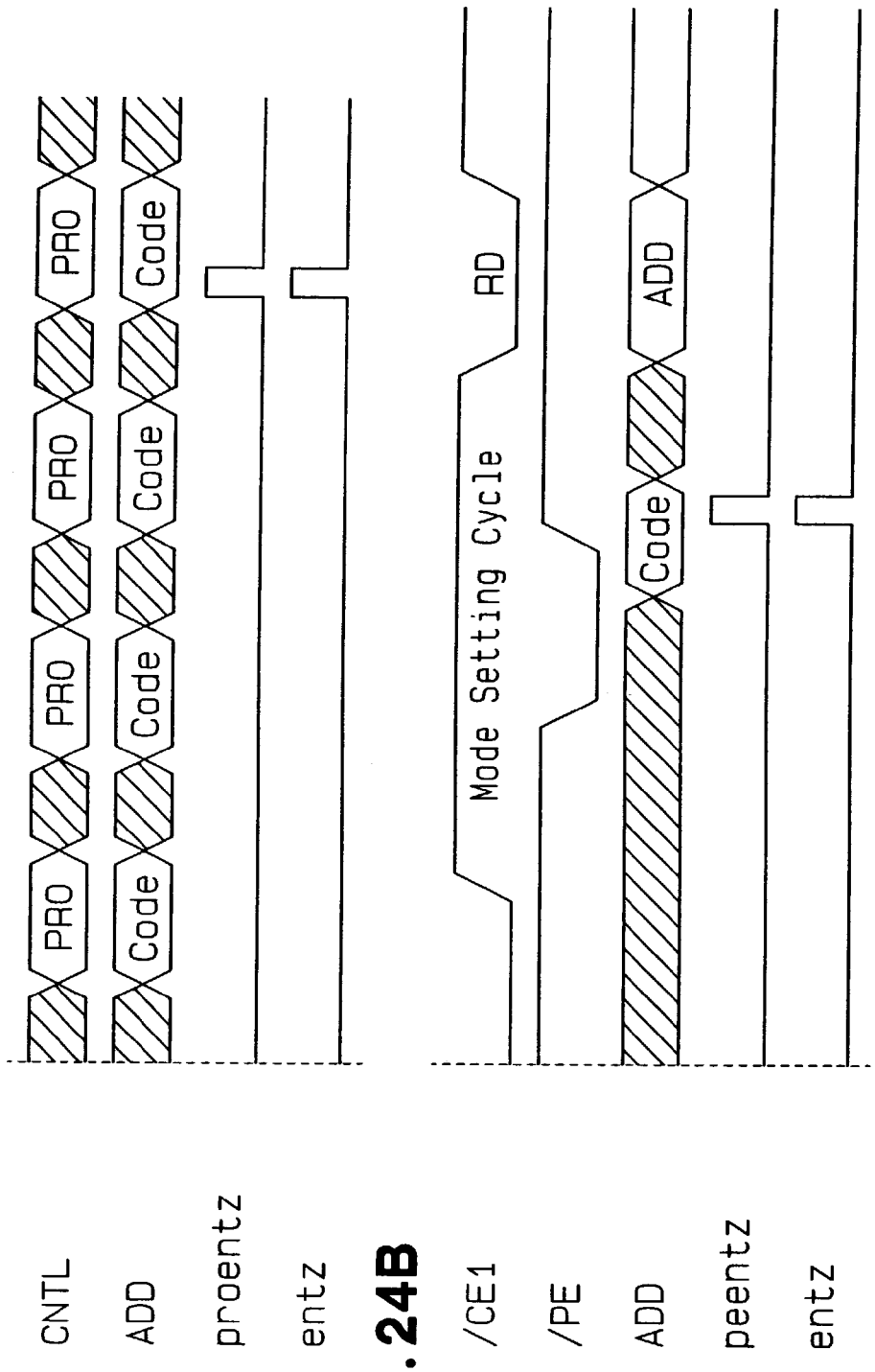
FIGS. 24A and 24B are operational waveform diagrams for a synthesized entry signal generation circuit.

FIGS. 24A and 24B are operational waveform diagrams for a synthesized entry signal generation circuit. As shown in FIG. 24A, the synthesized entry signal generation circuit generates a synthesized signal entz in response to the first entry signal proentz. As shown in FIG. 24B, the synthesized entry signal generation circuit generates the synthesized signal entz in response to the entry signal peentz.

FIG. 25 is an operational waveform diagram for a mode setting address buffer for the address structure. The address buffer enables the input circuit in response to the H-level address enable signal peaddz and generates an address signal az<0:3>. The address buffer operates similarly in response to the first address enable signal proaddz.

Figure 26:
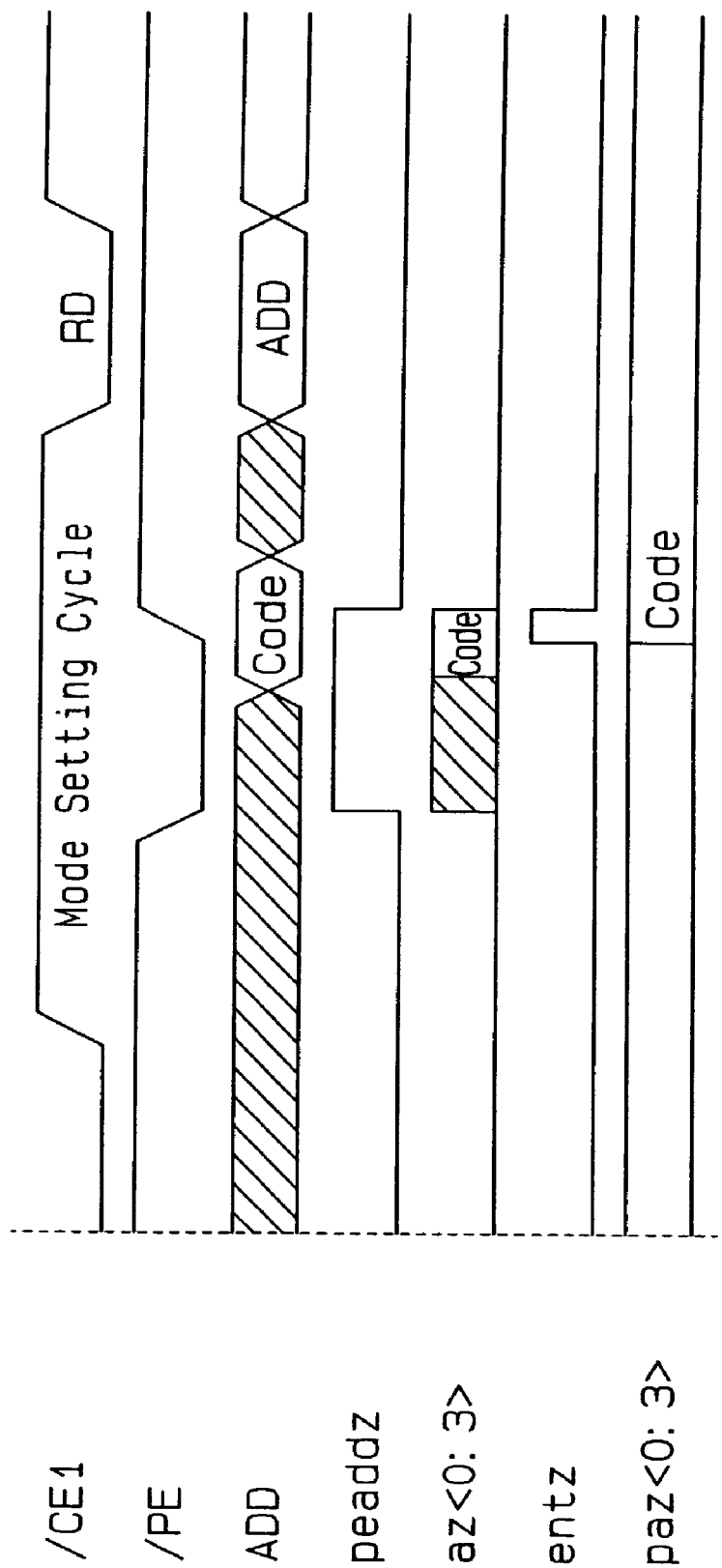
FIG. 26 is an operational waveform diagram for a mode setting address latch.

FIG. 26 is an operational waveform diagram for a mode setting address latch for the address structure. The address latch generates the address signal az<0:3> in response to the H-level address enable signal peaddz and latches the address signal az<0:3> in response to the synthesized signal entz. The address latch generates a code Code according to the address signal az<0:3> and generates a mode setting address signal paz<0:3> for the address structure according to the code Code. The address latch operates similarly in response to the first address enable signal proaddz.

Figure 27:
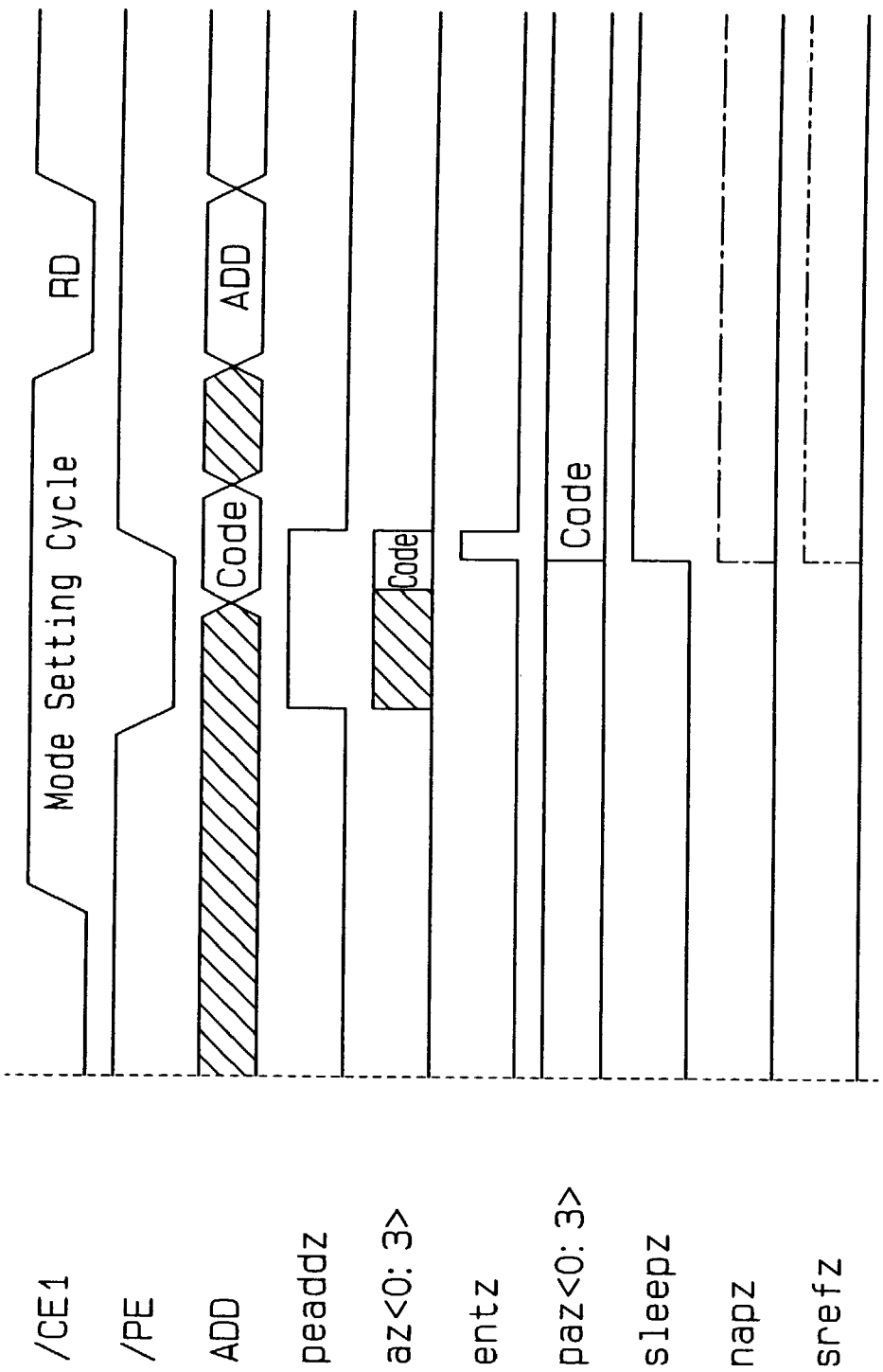
FIG. 27 is an operational waveform diagram for a mode setting decoder.

FIG. 27 is an operational waveform diagram for a mode setting decoder. The mode setting decoder for the address structure decodes the mode setting address signal paz<0:3> to generate address structure select signals for several types of address maps. The mode setting decoder selects one of the address structure select signals and sets the selected address structure select signal to an H level.

The asynchronous memory device according to the fourth embodiment has the following advantages.

(1) Changing the logical address map can ensure efficient access and reduction in current consumption even in an asynchronous memory device as per the first to third embodiments.

(2) The use of the illegal entry system eliminates the need to change the structure of the conventional asynchronous memory device. This can ensure easy adaptation to the conventional asynchronous memory device without much trouble.

The fifth embodiment of the invention will now be discussed.

Figure 28:
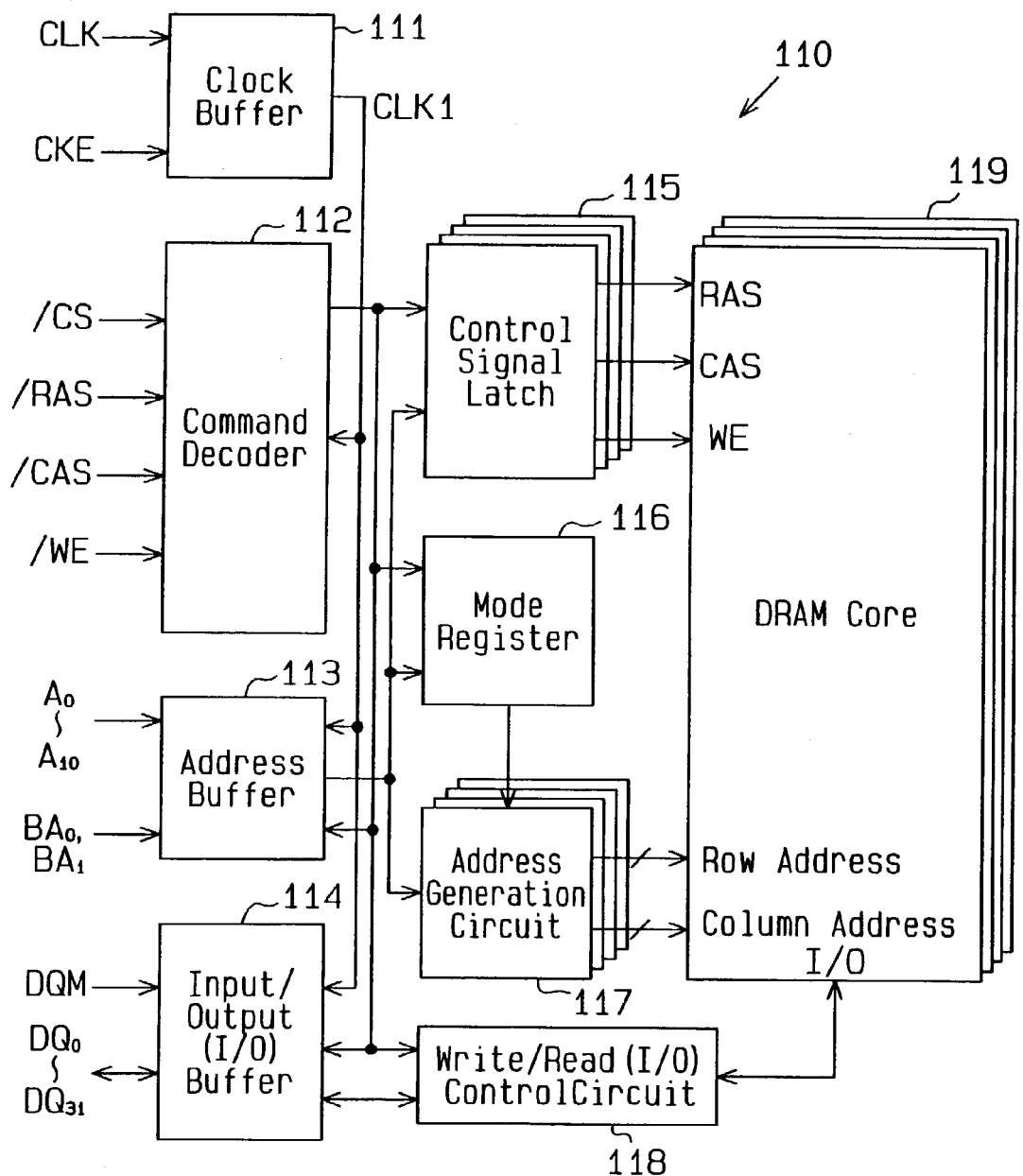
FIG. 28 is a schematic block diagram of a memory device according to a fifth embodiment of the invention.

FIG. 28 is a schematic block diagram of a memory device (SDRAM) 110 according to the fifth embodiment. That part of the explanation of the memory device 110 which is common to the memory device 12 of the first embodiment will be omitted.

The memory device 110 has a capability of changing the logical address map in accordance with the access type information that is received from the CPU (not shown).

The memory device 110 has the same outer shape as a standardized memory device which has substantially the same memory capacity. That is, the memory device 110 does not have a special external signal input terminal for changing the logical address map.

In a memory device which has a capacity of 64 Mbits (32 I/O, 4 bank structure), for example, in general (according to the standard specifications) each bank has memory cells of 0.5 MB for a single I/O. Each bank is selected by a 2-bit bank address. The memory cells of each bank are laid out in an array with plural (2048) word lines which are selected by a 11-bit X (row) address and plural (256) bit lines which are selected by an 8-bit Y (column) address.

A memory device, such as SDRAM, is so constructed as to receive an X address and Y address in an address multiplex system. An ordinary 64-Mbit memory device therefore has 13 address pins to receive a 13-bit X address (two bits of which are a bank address) and an Y address in a time divisional fashion.

The functional structure of the memory device 110 will be discussed below.

The SDRAM 110 has a clock buffer 111, a command decoder 112, an address buffer 113, an input/output (I/O) buffer 114, a control signal latch 115, a mode register 116, an address generation circuit 117, a write/read (I/O) control circuit 118 and a DRAM core 119.

The clock buffer 111, the command decoder 112, the address buffer 113, the I/O buffer 114, the control signal latch 115, the mode register 116, the address generation circuit 117, the I/O control circuit 118 and the DRAM core 119 are respectively equivalent to the clock buffer 21, the command decoder 22, the address buffer 23, the I/O buffer 24, the control signal latch 25, the mode register 26, the address generation circuit 27, the I/O control circuit 28 and the DRAM core 29 in FIG. 1.

FIG. 29 is a schematic structural diagram of the DRAM core 119. The following description will be given of a single bank which constitutes the DRAM core 119 for the sake of simplicity.

Each bank includes a memory cell array (memory array) 121 which includes an array of memory cells (not shown). Each memory cell is connected to a word line WL and a bit line (not shown) which is connected to an associated sense amplifier S/A. A column select line CL is connected to the sense amplifier S/A. The memory cell array 121 includes a plurality of word lines WL which are selected by an X (row) address, a plurality of column select lines CL which are selected by a Y (column) address and sense amplifiers S/A (S/A columns).

The memory cell array 121 has a plurality of row blocks defined in the X direction and a plurality of column blocks defined in the Y direction. The row block is an area defined by the individual sense amplifiers S/A (S/A column) in the X direction of the memory cell array 121. The column block is an area defined in the unit of a sub word line SWL connected to a word line WL in the Y direction of the memory cell array 121. The column block may include an area defined in the unit of a plurality of sub word lines SWL.

The memory cell array 121 has a function of changing the logical address map in accordance with access type information held in the mode register 116. In the fifth embodiment, the logical address map is changed by an address structure select signal (hereinafter called "page length designation signal") ASS supplied from the mode register 116.

The memory cell array 121 changes the logical address map by changing the depth of the X address and the depth of the Y address in accordance with the page length designation signal ASS. When the page length (the depth of the Y address) is changed by the page length designation signal ASS, the number of sense amplifiers S/A to be enabled according to the change in page length is changed. As a result, the number of pieces of data to be accessible consecutively is changed.

The DRAM core 119 performs various operations, such as data writing and data reading, on memory cells that correspond to a predetermined X address and Y address which are designated by address signals A0–A10 supplied from the external address terminals and bank address signals BA0 and BA1.

The number of the external address terminals (address input terminals) TA is set to the number of terminals needed at the time of fetching the X address or to the number of terminals needed at the time of fetching the Y address whichever is greater. Specifically, in the memory device 110 which has the X address set to M bits and the Y address set to N bits, the number of the external address terminals is set to M, for example, when M>N. The memory device 110 of the fifth embodiment has thirteen external address terminals to receive an X address of a maximum of 13 bits (including a row address and bank address).

Figure 30:
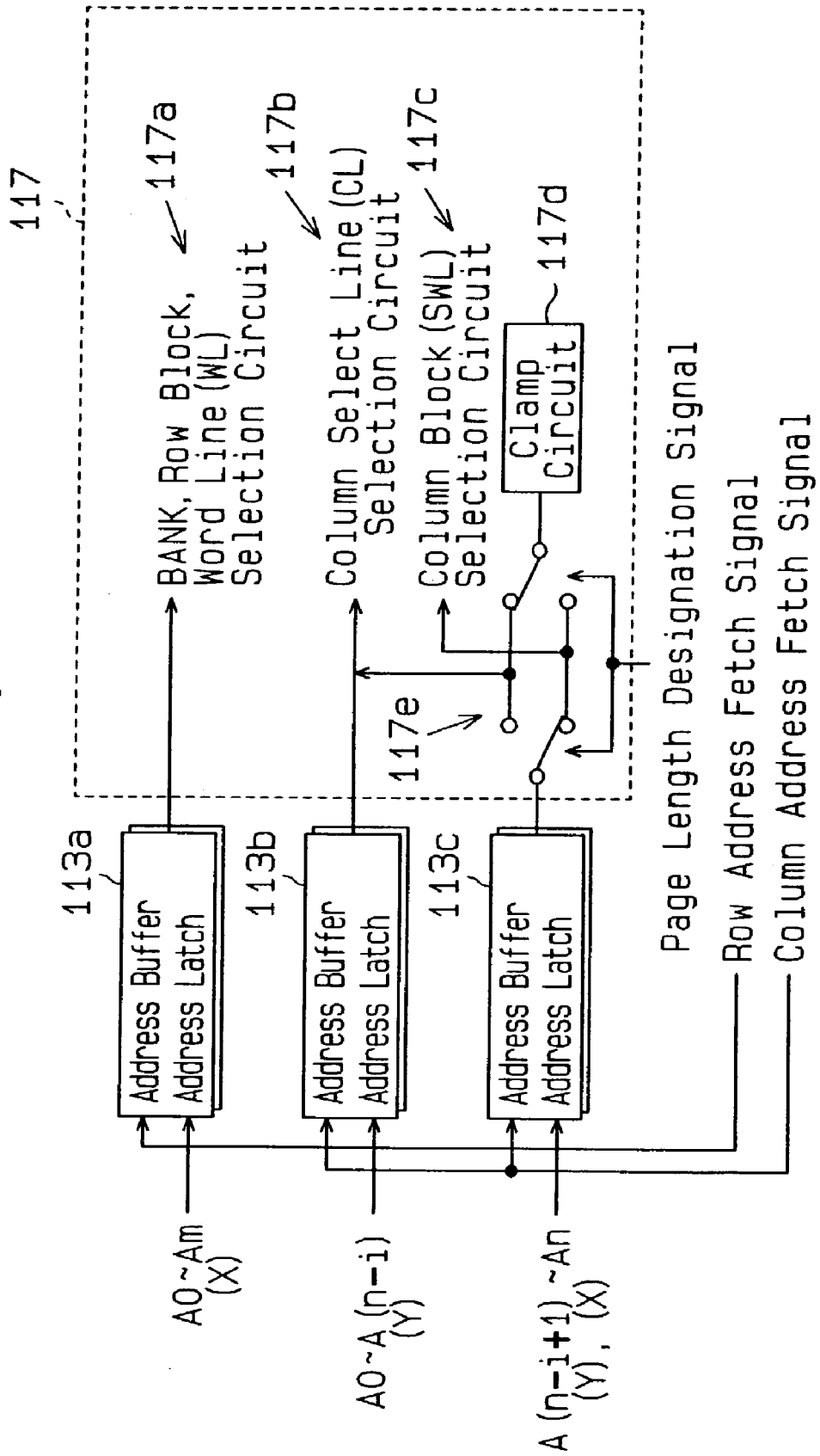
FIG. 30 is a schematic block diagram illustrating a control method for the memory device of the fifth embodiment.

FIG. 30 is a block diagram illustrating a control method for the memory device 110.

The following description is given on the assumption that M is the number of the external address input terminals, the X address when the page length is set to the maximum value (hereinafter referred to as "full page") by the page length designation signal ASS has M bits (XA<0:m>, (m=M−1)) and the Y address has N bits (YA<0:n>, (n=N−1)) where M>N. Although FIG. 30 shows the address buffer 113 functionally separated to first to third address buffer 113$a$ to 113$c$ for the sake of descriptive convenience, the address buffer 113 may be constructed unseparated.

Assume that a page length shorter than the full page is set in accordance with the page length designation signal ASS from the mode register 116 and X address signals which are incremented by the page length designation signal ASS have i bits. At this time, Y address signals are decremented by i bits. This is because the substantial capacity ($2^{M+N}$) of the memory cell array 121×the number of I/O does not change. The incremented i-bit X address signals are supplied from i external address terminals of the (M−N+i) external address terminals which become unnecessary at the time of fetching the Y address.

Specifically, the first address buffer 113$a$ receives address signals A0 to Am in accordance with an internal command (Row Address fetch signal in the diagram) from the command decoder 112. The first address buffer 113$a$ amplifies the received address signals A0–Am to generate X address data. The first address buffer 113$a$ latches the X address data and supplies the data to the address generation circuit 117.

The second address buffer 113$b$ receives address signals A0 to A(n−i) in accordance with an internal command (Column Address fetch signal in FIG. 30) from the command decoder 112. The second address buffer 113$b$ amplifies the received address signals A0 to A(n−i) to generate Y address data. The second address buffer 113$b$ latches the Y address data and supplies the data to the address generation circuit 117.

The third address buffer 113$c$ receives address signals A(n−i+1) to An in accordance with an internal command (Column Address fetch signal in FIG. 30) from the command decoder 112. The third address buffer 113c amplifies the received address signals A(n−i+1) to An to generate X address data or Y address data. The third address buffer 113c latches the X address data or Y address data and supplies the latched data to the address generation circuit 117.

The address generation circuit 117 includes first to third decoders (selection circuits in FIG. 30) 117a to 117c, a clamp circuit 117d and a switch circuit 117e.

The first decoder 117a selects a bank, a row block and a word line WL in accordance with the X address data supplied from the first address buffer 113a and supplies an X address corresponding to the selected bank, row block and word line WL to the DRAM core 119.

The second decoder 117b selects a column select line CL in accordance with the Y address data supplied from the second address buffer 113b and supplies a Y address corresponding to the selected column select line CL to the DRAM core 119.

The clamp circuit 117d invalidates arbitrary address data received to change the decoding compression rate. Although the address generation circuit 117 is designed to be functionally separated to the first to third decoders 117a to 117c in the fifth embodiment for the sake of descriptive convenience, the address generation circuit 117 may be constructed unseparated.

In case where a shorter page length than the full page is designated by the page length designation signal ASS, the switch circuit 117e is switched to a predetermined contact position by the page length designation signal ASS, connecting the third address buffer 113c to the third decoder 117c. The third decoder 117c selects a row block (specifically, a word line WL) in accordance with the X address data supplied from the third address buffer 113c and supplies the corresponding X address to the DRAM core 119.

The i-bit X address signals incremented by the page length designation signal ASS are supplied from i external address terminals of the (M−N+i) external address terminals which become unnecessary at the time of fetching the Y address. At the time of fetching the Y address, the second decoder 117b is connected to the clamp circuit 117d by the switch circuit 117e. The clamp circuit 117d invalidates unnecessary Y address signals. Specifically, the voltages of unnecessary input terminals of the second decoder 117b, for example, are fixed to a predetermined level.

In case where the full page is designated by the page length designation signal ASS, the third address buffer 113c is connected to the second decoder 117b. The second decoder 117b selects a column select line CL in accordance with the Y address data supplied from the third address buffer 113c and supplies the Y address corresponding to the selected column select line CL to the DRAM core 119. At this time, the clamp circuit 117d is connected to the third decoder 117c and invalidates an X address which becomes unnecessary at the time of fetching a Y address. Specifically, the voltages of the input terminals of the third decoder 117c, for example, are fixed to a predetermined level.

Figure 31:
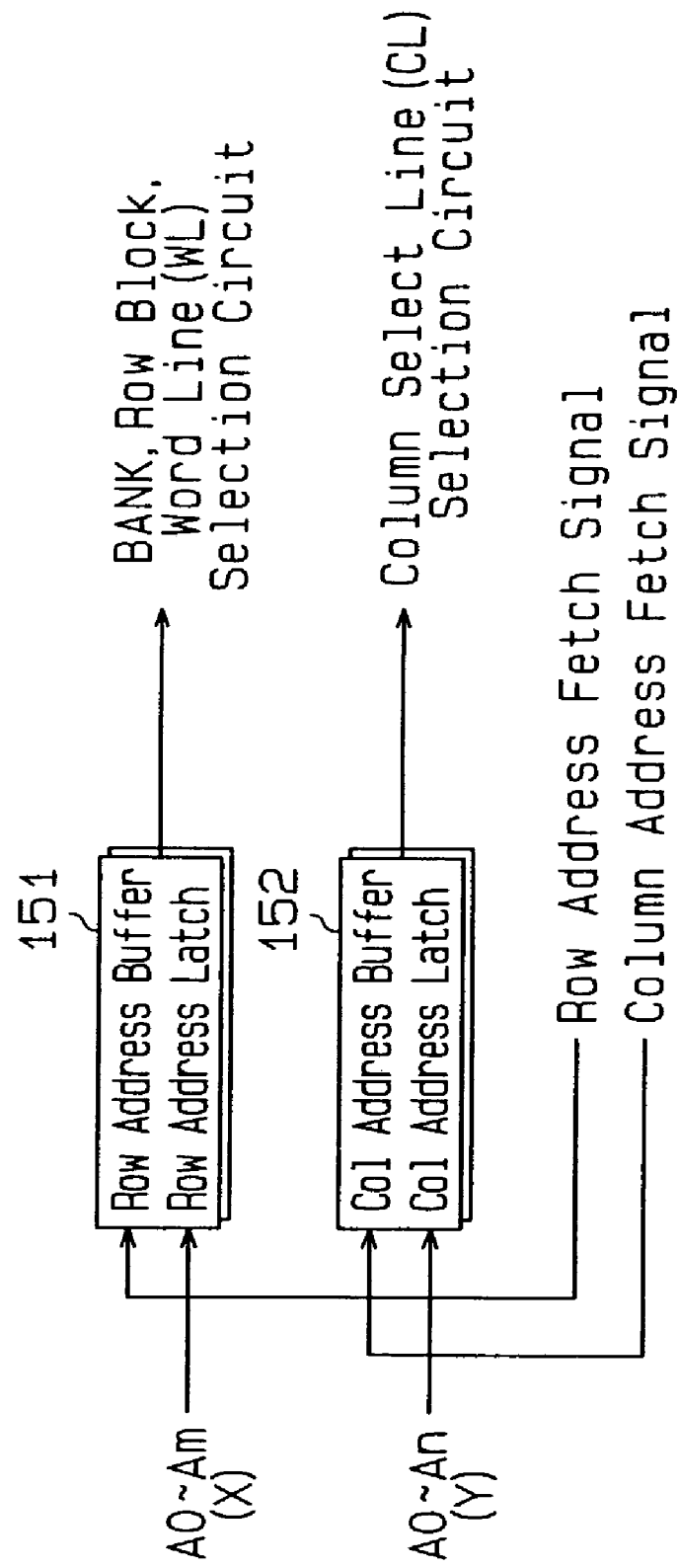
FIG. 31 is a schematic block diagram illustrating a control method for the conventional memory device.

For the purpose of comparison, a block diagram illustrating a control method for the conventional memory device is illustrated in FIG. 31. According to the prior art, an address buffer 151 for receiving an X address and an address buffer 152 for receiving a Y address are provided. At the time the page length in use is made shorter, the number of the external address terminals (M or N) is increased in accordance with the number of the bits of the X address or Y address that is increased then.

Figure 32:
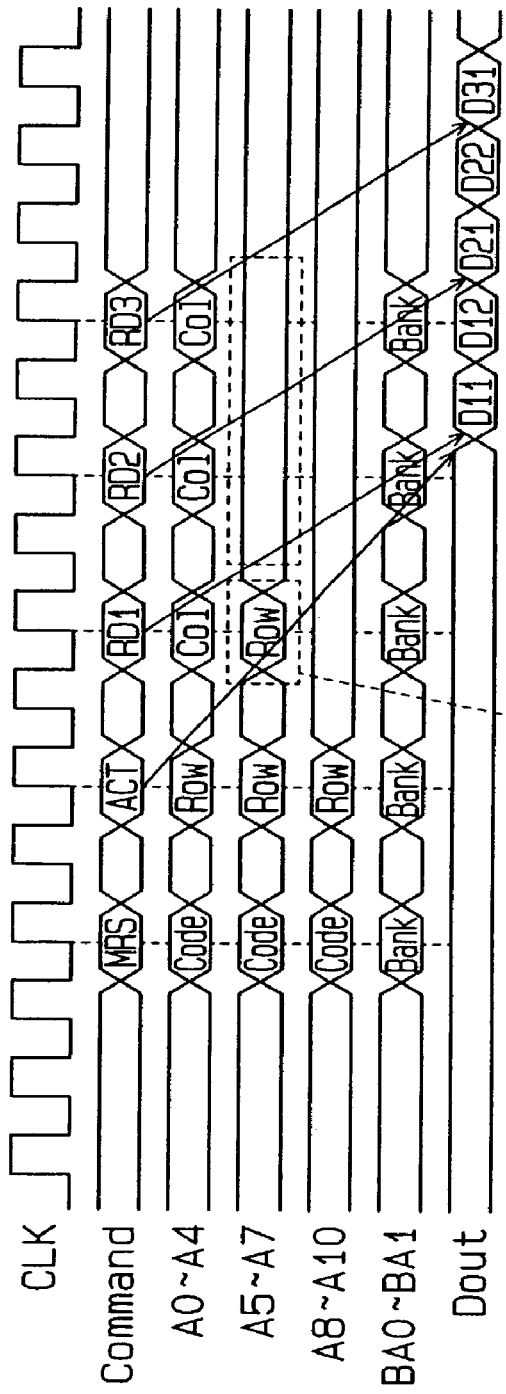
FIG. 32 is a waveform diagram illustrating the internal operation of the memory device in FIG. 28.

FIG. 32 is a waveform diagram illustrating the internal operation of the memory device 110 of the fifth embodiment. The illustrated operational waveform diagram is given for, for example, a 64-Mbit (megabits) SDRAM (32 I/O).

In the initial state, the memory device 110 has a logical address map formed by an 11-bit X address signal XA<0:10> and an 8-bit Y address signal YA<0:7> and has a page length set to 256 (full page).

The memory device 110 receives the address signals A0–A10 as an address code Code (CodeA<0:10>) and the bank address signal BA<0:1> in response to the mode-register setting command MRS. The memory device 110 performs various kinds of settings, such as the page length Page, CAS latency tCL and burst length BL, in accordance with an address code ACD<0:10>.

When the CAS latency tCL=3, burst length BL=2 and page length Page=32 are set, the logical address map is formed by a 14-bit X address signal XA<0:14> and 5-bit Y address signal YA<0:4<. As the page length is changed, the X address signal XA is increased by 3 bits.

The memory device 110 receives the address signals A0–A10 as the X address signal XA<0:10> and the bank address signal BA<0:1> in response to the activation command ACT. As the fetching of the bank address signal BA is the same thereafter, its description will be omitted.

The page length (=32) may be set when the activation command ACT is inputted. In this case, the number of the bits of the X address signal XA is decreased by the number of the bits needed to set the page length. In case where two bits are required to set the page length, for example, the memory device 110 fetches the address signals A0–A8 as the X address signal XA<0:8> and receives the address signals A9 and A10 as setting information. Alternatively, the address signals may be fetched from other pins (such as the DQ mask pin) which are not used when the activation command ACT is inputted.

Next, the memory device 110 fetches the address signals A0–A4 as the Y address signal YA<0:4> and the address signals A6–A8 as the X address signal XA<11:13> in response to a read command RD1 which is inputted when a predetermined number of clocks (e.g., two clocks) after the inputting of the activation command ACT.

The 3-bit X address signal (address change signal) XA<11:13> which increases with a change in page length is supplied from the external address terminals which are unnecessary at the time of fetching the Y address signal YA<0:4> when the read command RD1 is inputted.

The memory device 110 selects a column block (sub word line SWL) in accordance with the X address signal XA<11:13> and enables the sense amplifiers S/A that belong to the selected column block.

The memory device 110 may fetch the address signals A0–A10 as the X address signal XA<3:13> in response to the activation command ACT and receive the address signals A6–A8 as the X address signal XA<0:2> in response to the read command RD1. The address signals A6–A8 may be received at given bit positions of the X address signal XA in response to the read command RD1.

When receiving the read command RD1, the memory device 110 sequentially outputs read data D11 and D12 in accordance with the set CAS latency tCL (=3) and burst length BL (=2) after three clocks since the inputting of the read command RD1.

Thereafter, the memory device 110 receives the Y address signal YA<0:4> and the bank address BA<0:1> in order in response to read commands RD2 and RD3. At this time, the second and third read commands RD2 and RD3 do not cause the increased X address signal XA<11:13> to be fetched and cause only the Y address signal YA<0:4> and bank address BA<0:1> to be supplied.

Although the foregoing description of the fifth embodiment has been given of the read commands RD1 to RD3, the same is applied in the case of write commands. In response to the first write command after the inputting of the activation command ACT, the increased X address signal XA<11:13> is supplied. In response to the second or later write commands, only the Y address signal YA<0:4> and bank address BA<0:1> are supplied.

Figure 33:
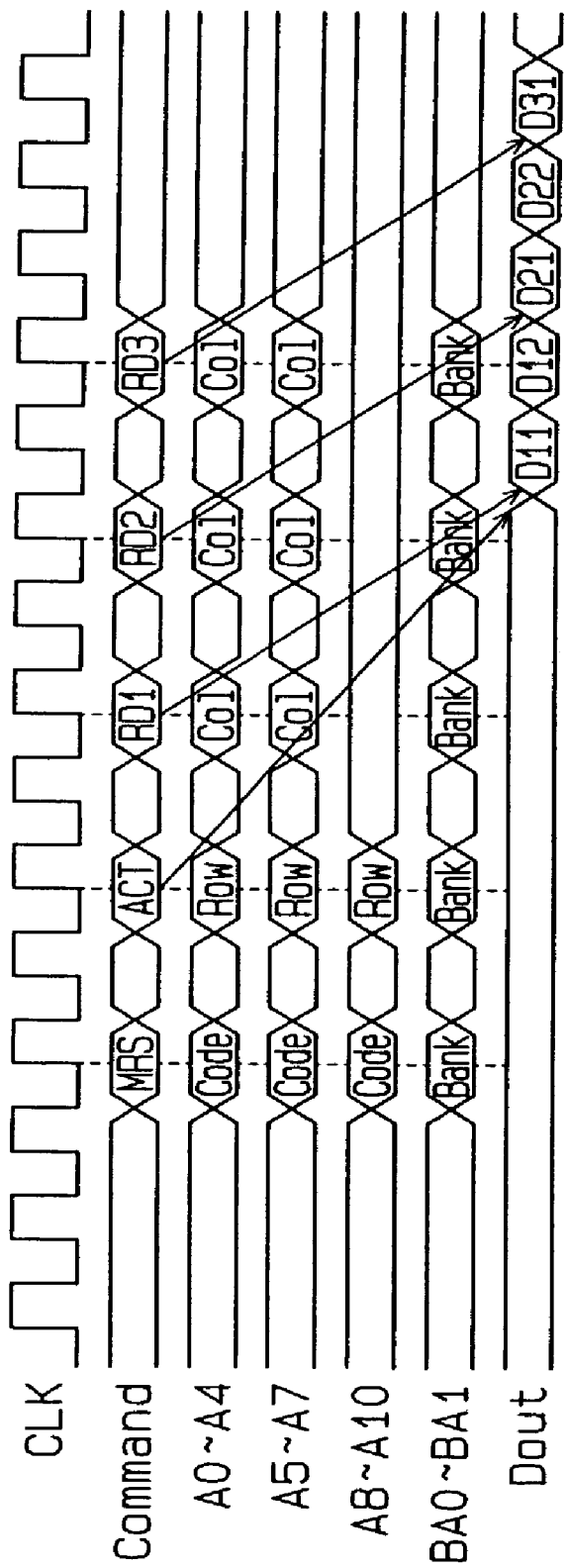
FIG. 33 is a waveform diagram illustrating the internal operation of the conventional memory device.
Figure 34:
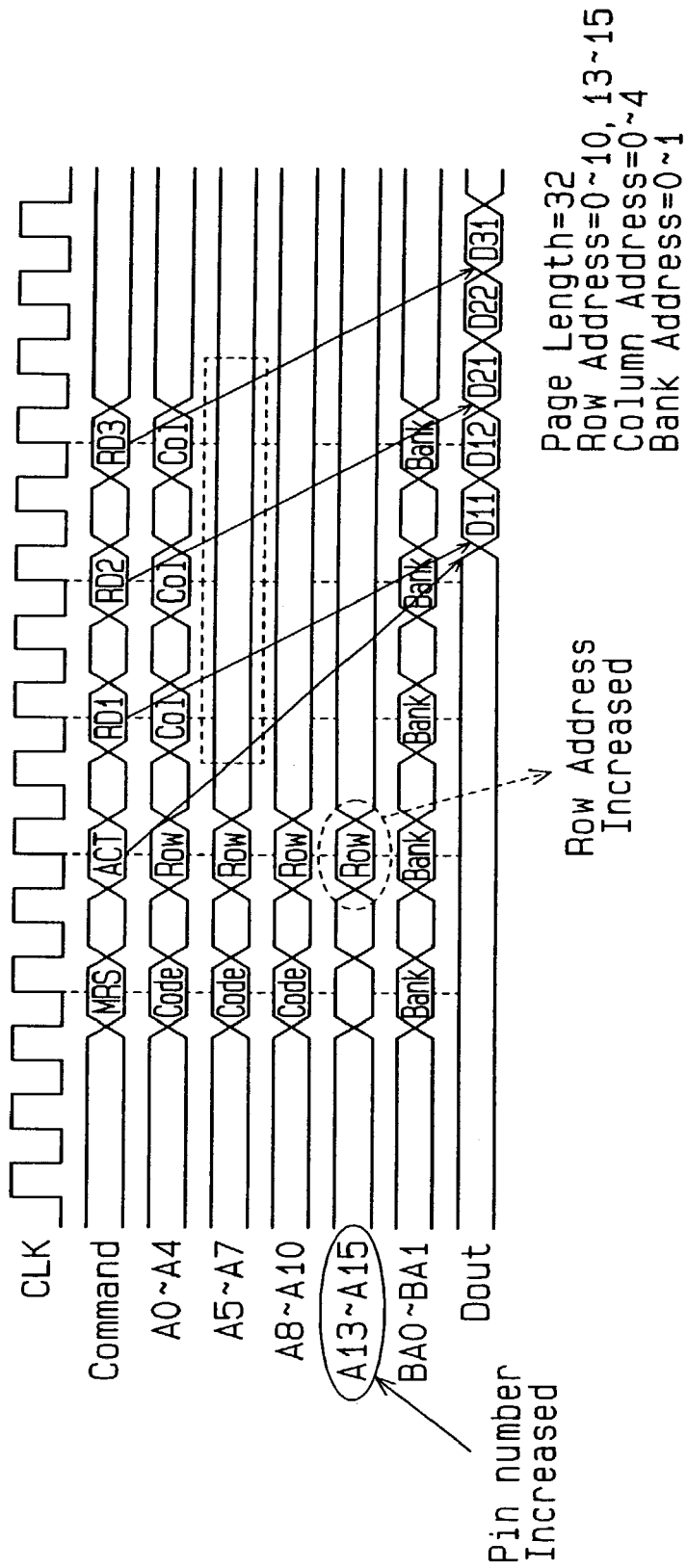
FIG. 34 is a waveform diagram illustrating the internal operation of the conventional memory device when a page length is changed.

For the purpose of comparison, waveform diagrams illustrating the internal operation of the conventional memory device are illustrated in FIGS. 33 and 34.

FIG. 33 is an operational waveform diagram for a 64-Mbit SDRAM in case where the page length PL is set to 256 (full page). As shown in FIG. 33, the memory device receives the X address signal XA<0:10> in response to the activation command ACT after the mode-register setting command MRS is inputted. Then, the memory device receives the Y address signal YA<0:7> sequentially in response to the read commands RD1–RD3.

FIG. 34 is an operational waveform diagram for a 64-Mbit SDRAM in case where the page length PL is set to 32. In case where a shorter page length (=32) is used, as shown in FIG. 34, the number of the bits of the X address signal XA is increased by 3 bits. The memory device fetches the address signals $A_0$–A10 as the X address signal XA<0:10> and receives the address signals A13–A15 as an increased X address signal XA<11:13> in response to the activation command ACT. According to the prior art, therefore, the memory device whose page length is set short (=32) undesirably requires that the number of the external address terminals is increased to receive the increased 3-bit X address signal XA as compared with a standard memory device.

Figure 35:
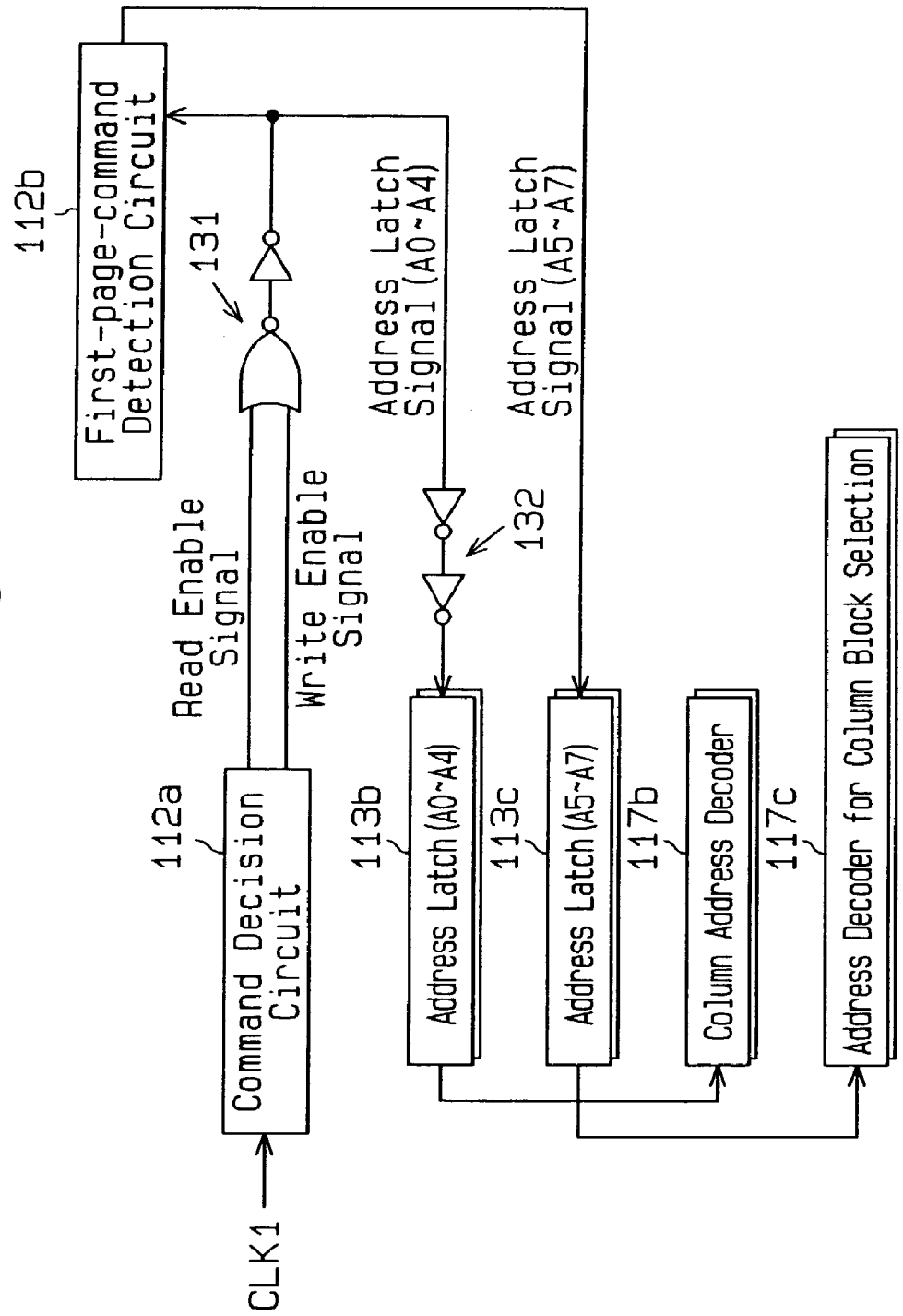
FIG. 35 is a block diagram illustrating access control for the memory device in FIG. 28.

FIG. 35 is a block diagram illustrating access control after the activation command ACT in FIG. 32 is issued. The command decoder 112 (see FIG. 28) includes a command decision circuit 112a and a first-page-command detection circuit (hereinafter simply referred to as "command detection circuit") 112b which detects the first enable signal supplied from the command decision circuit 112a. In the fifth embodiment, the enable signal enables the sub word lines SWL and the sense amplifiers S/A.

The command decision circuit 112a determines a read command and write command in various decoded commands in response to the internal clock signal CLK1 and generates a read enable signal or a write enable signal in accordance with the result of the decision.

When the read command RD1 shown in FIG. 32 is inputted, the command decision circuit 112a generates the read enable signal.

The second address buffer (Address Latch) 113b receives the address signals A0–A4 in response to the read enable signal (read command RD1) that is supplied via an OR gate 131 and a delay circuit 132. The second address buffer 113b supplies Y address data included in the address signals A0–A4 to the second decoder (Column Address Decoder) 117b.

The third address buffer (Address Latch) 113c receives the address signals A5–A7 in accordance with a detection signal supplied from the command detection circuit 112b in response to the first read enable signal (read command RD1), supplied via the OR gate 131 to the command detection circuit 112b. The third address buffer 113c supplies X address data included in the address signals A5–A7 to the third decoder (Address Decoder for Column Block Selection) 117c.

The second decoder 117b selects a column select line CL in accordance with the Y address data supplied from the second address buffer 113b.

The third decoder 117c selects a column block and a sub word line SWL in accordance with the X address data supplied from the third address buffer 113c. At this time, the sub word line and those sense amplifiers S/A which are associated with the selected column block are enabled.

The command detection circuit 112b detects only the first read enable signal (read command RD1) output from the command decision circuit 112a and generates a detection signal. In accordance with the detection signal from the command detection circuit 112b, an extended X address signal XA<11:13> (address signals A5–A7) is held in the third decoder 117c.

With the second read enable signal (read command RD2) shown in FIG. 32), the command detection circuit 112b does not generate a detection signal. In response to the second and subsequent read commands RD2 and RD3, therefore, the address signals A5–A7 are not fetched into the third address buffer 113c.

Figure 36:
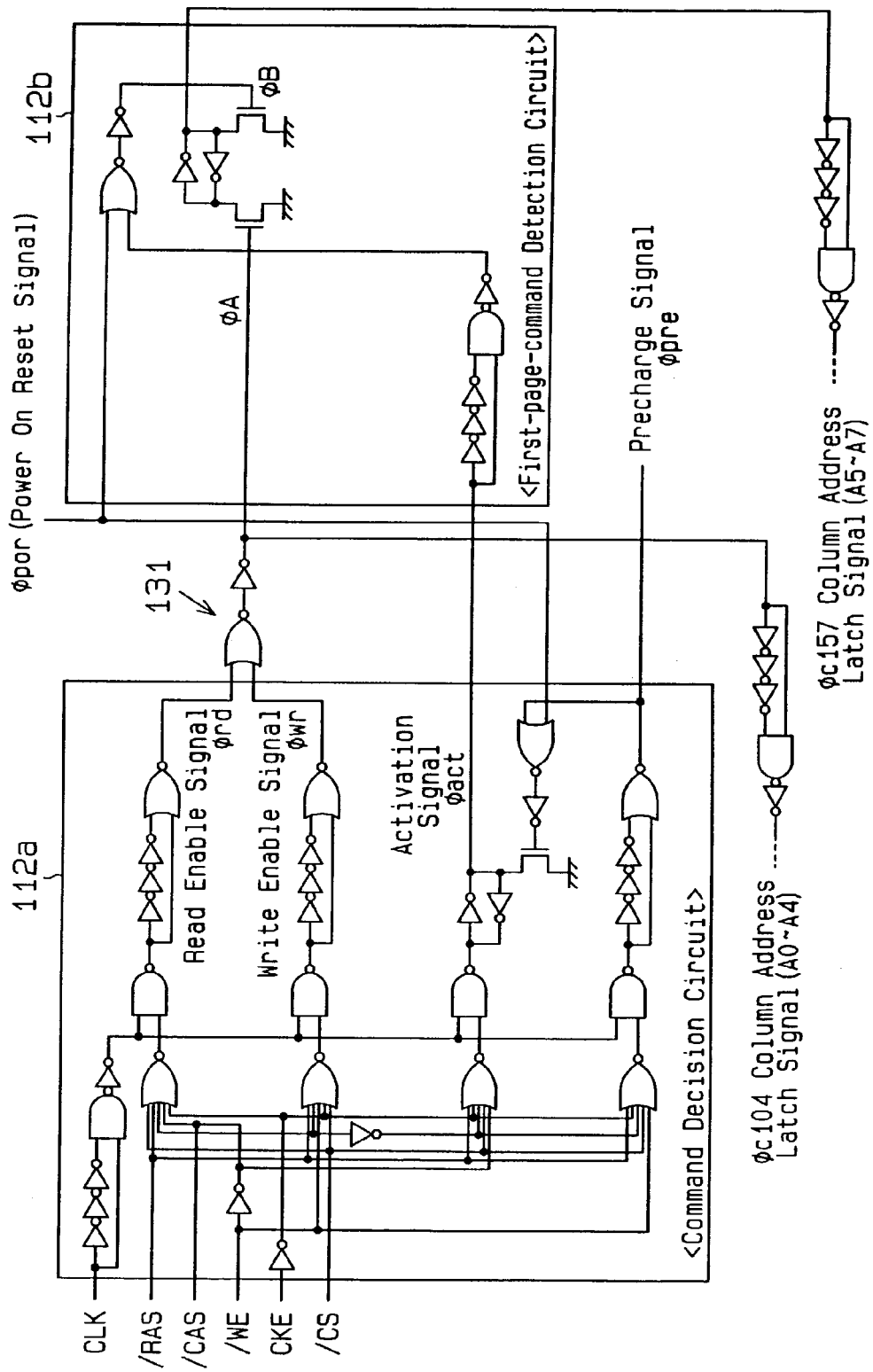
FIGS. 36 and 37 are schematic circuit diagrams showing a specific example of the structure in FIG. 35.
Figure 37:
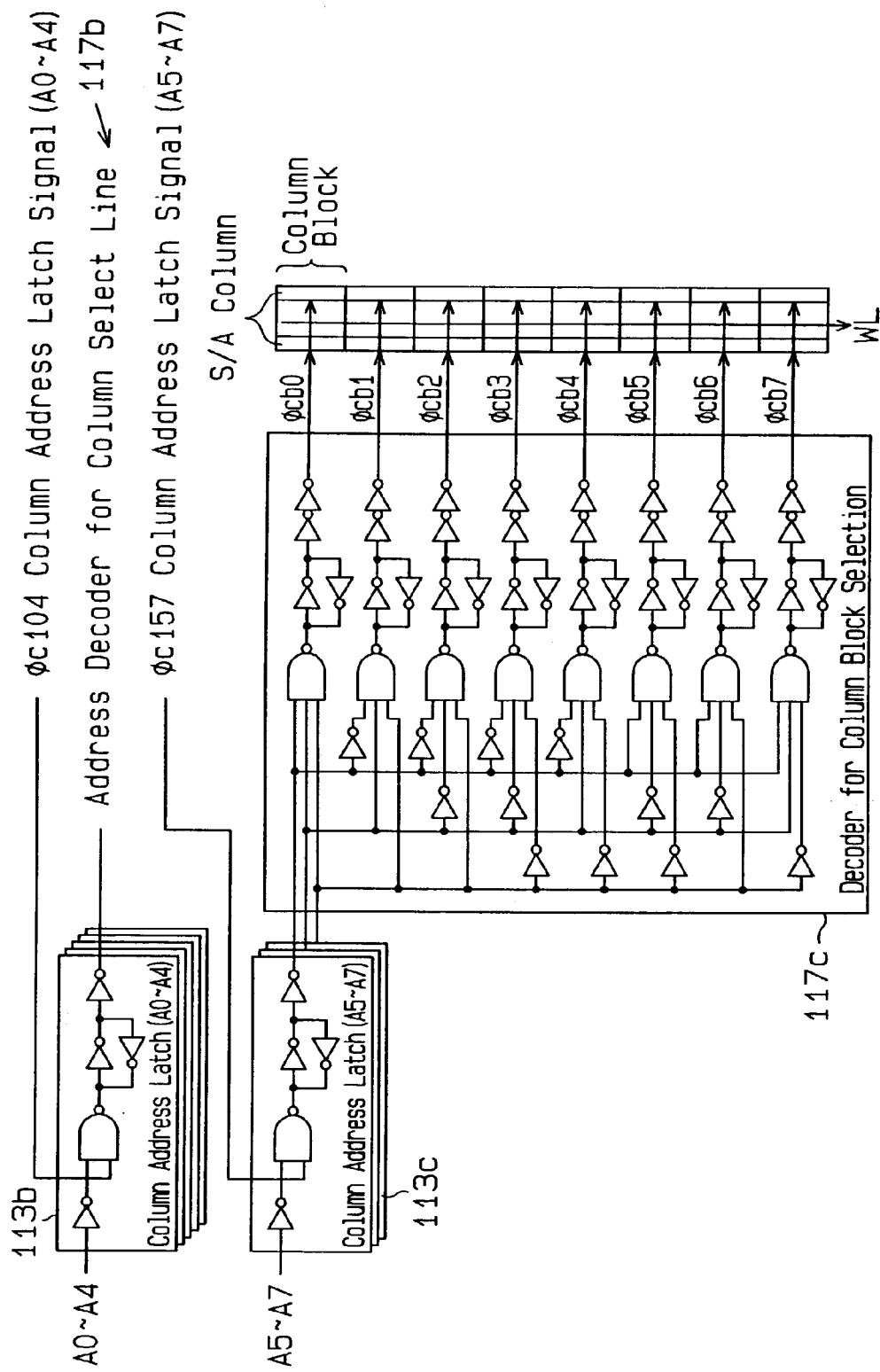
Figure 38:
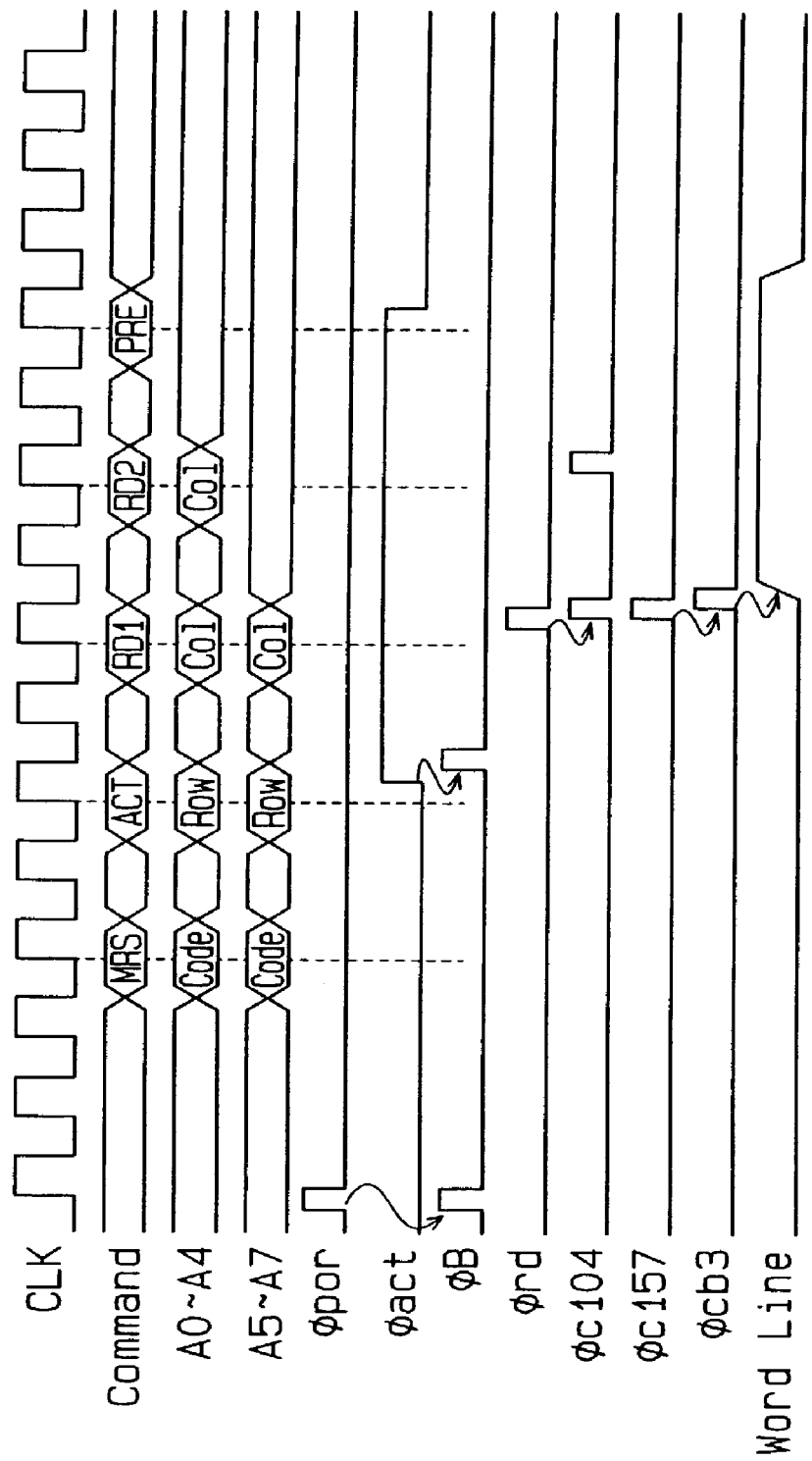
FIG. 38 is a waveform diagram illustrating the internal operations of the structures in FIGS. 36 and 37.

FIGS. 36 and 37 are circuit diagrams showing a specific example of the circuit structure in FIG. 35. FIG. 38 is a waveform diagram illustrating the internal operations of the circuits shown in FIGS. 36 and 37.

Figure 39:
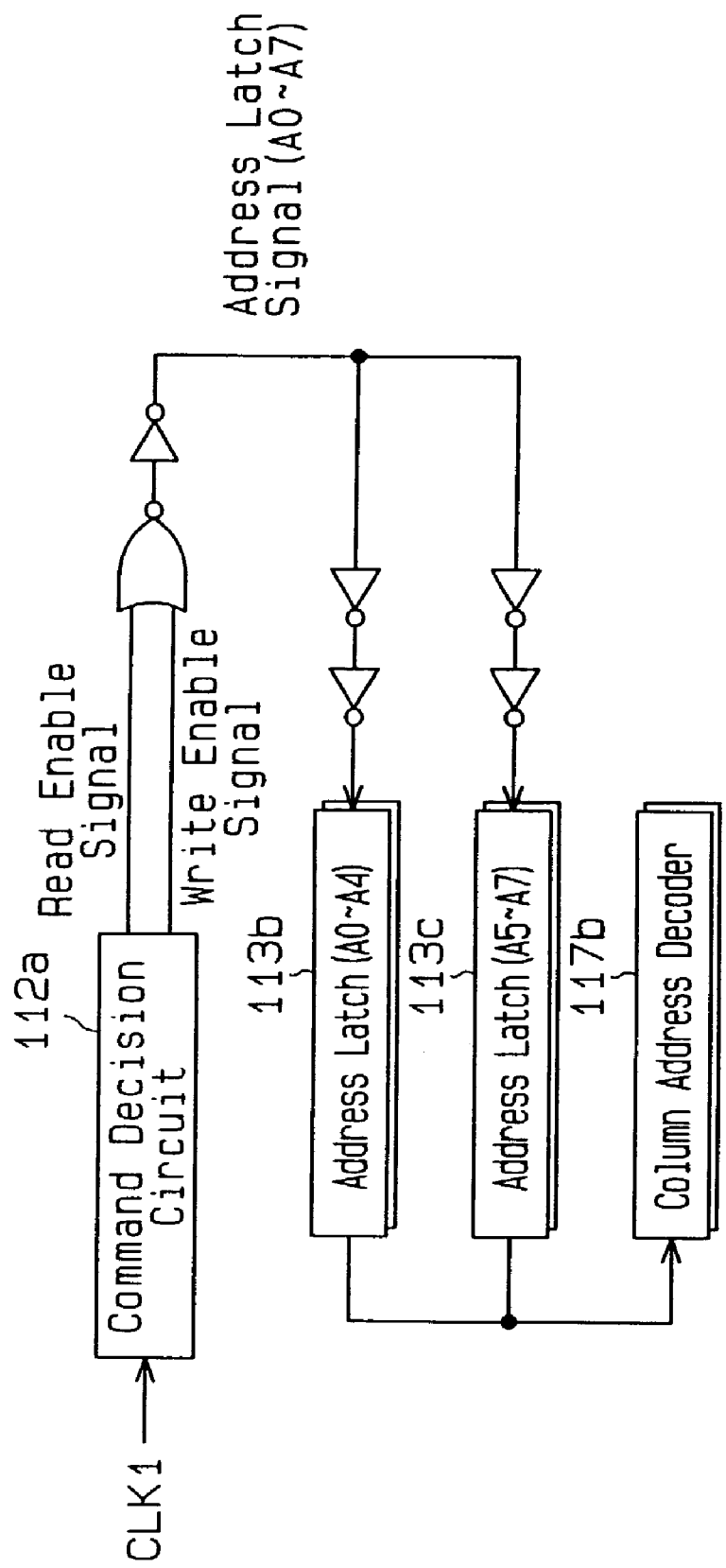
FIG. 39 is a schematic block diagram illustrating the conventional access control.

For the purpose of comparison, a block diagram illustrating the conventional access control method is illustrated in FIG. 39. According to the prior art, as shown in FIG. 39, because of the page length being 256, the Y address signal YA<0:4> and the Y address signal YA<5:7> are supplied every time a read or write enable signal (i.e., a read or write command) is outputted.

Figure 40:
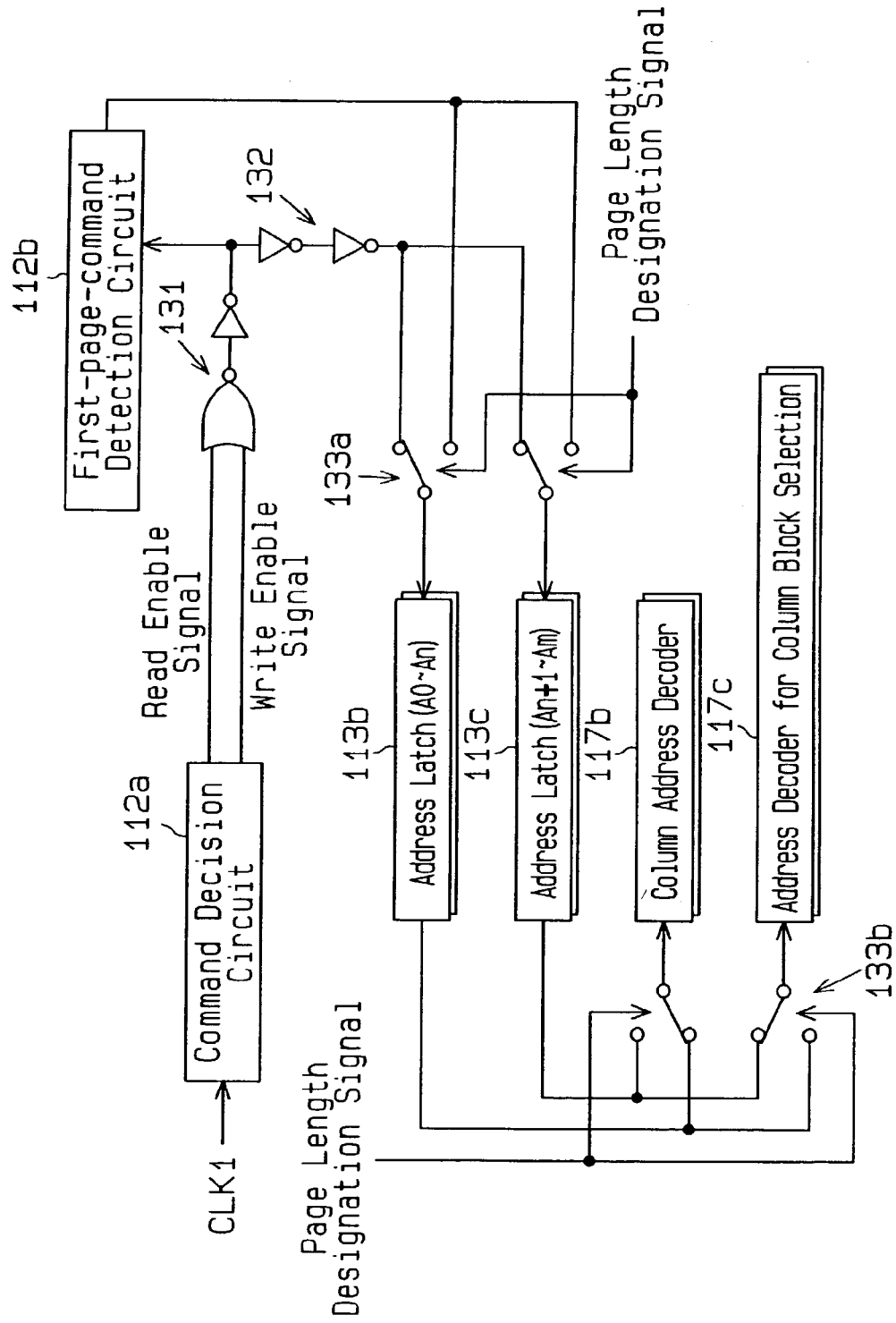
FIG. 40 is a schematic block diagram illustrating access control according to the page length of the memory device in FIG. 28.

FIG. 40 is a block diagram illustrating a case where the access control that has been discussed referring to FIG. 35 is carried out in accordance with the page length.

As the contact position of each switch circuit 133a, 133b is switched in accordance with the page length designation signal ASS, the address signals that are latched in the second and third address buffers 113b and 113c can be changed adequately in accordance with the page length. The second and third decoders 117b and 117c supply the DRAM core 119 with the X address and Y address that have been generated in association with the from-moment-to-moment logical address map (page length) of the DRAM core 119.

Figure 41:
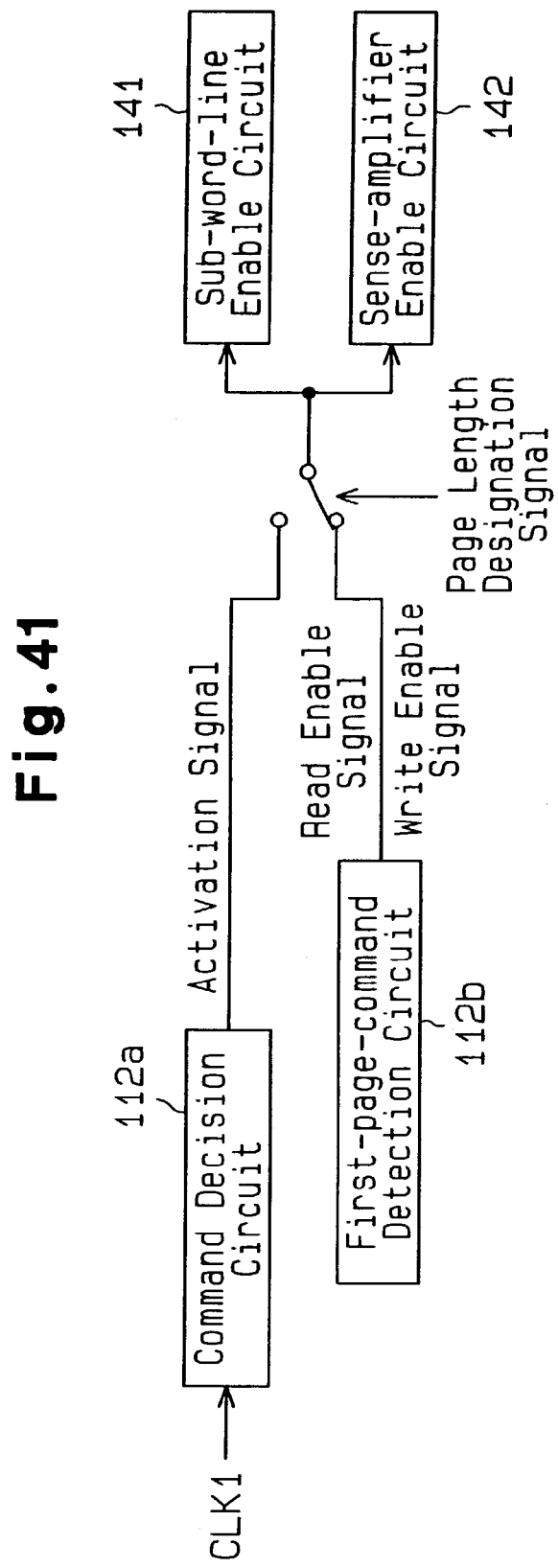
FIG. 41 is a schematic block diagram illustrating a control method for a circuit which enables the memory device in FIG. 28.

FIG. 41 is a schematic block diagram illustrating control to enable a sub word line SWL and sense amplifiers S/A.

As shown in FIG. 41, a sub-word-line enable circuit 141 and a sense-amplifier enable circuit 142 respectively enable a sub word line SWL and sense amplifiers S/A in response to a single output signal of one of the command decision circuit 112a and the command detection circuit 112b which is supplied in response to the page length designation signal ASS.

Specifically, in case where the page length PL is set to the full page by the page length designation signal ASS, the enable circuits 141 and 142 respectively enable a sub word line SWL and sense amplifiers S/A in response to an activation signal (activation command) from the command decision circuit 112a. This is because all the bits of the X address signal XA needed to select a word line WL and sense amplifiers S/A are prepared at the time the activation command is received.

In case where the page length PL is set shorter than the full page by the page length designation signal ASS, the enable circuits 141 and 142 respectively enable a sub word line SWL and sense amplifiers S/A associated with the sub word line SWL in response to the detection signal from the detection circuit 112b, i.e., the read or write enable signal (read or write command). The selection of a sub word line SWL and sense amplifiers S/A to be enabled requires the X address signal that is received from the activation command and the X address signal that is received from the page command.

Figure 42:
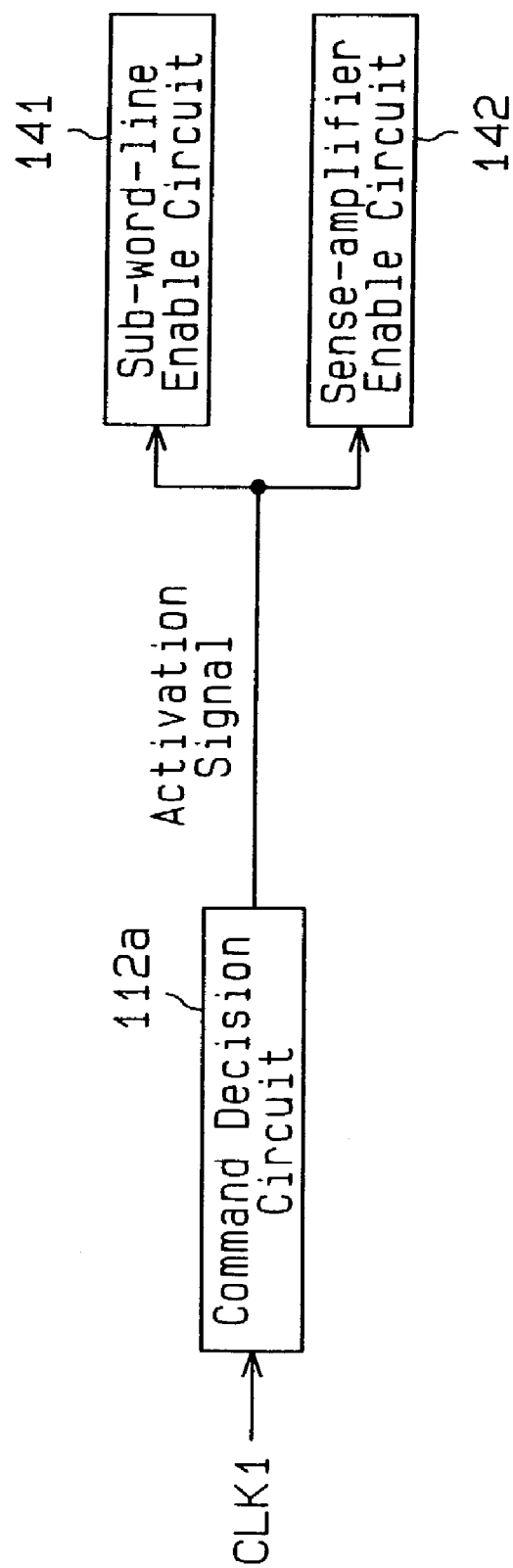
FIG. 42 is a schematic block diagram illustrating a control method for the conventional enable circuit.

For the purpose of comparison, a block diagram illustrating a control method for the conventional enabling circuit is illustrated in FIG. 42. According to the prior art, as shown in FIG. 42, the enable circuits 141 and 142 respectively enable a sub word line SWL and sense amplifiers S/A only in response to the activation signal from the command decision circuit 112a.

The memory device 110 according to the fifth embodiment has the following advantages.

(1) In case where the page length is set shorter than the full page, to change the logical address map of the DRAM core 119, the X address signal XA which is incremented is supplied to the memory device 110 when the first read command RD1 is inputted. Because the X address signal XA which is incremented is supplied in a time divisional fashion using unused external address terminals at this time, the page length can be changed without changing the number of the external address terminals and the layout thereof. In case of changing the logical address map of the DRAM core 119, therefore, a general-purpose package can be used. This can suppress an increase in the developing period of the memory device and a cost increase.

(2) Because the page length can be changed without changing the package of the memory device, an efficient access method according to the system of a client that uses the memory device can be achieved.

(3) Changing the page length can reduce the number of the sense amplifiers S/A enabled to the minimum required. This can held reducing the current consumption of the memory device.

The fifth embodiment may be modified in the following forms.

The clamp circuit 117d may be provided separately from the address generation circuit 117.

Figure 43:
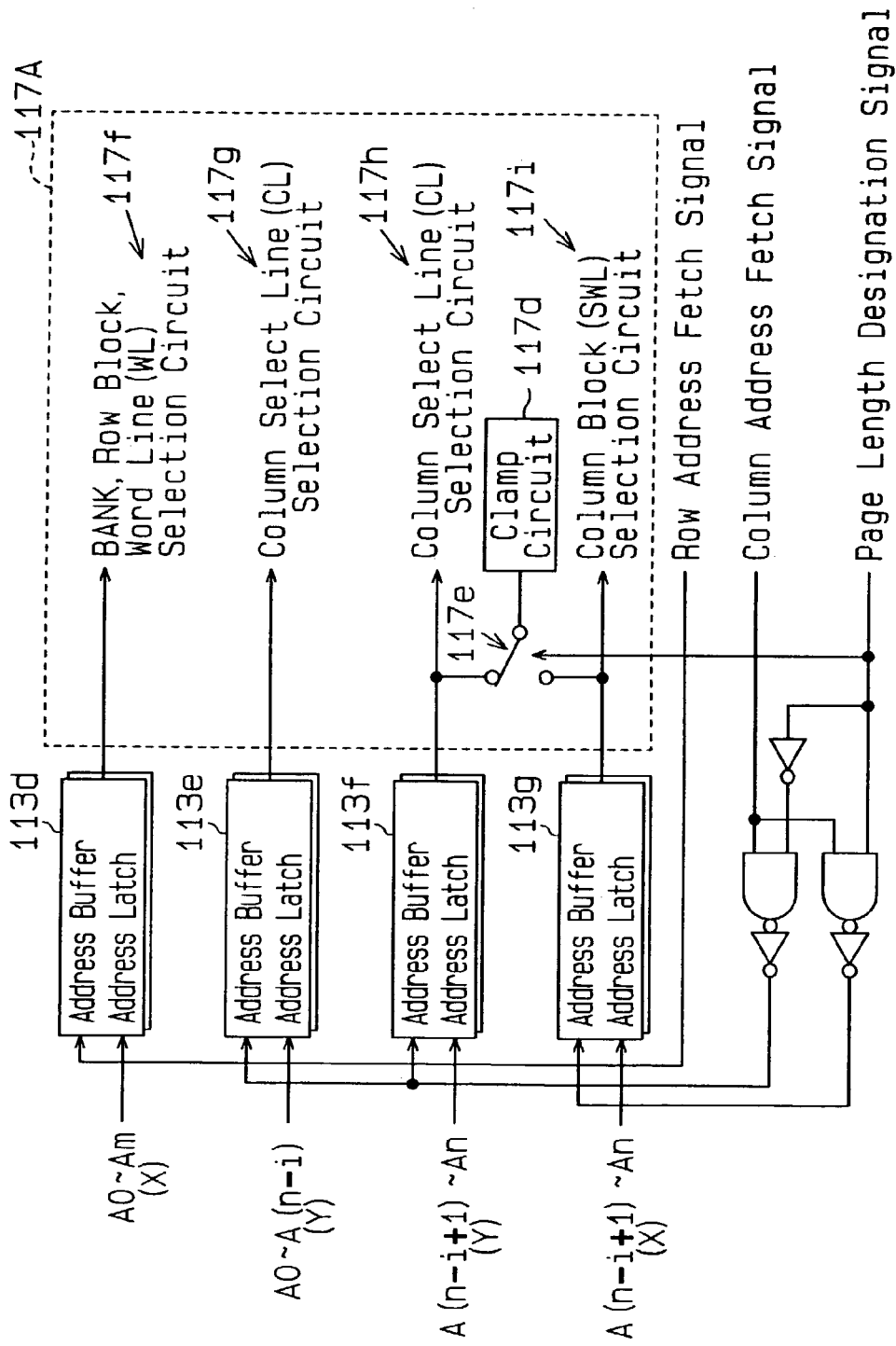
FIGS. 43 to 45 are schematic block diagrams illustrating another control method for the memory device in FIG. 28.

The structure in FIG. 30 may be modified to the structure shown in FIG. 43 in which special address buffers 113f and 113g may be provided respectively for separately receiving a Y address signal and X address signal according to the address signals A(n−i+1) to An.

Figure 44:
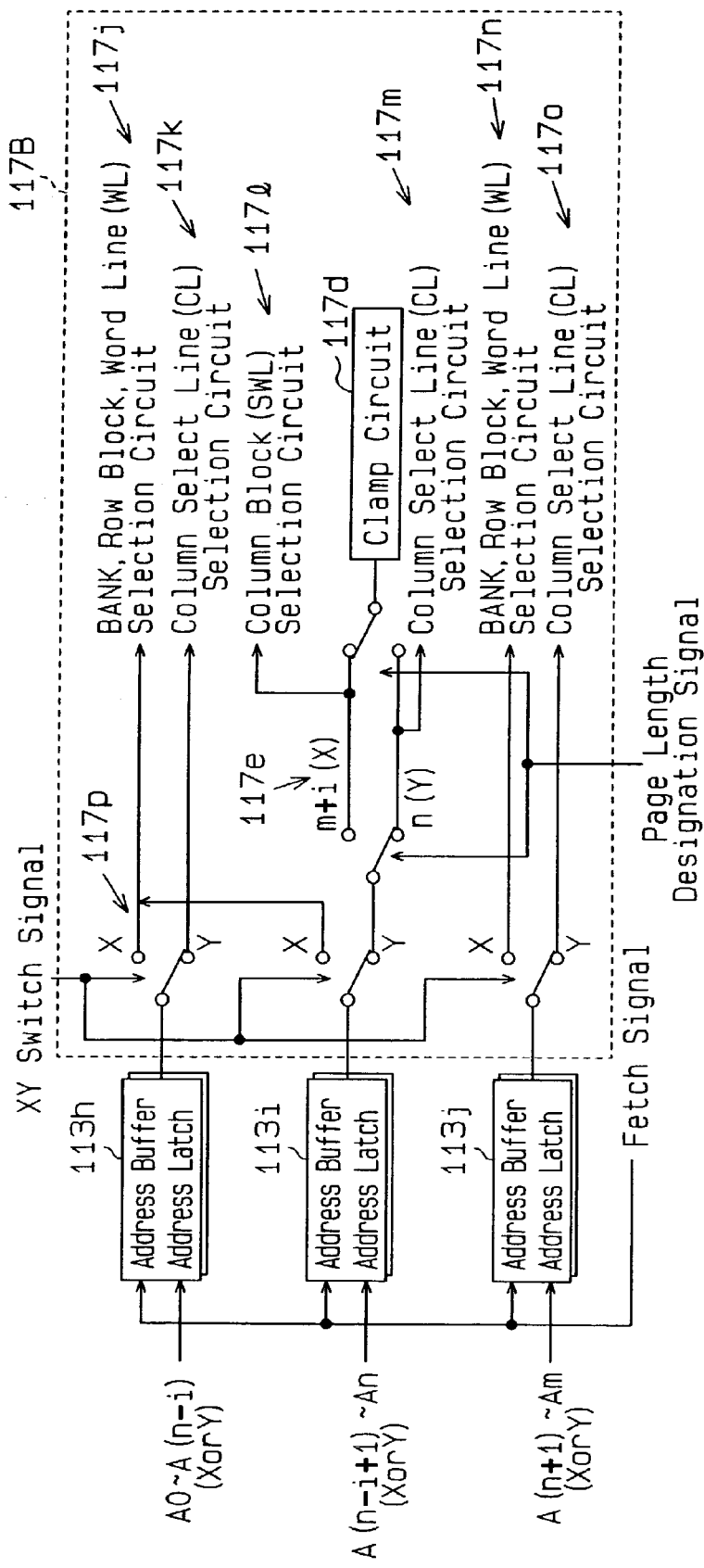

The structure in FIG. 30 may be modified to the structure shown in FIG. 44. In this case, individual address buffers 113h to 113j share an address buffer for receiving the X address signal or Y address signal. The output signal (X address data or Y address data) of each of the address buffers 113h to 113j is selected adequately by an XY switch signal.

Figure 45:
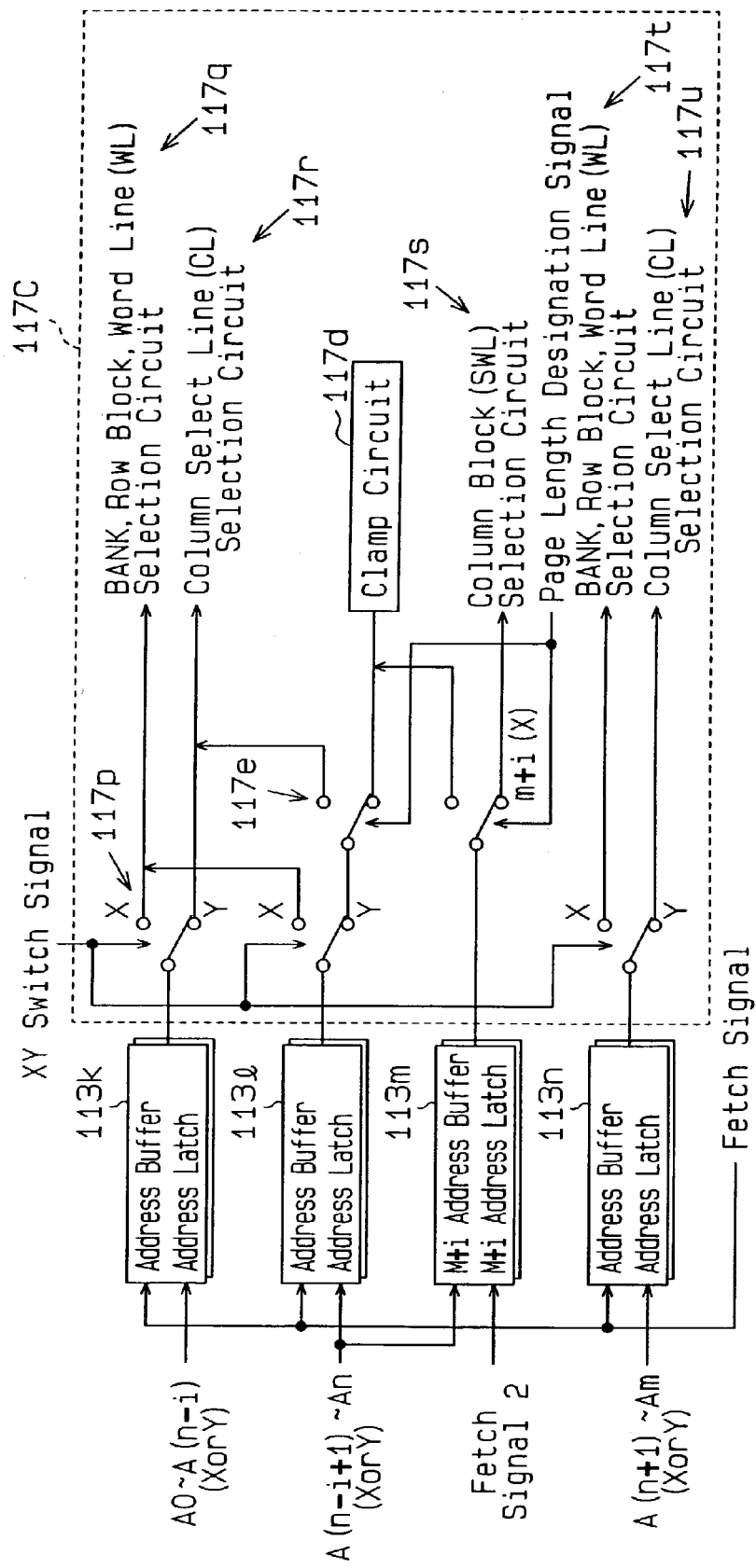

The structure in FIG. 30 may be modified to the structure shown in FIG. 45. In this case, individual address buffers 113k, 113l and 113n share an address buffer for receiving the X address signal or Y address signal. An address buffer 113m which receives only that address signal (X address signal) which is incremented in accordance with a change in page length may be provided separately.

In case where the memory device is of an asynchronous type, the command decision circuit 112a and command detection circuit 112b in FIG. 35 may be replaced with other structures that do not depend on the clock signal CLK1.

Figure 46:
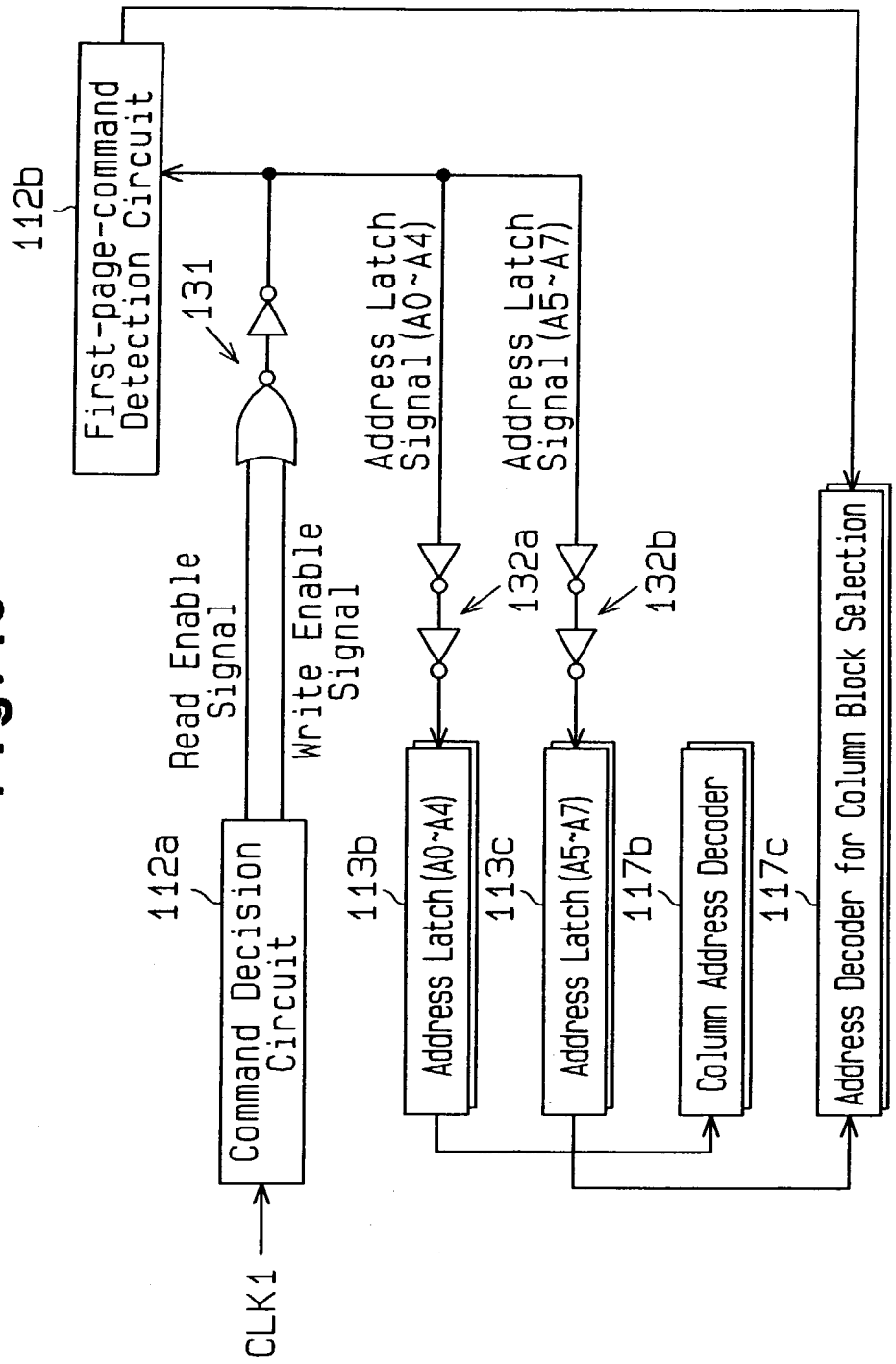
FIG. 46 is a block diagram showing another structure of the circuit in FIG. 35.
Figure 47:
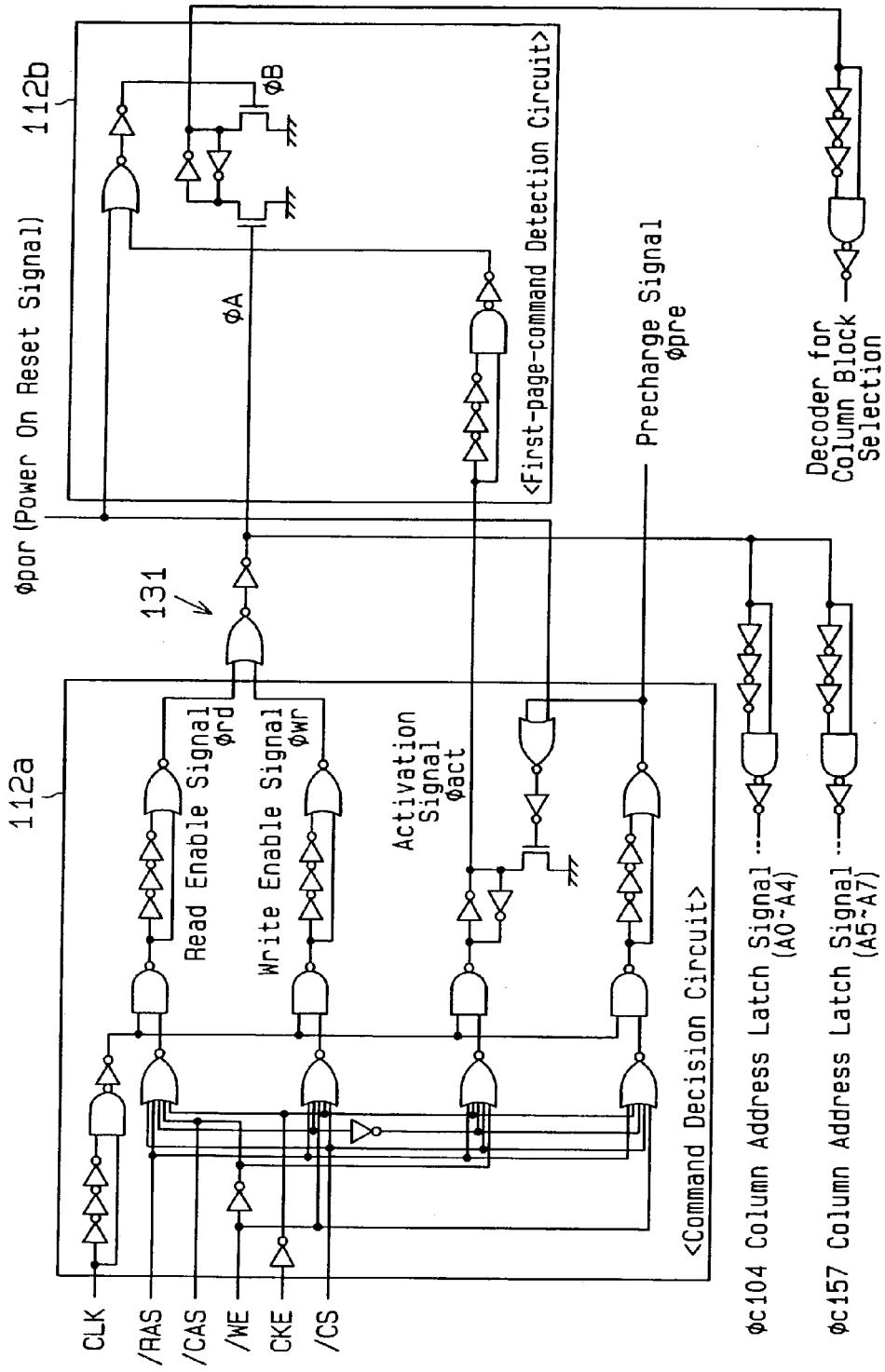
FIGS. 47 and 48 are circuit diagrams showing a specific example of the structure in FIG. 46.
Figure 48:
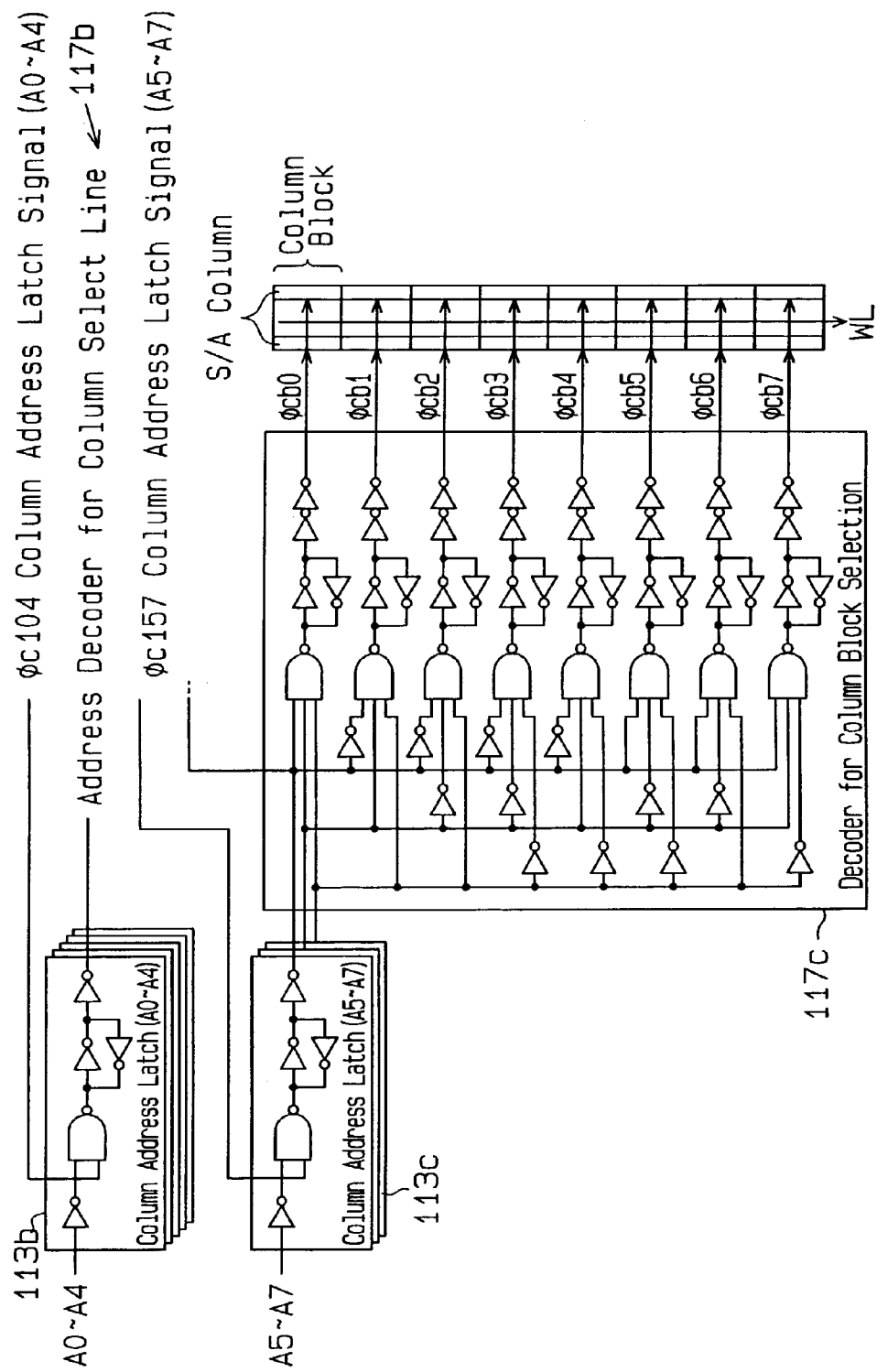

The structure in FIG. 35 may be modified as shown in FIG. 46. The third address buffer 113c receives the address signals A5–A7 every time the read/write enable signal (i.e., read/write command) from the command decision circuit 112a is inputted. With regard to the second or later read/write command, the third decoder 117c may be designed not to latch the X address data from the third address buffer 113c again in accordance with the detection signal from the command detection circuit 112b. FIGS. 47 and 48 are circuit diagrams showing a specific example of the circuit structure in FIG. 46.

Figure 49:
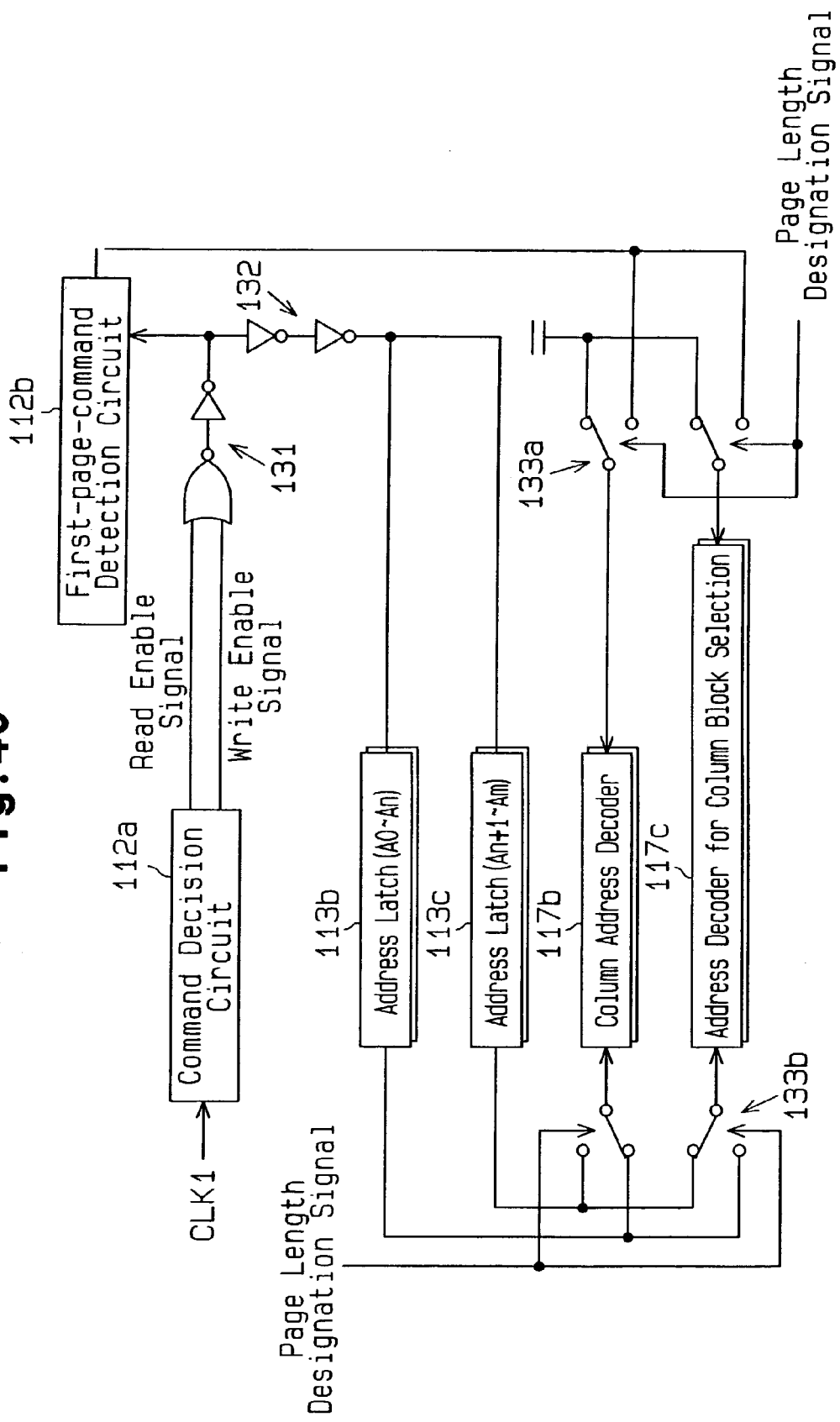
FIG. 49 is a block diagram illustrating access control according to the page length.

FIG. 49 shows a case where address control which is executed by the structure in FIG. 46 is executed in accordance with the page length PL. In this case, the contact positions of the switch circuits 133a and 133b are switched by the page length designation signal ASS. Therefore, the X address and Y address are generated in association with the logical address map that has a predetermined page length PL and are respectively output from the second and third decoders 117b and 117c.

In FIG. 41, only the sense-amplifier (S/A) enable circuit 142 may be controlled.

The sixth embodiment of the invention will now be described.

The sixth embodiment is directed to another control method for fetching an X address which increases in accordance with a change in page length in case where the page length PL is changed to 32 from 256 using the memory device 110 of the fifth embodiment.

Figure 50:
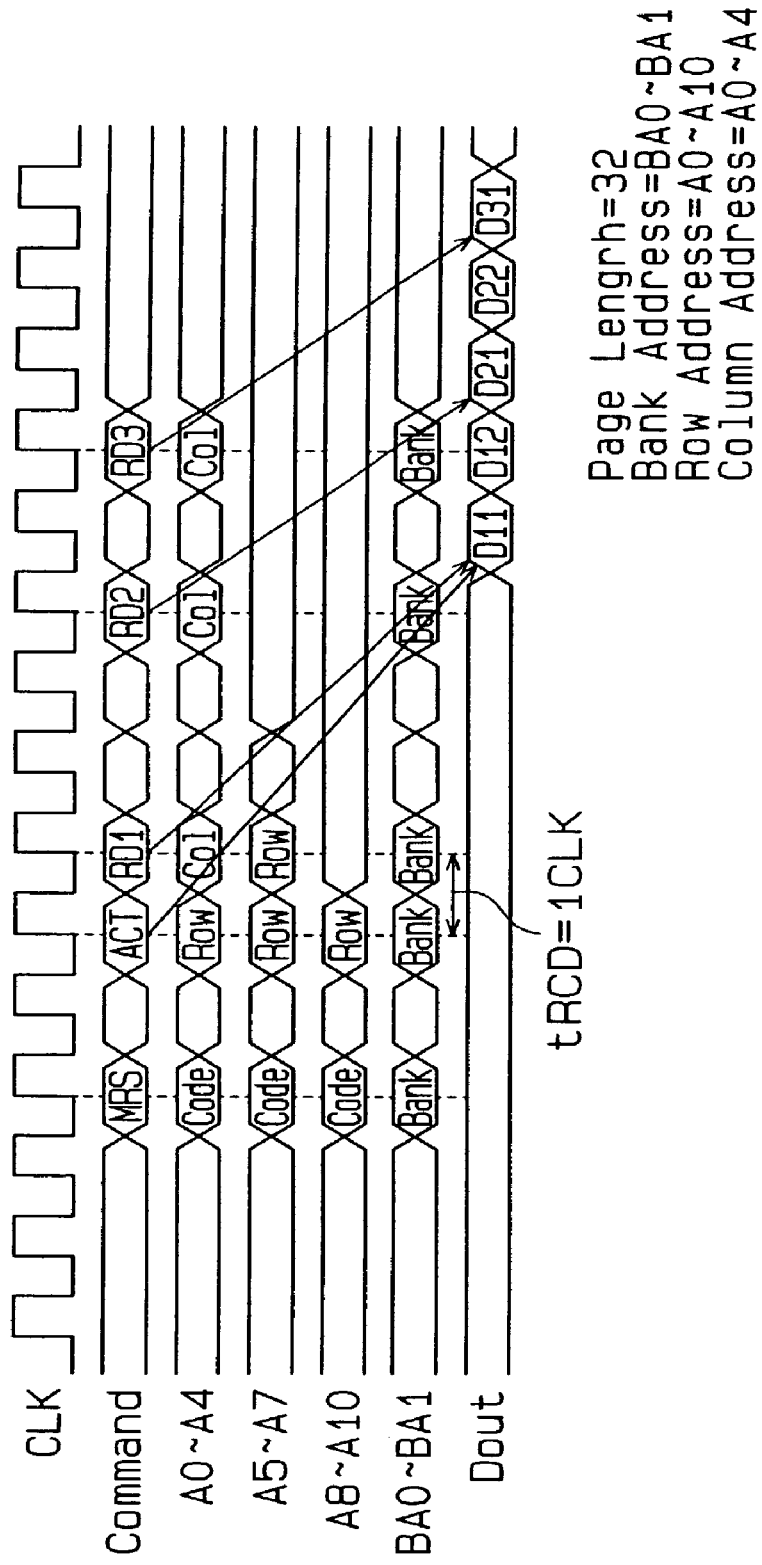
FIG. 50 is a waveform diagram illustrating the internal operation of a memory device according to a sixth embodiment of the invention.

FIG. 50 is a waveform diagram illustrating the internal operation of the sixth embodiment.

In the sixth embodiment, as shown in FIG. 50, the read command RD1 is supplied after one clock of the activation command ACT. A time tRCD for the first read command RD1 to be supplied from the point of time at which the activation command ACT has been supplied is set to tRCD=1 and the read command RD1 is supplied earlier by one clock than that in the fifth embodiment. (tRCD=2 (see FIG. 32) in the fifth embodiment.) Therefore, the X address signal XA<11:13> which increases in accordance with a change in page length (from 256 to 32) is supplied earlier by one clock than that in the fifth embodiment. This allows a sub word line SWL and associated sense amplifiers S/A to be enabled earlier by nearly one clock.

In general, to completely terminate the operation to enable a word line WL and a sub word line SWL, a predetermined delay (wait) period is needed from the inputting of the activation command ACT to the initiation of an access operation in response to the read command RD1 input. The delay period, which varies depending on the frequency of the clock signal, normally requires two clocks for the ordinary clock frequency of machines that are used at present. The start timing for the access operation in response to the read command RD1 should be delayed by substantially one clock from the point at which the read command RD1 has been input.

The CAS latency tCL defines the period (the number of clocks) from the inputting of a read command to the outputting of read data. As shown in FIG. 50, therefore, the CAS latency tCL corresponding to the first read command RD1 is changed to tCL=4 from the value of the preset CAS latency tCL=3 (set value). Therefore, the memory device 110 sequentially outputs read data D11 and D12 after four clocks since the generation of the read command RD1.

Thereafter, in response to the read commands RD2 and RD3, the memory device 110 sequentially fetches the Y address signal YA<0:4> and bank address signal BA<0:1> and sequentially outputs read data in accordance with the preset CAS latency tCL (tCL=3: set value).

At this time, in response to the second and subsequent read commands RD2 and RD3, the increased X address signal XA is not fetched but only the Y address signal YA<0:4> and bank address signal BA<0:1> are supplied. Although the foregoing description of the sixth embodiment has been given of the read commands RD1 to RD3, the same is applied to the case of write commands.

Figure 51:
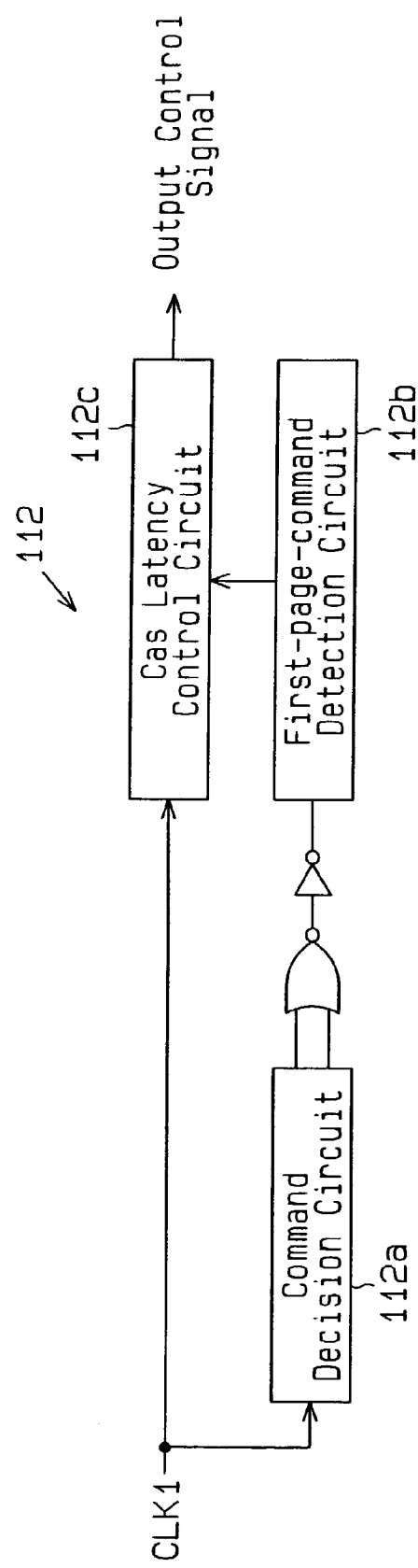
FIG. 51 is a block diagram illustrating a control method for the CAS latency of the memory device in FIG. 50.

FIG. 51 is a block diagram illustrating a control method for the CAS latency tCL.

In the sixth embodiment, the command decoder 112 (see FIG. 28) includes the command decision circuit 112a, the first-page-command detection circuit 112b and a CAS latency control circuit 112c.

The command decision circuit 112a determines whether the input command is a read command or a write command and generates a read enable signal or write enable signal according to the decision. The read enable signal or write enable signal is supplied to the command detection circuit 112b. The command detection circuit 112b detects the first read enable signal or write enable signal supplied from the command decision circuit 112a and generates a detection signal. The detection signal is supplied to the CAS latency control circuit 112c.

In response to the internal clock signal CLK1, the CAS latency control circuit 112c generates an output control signal according to a predetermined number of clocks and controls the CAS latency tCL. The CAS latency tCL is the time from the point at which an internal command (read command RD1, RD2 or RD3 in FIG. 50) to the time at which output data is settled.

When receiving the detection signal from the command detection circuit 112b, the CAS latency control circuit 112c changes the value of CAS latency tCL at that time in response to the detection signal. Specifically, the CAS latency control circuit 112c of the sixth embodiment sets the value of the CAS latency tCL greater by 1 than the predetermined value (set value) in response to the detection signal from the command detection circuit 112b.

In FIG. 50, the CAS latency tCL is set to tCL=3 (set value) by the mode-register setting command MRS. Next, when the first read command RD1 since the generation of the activation command ACT is supplied, the CAS latency control circuit 112c receives the detection signal from the command detection circuit 112b. In accordance with the detection signal, the CAS latency control circuit 112c changes the value of the CAS latency tCL (tCL=3: set value) to tCL=4. The CAS latency control circuit 112c changes the CAS latency tCL to tCL=4 only when the first read command RD1 is inputted and sets tCL=3 in response to the second and subsequent read commands RD2 and RD3.

The memory device 40 according to the sixth embodiment has the following advantage.

The memory device 110 receives the first read command RD1 after the inputting of the activation command ACT earlier by one clock than that in the fifth embodiment. At this time, the memory device 110 receives the X address signal XA which increases in accordance with a change in page length earlier by one clock than that in the fifth embodiment. It is therefore possible to enable a sub word line SWL and sense amplifiers S/A quicker by nearly one clock. As the CAS latency control circuit 112c changes the CAS latency tCL with respect to the read command RD1 to tCL=4 at that time, a sufficient period can be secured from the time at which the sub word line SWL and sense amplifiers S/A have been enabled to the time at which read data is outputted.

The seventh embodiment of the invention will now be described.

The seventh embodiment is directed to another control method for fetching an X address which increases in accordance with a change in page length in case where the page length PL is changed to 32 from 256 using the memory device 110 of the fifth embodiment.

Figure 52:
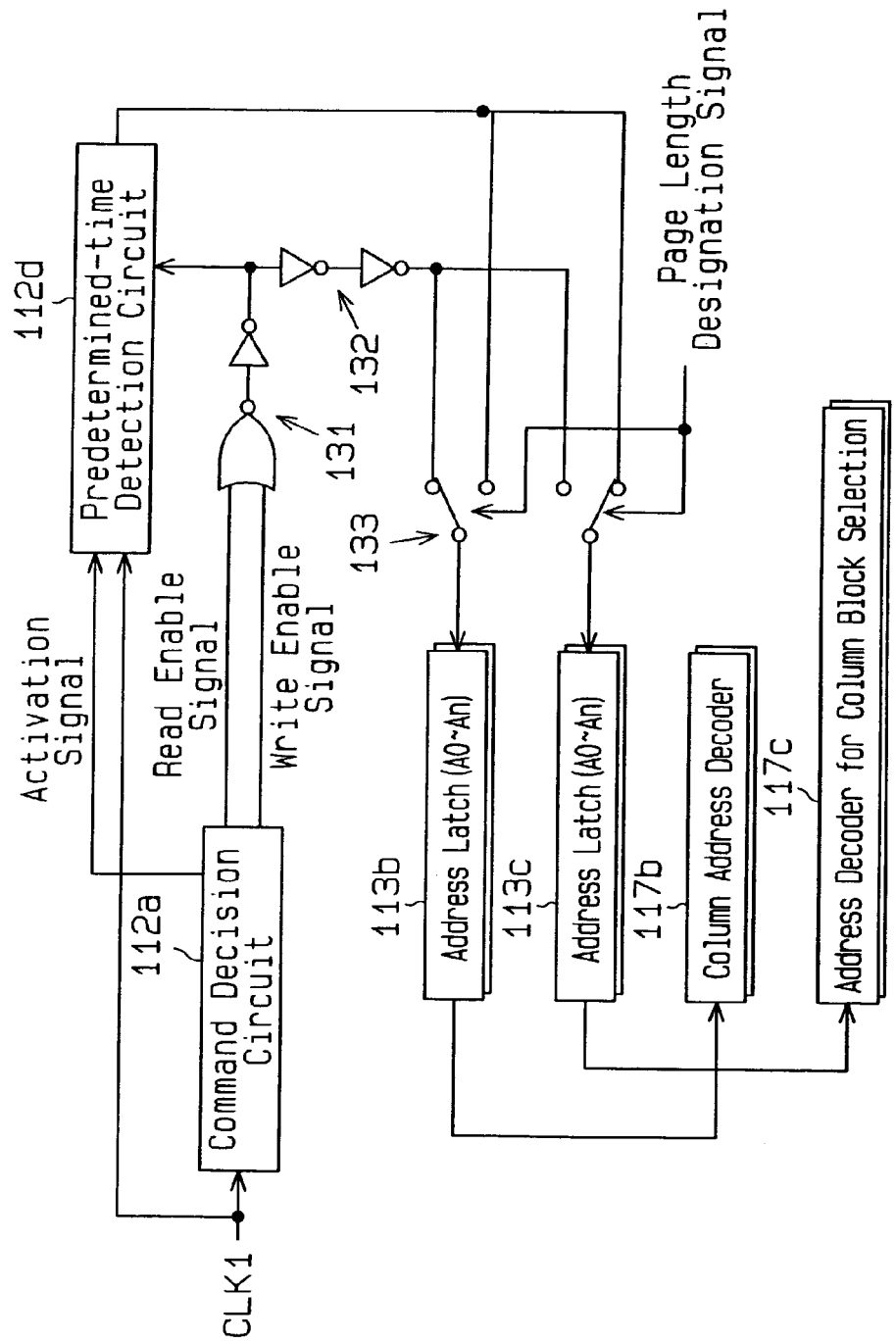
FIG. 52 is a block diagram illustrating access control for a memory device according to a seventh embodiment of the invention.

FIG. 52 is a block diagram illustrating access control according to the seventh embodiment.

In the seventh embodiment, the command decoder 112 (see FIG. 28) includes the command decision circuit 112a and predetermined-time detection circuit (hereinafter referred to as "detection circuit") 112d. The detection circuit 112d receives the internal clock signal CLK1 and the activation signal and read or write enable signal that are supplied from the command decision circuit 112a.

The command decision circuit 112a generates the activation signal when the internal command is the activation command ACT. In response to the activation signal, the detection circuit 112d generates an address fetch signal for receiving an increased X address signal after a predetermined time (hereinafter called "address latency tAL") passes.

In the seventh embodiment, the address latency tAL is set in accordance with the internal clock signal CLK1 and the detection circuit 112d generates the address fetch signal after counting a predetermined number of clocks of the internal clock signal CLK1. At this time, the detection circuit 112d outputs the address fetch signal until the first read enable signal or write enable signal is supplied from the command decision circuit 112a.

When the page length PL is set to 32, a switch circuit 133 is switched to a contact position shown in FIG. 52 by the page length designation signal ASS.

The third address buffer 113c receives and amplifies the address signals A0–An in accordance with the address fetch signal from the detection circuit 112d. The buffer 113c generates X address data according to the address signals A0–An and latches the X address data. The X address data is supplied to the third decoder 117c. The third decoder 117c supplies the DRAM core 119 (FIG. 28) with a column block address for designating the column block (sub word line SWL) that corresponds to the X address data.

Figure 53:
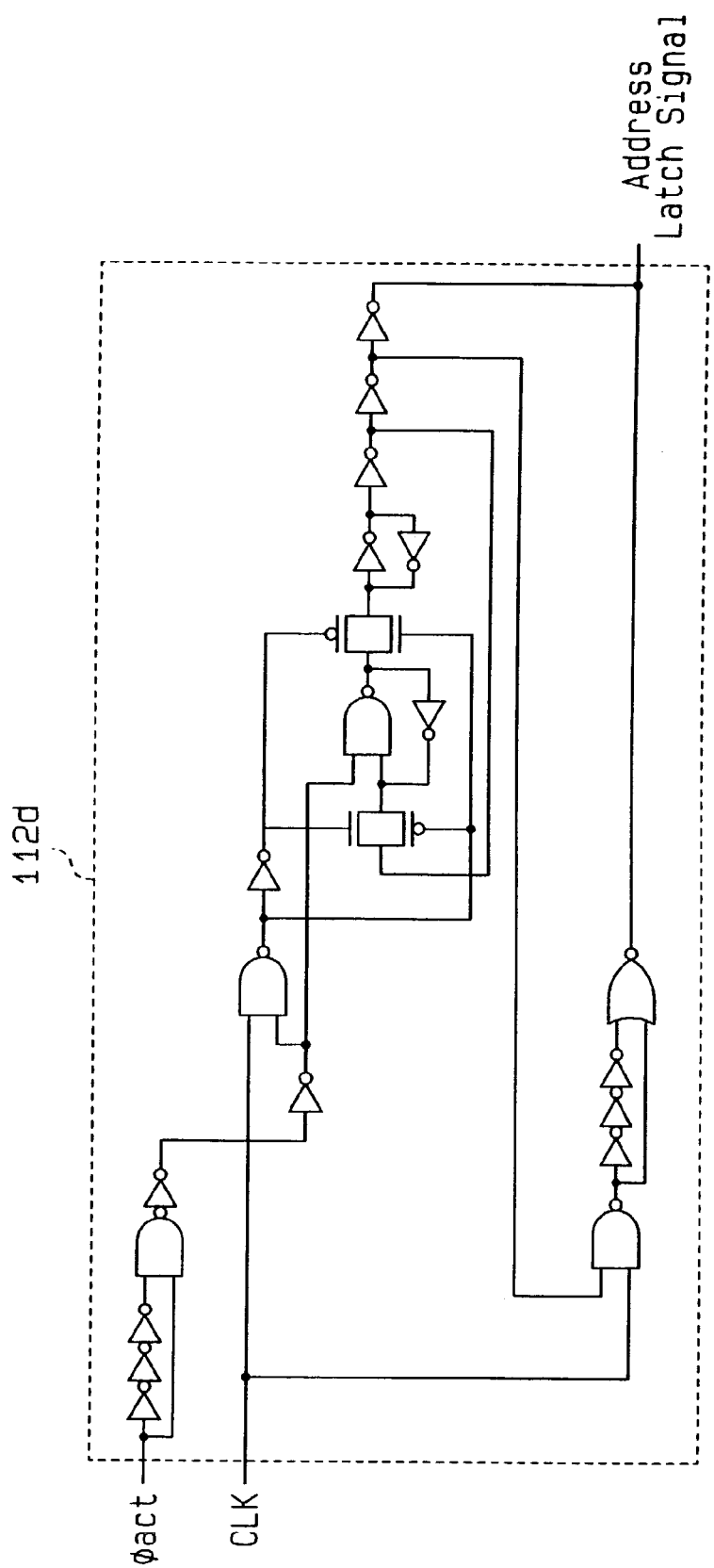
FIG. 53 is a schematic circuit diagram of a predetermined-time detection circuit in the memory device according to the seventh embodiment.

As shown in FIG. 52, the X address signal (increased X address) that is supplied in accordance with the detection signal from the detection circuit 112d is supplied by either the second address buffer 113b or the third address buffer 113c in accordance with the page length designation signal ASS. FIG. 53 is a circuit diagram showing one example of the specific circuit structure of the detection circuit 112d in FIG. 52.

Figure 54:
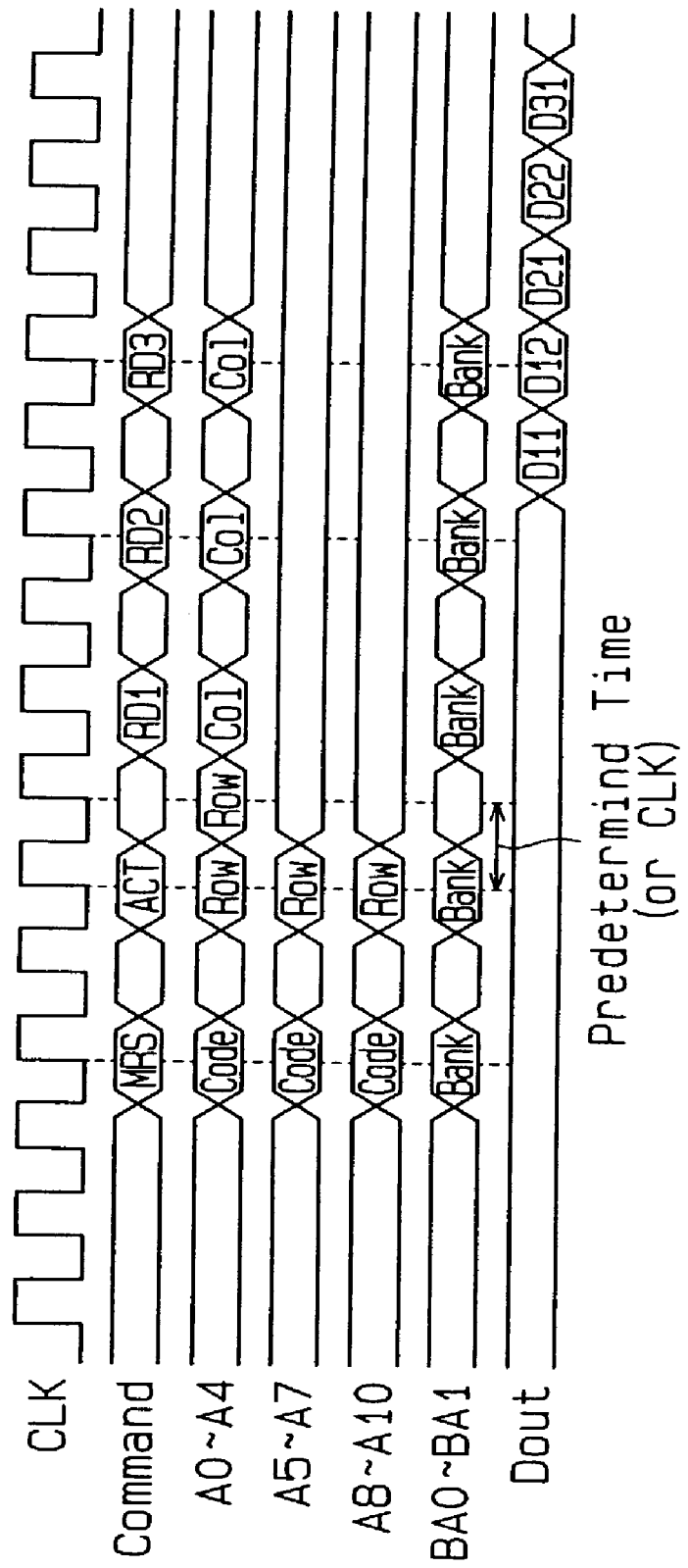
FIG. 54 is a waveform diagram illustrating the internal operation of the memory device in FIG. 53.

FIG. 54 is a waveform diagram illustrating the internal operation of the embodiment. The following description on FIG. 54 will be given of the case where the address latency tAL of the detection circuit 112d is set to, for example, tAL=1.

As shown in FIG. 54, the X address signal XA<0:4> which increases in accordance with a change in page length PL (changed to 32 from 256) is supplied to by the address fetch signal from the detection circuit 112d after one clock since the inputting of the activation command ACT. At this time, a column block (sub word line SWL) is selected and the selected sub word line SWL and associated sense amplifiers S/A are enabled.

Thereafter, in response to the read commands RD1–RD3, the memory device 110 sequentially fetches the Y address signal YA<0:4> and bank address signal BA<0:1> and sequentially outputs read data according to the preset CAS latency (tCL=3) and burst length (BL=2). At this time, in response to the read commands RD1–RD3, the increased X address signal XA is not fetched but only the Y address signal YA<0:4> and bank address signal BA<0:1> are supplied. Although the foregoing description of the seventh embodiment has been given of the read commands RD1 to RD3, the same is applied to the case of write commands.

The memory device 110 according to the seventh embodiment has the following advantages.

(1) In response to the activation signal from the command decision circuit 112a, the detection circuit 112d of the command decoder 112 generates an address fetch signal after a predetermined time (address latency tAL) elapses. Therefore, the X address signal XA which increases in accordance with a change in page length PL is supplied to after one clock of the activation command ACT (tAL=1). This can ensure quick enabling of a sub word line SWL and sense amplifiers S/A. As the increased X address signal XA is supplied at a quicker timing than the inputting of the read command RD1, the fetching of the increased X address signal XA does not depend on the layout of the external address terminals.

(2) The timings for the activation command ACT and read command RD and the address signal that is designated at the time of outputting each command do not depend on the page length (logical address map). The memory controller (CPU) merely generates the address signal that corresponds to the X address to be extended and supplies the address signal to the memory device 110 between the activation command ACT and the read command RD. This makes the alteration of the logical address map easier and can ensure the use of a new function (the function of changing the logical address map) without going through much trouble.

The eighth embodiment of the invention will now be described. In the eighth embodiment, the address latency tAL of the detection circuit 112d according to the seventh embodiment is set to, for example, tAL=0.5.

Figure 55:
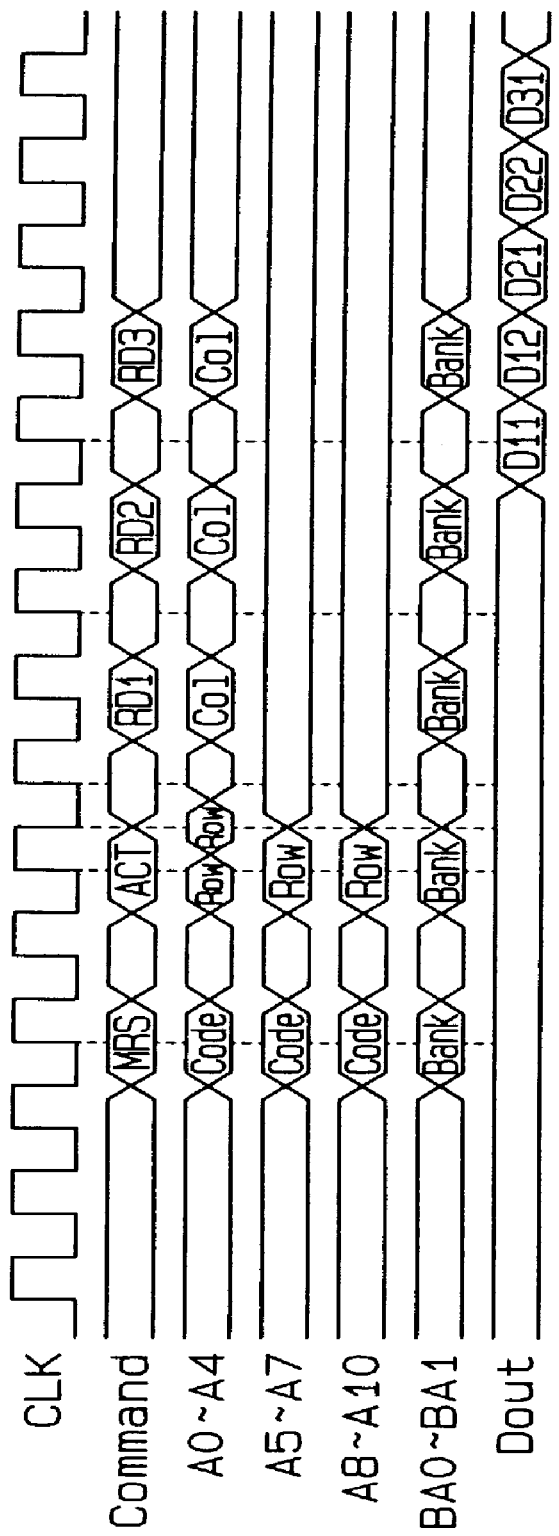
FIG. 55 is a waveform diagram illustrating the internal operation of a memory device according to an eighth embodiment of the invention.

FIG. 55 is a waveform diagram illustrating the internal operation of the memory device 110 according to the eighth embodiment. As shown in FIG. 55, the X address signal XA which increases in accordance with a change in page length PL (changed to 32 from 256) is supplied in accordance with the address fetch signal from the detection circuit 112d after a 0.5 clock since the inputting of the activation command.

The memory device 110 fetches the X address signal XA<0:10> at the rising edge of the clock signal CLK after the activation command ACT has been input, and receives the increased X address signal XA<0:4> at the falling edge of the clock signal CLK after 0.5 clock.

In the eighth embodiment, setting the address latency tAL=0.5 causes the increased X address signal XA to be supplied quicker by 0.5 clock than that in the seventh embodiment. Therefore, a sub word line SWL and sense amplifiers S/A are enabled quicker by nearly 0.5 clock.

Thereafter, the memory device 110 sequentially receives the Y address signal YA<0:4> and bank address signal BA<0:1> in response to the read commands RD1–RD3. Read data is sequentially output in accordance with the preset CAS latency (tCL=3) and burst length (BL=2). At this time, in response to the read commands RD1–RD3, the increased X address signal XA is not fetched but only the Y address signal YA<0:4> and bank address signal BA<0:1> are supplied. Although the foregoing description of the eighth embodiment has been given of the read commands RD1 to RD3, the same is applied to the case of write commands.

The memory device 110 according to the eighth embodiment has the following advantages.

(1) In the eighth embodiment, because the address latency tAL is set to tAL=0.5, the X address signal XA which has increased in accordance with a change in page length PL is supplied after 0.5 clock of the activation command ACT. The eighth embodiment can therefore enable a sub word line SWL and sense amplifiers S/A quicker by nearly 0.5 clock than the seventh embodiment. Accordingly, the start timing for an access operation according to the read command RD1 is not delayed at the time the page length is changed.

It should be apparent to those skilled in the art that the present invention may be embodied in many other specific forms without departing from the spirit or scope of the invention. Particularly, it should be understood that the invention may be embodied in the following forms In the fifth to eighth embodiments, two types of input activation commands ACT may be used so that the page length is designated in accordance with the two types of input activation commands ACT.

In the fifth and sixth embodiments, after the X address signal which has increased in accordance with a change in page length is fetched by the first read/write command, the Y address signal may be supplied after a predetermined number of clocks (e.g., after one clock) of the command.

In the eighth embodiment, the increased X address signal may be received by using a double date rate (DDR) system. In this case, two complementary clock signals CLK and /CLK are used. The X address signal may be received in accordance with the rising of the clock signal CLK and the increased X address signal may be received in accordance with the rising of the clock signal /CLK which directly follows the clock signal CLK and whose phase differs by 180 degrees from the clock signal CLK.

In the fifth to eighth embodiments, the alteration of the logical address map may be adapted to an asynchronous memory. In this case, the logical address map is changed by the illegal entry system that has been discussed in the foregoing description of the fourth embodiment.

In case where the seventh and eighth embodiments are adapted to an asynchronous memory device, the detection circuit 112d may generate and output its detection signal after a predetermined time (tAL) passes, without depending on the internal clock signal CLK1.

In the individual embodiments, the logical address map may be set by an internal fuse provided in the memory device or a bonding option. In this case, the desired logical address map is set by cutting the internal fuse or changing the bonding mode at the time of shipping products or at the time a user uses the memory device. The memory device may be designed to have a setting circuit (storage circuit) which can be programmed by an external device in order to set the logical address map so that the logical address map is changed as needed. In those cases, the logical address map is fixed over a short period of time or a long period of time. This can allow the use of an existing program or CPU. It is also possible to eliminate the trouble of changing the logical address map every row access cycle.

In each embodiment, a main word line WL may be enabled at the same time as a sub word line SWL is.

Each embodiment may be embodied into a memory device which has all the external address terminals corresponding to the X address signal and Y address signal.

In each embodiment, the number of the bits of memory cells, the address structure and the type of switching the address structure may be changed as needed.

In case where the depth of the X address is shallower than the depth of the Y address, the address structure setting terminal may be shared by the address terminals that are not used at the time they are active.

The command that sets the address structure may be a precharge command or another new command besides the activation command.

The logical address map may be changed independently bank by bank. The setting (altering) the logical address map bank by bank can further improve the system performance.

The position of an address bit to be invalidated may be changed as needed.

Therefore, the present examples and embodiments are to be considered as illustrative and not restrictive. The present invention is not to be limited to the details described herein, but may be modified or otherwise implemented within the scope and equivalence of the following claims.

What is claimed is:

1. A memory device comprising:
   a memory array including a plurality of memory cells arranged in accordance with a first address and a second address which define a logical address map indicating a logical shape of the memory array; and
   an address map changing unit, operatively coupled to the memory array, for receiving a first address signal for generating the first address and a second address signal for generating the second address, wherein the address map changing unit is capable of changing the logical address map by altering a part of one of the first address signal and the second address signal.

2. The memory device according to claim 1, wherein the address map changing unit changes the logical address map every time the memory array is activated.

3. The memory device according to claim 1, wherein the address map changing unit changes the logical address map in a standby period of the memory device or in an activation period of the memory device.

4. The memory device according to claim 1, further comprising:
   an internal circuit, wherein the address map changing unit maintains the logical address map at least in a period from a point at which the internal circuit is activated in accordance with the first address or the second address to a point at which the internal circuit is inactivated.

5. The memory device according to claim 1, wherein the address map changing unit changes the logical address map by altering a depth of at least one of the first and second addresses.

6. The memory device according to claim 1, further comprising a control terminal for controlling the first and second address signals.

7. The memory device according to claim 1, wherein the memory array includes a plurality of banks, and
   the address map changing unit changes the logical address map bank by bank.

8. A memory device comprising:
   a memory array including a plurality of memory cells arranged in accordance with a first address and a second address which define a logical address map indicating a logical shape of the memory array;
   an address buffer, operatively coupled to the memory array, for receiving a plurality of address signals which include a first address signal for generating the first address; and
   an address control unit, operatively coupled to the address buffer, for generating the first address or the second address by using a part of the first address signal in accordance with access information for changing the logical address map every time the first address signal is inputted.

9. The memory device according to claim 8, further comprising:
   an address structure selection circuit, operatively coupled to the address control unit, for generating an address structure select signal according to a change in the logical address map by a control signal including the access information or a combination of a plurality of control signals, wherein the address control unit generates the first address or the second address by using a part of the first address signal in accordance with the address structure select signal.

10. The memory device according to claim 9, further comprising:
    an address generation circuit, operatively coupled to the address structure selection circuit, for receiving the plurality of address signals and the address structure select signal;
    a first signal generation circuit, operatively coupled to the address generation circuit, for generating a first address select signal; and
    a second signal generation circuit, operatively coupled to the address generation circuit, for generating a second address select signal;
    wherein the address generation circuit includes a switch circuit for selectively supplying the plurality of address signals to either the first signal generation circuit or the second signal generation circuit.

11. The memory device according to claim 8, further comprising:
    a first signal generation circuit, operatively coupled to the address structure selection circuit, for receiving the plurality of address signals and generating a first address select signal in accordance with the address structure select signal; and
    a second signal generation circuit, operatively coupled to the address structure selection circuit, for receiving the plurality of address signals and generating a second address select signal in accordance with the address structure select signal.

12. The memory device according to claim 8, wherein the address control unit includes a bonding option for storing the access information or a fuse.

13. The memory device according to claim 8, wherein the address control unit includes a storage circuit which stores the access information that is rewritable by an external device.

14. A memory device comprising:
    a memory array including a plurality of memory cells arranged in accordance with a first address and a second address which define a logical address map indicating a logical shape of the memory array;
    an address buffer, operatively coupled to the memory array, for receiving a plurality of address signals which include a first address signal for generating the first address; and
    an address-signal invalidation unit, operatively coupled to the address buffer, for invalidating at least a part of the plurality of address signals in accordance with access information for changing the logical address map every time the first address signal is inputted.

15. The memory device according to claim 14, wherein the plurality of address signals include a second address signal for generating the second address, and the address-signal invalidation unit includes a clamp circuit for clamping at least a part of the plurality of address signals to change a decoding compression rate of the first address signal and a decoding compression rate of the second address signal.

16. The memory device according to claim 15, further comprising an address structure selection circuit for generating an address structure select signal corresponding to a change in the logical address map by a control signal including the access information or a combination of a plurality of control signals, and
wherein the address-signal invalidation unit invalidates at least a part of the first address signal in accordance with the address structure select signal.

17. The memory device according to claim 15, wherein the address-signal invalidation unit includes a bonding option for storing the access information or a fuse.

18. The memory device according to claim 15, wherein the address-signal invalidation unit includes a rewritable access information storage circuit which stores the access information.

19. An internal control method for changing a logical address map of a memory device having a memory array including a plurality of memory cells arranged in accordance with a first address and a second address, which are generated in accordance with a plurality of address signals, the logical address map being defined in accordance with the first address and second address and indicating a logical shape of the memory array, the method comprising the steps of:
receiving the plurality of address signals;
receiving access information for changing the logical address map;
generating a plurality of first address signals for generating the first address in accordance with the plurality of address signals and the access information;
generating a plurality of second address signals for generating the second address in accordance with the plurality of address signals and the access information; and
invalidating one of a part of the plurality of first address signals and a part of the plurality of second address signals in accordance with the access information every time the plurality of first address signals are generated.

20. The method according to claim 19, wherein the step of receiving the access information receives the access information in a standby period of the memory device or at a same time as an active operation of the memory device is performed.

21. The method according to claim 19, wherein the memory device includes a plurality of sense amplifiers at least one of which is activated by the first address and selected by the second address, and
further comprising the step of changing an activation number of the plurality of sense amplifiers in accordance with a change in the logical address map.

22. The method according to claim 19, further comprising the step of changing a decoding compression rate of the plurality of first address signals and a decoding compression rate of the plurality of second address signals in accordance with a change in the logical address map.

23. The method according to claim 19, further comprising the step of generating an address structure select signal according to a change in the logical address map by a control signal including the access information or a combination of a plurality of control signals, and
wherein the invalidation step invalidates one of a part of the plurality of first address signals and a part of the plurality of second address signals in accordance with the address structure select signal.

24. The method according to claim 23, wherein the memory device includes a common address generation circuit for generating the first and second addresses, and
further comprising the step of switching where to supply the first and second addresses in accordance with the address structure select signal.

25. The method according to claim 23, wherein the memory device includes a first and second address generation circuits for generating the first and second addresses in accordance with the plurality of address signals, and
further comprising the step of selecting to which one of the first and second address generation circuits the plurality of address signals are to be supplied, in accordance with the address structure select signal.

26. A system comprising:
a memory device; and
a control device operatively coupled to the memory device for supplying the memory device with from-moment-to-moment access information,
wherein the memory device includes:
a memory array including a plurality of memory cells arranged in accordance with a first address and a second address which define a logical address map indicating a logical shape of the memory array, and
an address control circuit, operatively coupled to the memory array, for changing the logical address map of the memory array in accordance with the access information, and
wherein the memory device includes
a plurality of address input terminals for receiving an external address for generating the first address or the second address, and
wherein the control device inserts the access information into either code information originated from address data supplied to the address input terminals or code information originated from a control signal for controlling the memory device and supplies the access information in that form to the memory device.

27. The system according to claim 26, wherein the control device supplies the access information to the memory device at a same time as or before the external address is provided.

28. The system according to claim 26, wherein the control device provides the access information by the code information originated from the control signal for controlling the memory device, and
the memory device receives the code information at a timing of an edge of a pulse signal of a given period.

29. A control method for a memory device in a system including the memory device and a control device, connected to the memory device, for controlling the memory device which includes a memory array including a plurality of memory cells laid out in an array form in accordance with a first address and a second address which define a logical address map indicating a logical shape of the memory array, and a plurality of address input terminals, the method comprising the steps of:
supplying the plurality of address input terminals with an external address for generating the first address or the second address;
causing the control device to supply the memory device with from-moment-to-moment access information;
inserting the access information into either code information originated from address data supplied to the address input terminals or code information originated from a control signal for controlling the memory device and supplying the access information in that form to the memory device; and causing the control device to change the logical address map of the memory array in accordance with the access information.

30. A memory device comprising:

a memory array including a plurality of memory cells arranged in accordance with a first address and a second address which define a logical address map indicating a logical shape of the memory array;

an address buffer, operatively coupled to the memory array and having a plurality of address input terminals, for receiving an external address for generating the first address or the second address at the plurality of address input terminals which include input terminals corresponding to either the first address of M bits or the second address of N bits whichever has a greater number of bits; and an address control circuit, operatively coupled to the address buffer, for replacing a part of the external address with the first address or the second address in accordance with access information for changing the logical address map.

31. The memory device according to claim 30, further comprising a predetermined-time detection circuit, operatively coupled to the address buffer, for generating a control signal for receiving an i-bit increment address which increases in accordance with a change in the logical address map after a predetermined time passes since fetching of the first address and supplying the control signal to the address buffer.

32. The memory device according to claim 31, wherein the predetermined-time detection circuit generates the control signal after a predetermined number of clocks of a clock signal in response to an activation command of receiving the first address.

33. The memory device according to claim 31, further comprising:

a plurality of word lines at least one of which is selected by the first address; and a word-line enable circuit for enabling at least one word line in accordance with the control signal for receiving the i-bit increment address.

34. The memory device according to claim 31, further comprising:

a plurality of sense amplifiers at least one of which is selected by the second address; and a sense-amplifier enable circuit for enabling a part of the plurality of sense amplifiers in accordance with the control signal for receiving the i-bit increment address.

35. The memory device according to claim 30, further comprising a command detection circuit, operatively coupled to the address buffer, for generating a control signal for receiving an i-bit increment address, which increases in accordance with a change in the logical address map, in accordance with a command to be issued at a time of controlling fetching of the second address of (N−i) bits and supplying the control signal to the address buffer.

36. The memory device according to claim 35, wherein the command detection circuit detects a first read or write command after an activation command of receiving the first address and generates the control signal in accordance with the detected read or write command.

37. The memory device according to claim 36, further comprising a CAS latency control circuit for setting a CAS latency corresponding to the first read or write command in accordance with the control signal from the command detection circuit.

38. The memory device according to claim 30, further comprising an address structure selection circuit, operatively coupled to the address control circuit, for generating an address structure select signal according to a change in the logical address map by a control signal including the access information or a combination of a plurality of control signals, and wherein the address control circuit replaces a part of the external address with the first address or the second address in accordance with the address structure select signal.

39. The memory device according to claim 38, further comprising an address generation circuit, operatively coupled to the address structure selection circuit, for receiving the plurality of address signals and the address structure select signal, the address generation circuit including:

a first signal generation circuit for generating a first address select signal;

a second signal generation circuit for generating a second address select signal; and a switch circuit for selectively supplying the external address to either the first signal generation circuit or the second signal generation circuit.

40. The memory device according to claim 30, wherein the address control circuit includes a bonding option for setting the access information or a fuse.

41. The memory device according to claim 30, wherein the address control circuit includes a storage circuit which stores the access information that is rewritable by an external device.

42. A memory device comprising:

a memory array including a plurality of memory cells arranged in accordance with a first address and a second address which define a logical address map indicating a logical shape of the memory array;

an address buffer, operatively coupled to the memory array and having a plurality of address input terminals, for receiving an external address for generating the first address or the second address at the plurality of address input terminals which include input terminals corresponding to either the first address of M bits or the second address of N bits whichever has a greater number of bits; and an address invalidation circuit, operatively coupled to the address buffer, for invalidating at least a part of the external address in accordance with access information for changing the logical address map.

43. The memory device according to claim 42, wherein the address invalidation circuit includes a clamp circuit for clamping an arbitrary address to change a decoding compression rate of at least one of the first and second addresses.

44. The memory device according to claim 42, further comprising an address structure selection circuit, operatively coupled to the address invalidation circuit, for generating an address structure select signal according to a change in the logical address map by a control signal including the access information or a combination of a plurality of control signals, and wherein the address invalidation circuit invalidates at least a part of the external address in accordance with the address structure select signal.

45. The memory device according to claim 44, further comprising an address generation circuit, operatively coupled to the address structure selection circuit, for receiving the plurality of address signals and the address structure select signal, the address generation circuit including:
a first signal generation circuit for generating a first address select signal;
a second signal generation circuit for generating a second address select signal; and
a switch circuit for selectively supplying the external address to either the first signal generation circuit or the second signal generation circuit.

46. The memory device according to claim 42, wherein the address invalidation circuit includes a bonding option for setting the access information or a fuse.

47. The memory device according to claim 42, wherein the address invalidation circuit includes a storage circuit which stores the access information that is rewritable by an external device.

48. A memory device comprising:
a memory array including a plurality of memory cells arranged in accordance with a first address and a second address which define a logical address map indicating a logical shape of the memory array;
an address buffer, operatively coupled to the memory array and having a plurality of address input terminals, for receiving an external address for generating the first address and the second address at the plurality of address input terminals which include input terminals for simultaneously receiving the first address of M bits and the second address of N bits; and
an address control circuit, operatively coupled to the address buffer, for replacing a part of the external address with the first address or the second address in accordance with access information for changing the logical address map.

49. A memory device comprising:
a memory array including a plurality of memory cells arranged in accordance with a first address and a second address which define a logical address map indicating a logical shape of the memory array;
an address buffer, operatively coupled to the memory array and having a plurality of address input terminals, for receiving an external address for generating the first address and the second address at the plurality of address input terminals which include input terminals for simultaneously receiving the first address of M bits and the second address of N bits; and
an address invalidation circuit, operatively coupled to the address buffer, for invalidating at least a part of the external address in accordance with access information for changing the logical address map.

50. An internal control method for changing a logical address map of a memory device having a memory array including a plurality of memory cells arranged in accordance with a first address and a second address which define the logical address map indicating a logical shape of the memory array and a plurality of address input terminals for receiving an external address for generating the first address or the second address, the plurality of address input terminals including input terminals corresponding to either the first address of M bits or the second address of N bits whichever has a greater number of bits or input terminals for simultaneously receiving the first address of M bits and the second address of N bits, the method comprising the steps of:
receiving the external address;

receiving access information for changing the logical address map; and
replacing a part of the external address with the first address or the second address in accordance with the access information.

51. The method according to claim 50, wherein the step of receiving the access information receives the access information in a standby period of the memory device or at a same time as an active operation of the memory device is performed.

52. The method according to claim 50, wherein the memory device includes a plurality of sense amplifiers at least one of which is selected by the second address, further comprising the step of changing an activation number of the plurality of sense amplifiers in accordance with a change in the logical address map.

53. The method according to claim 50, further comprising the step of changing a decoding compression rate of either the second address or the second address in accordance with a change in the logical address map.

54. The method according to claim 50, further comprising the step of generating an address structure select signal according to a change in the logical address map by a control signal including the access information or a combination of a plurality of control signals, and
wherein the replacing step replaces a part of the external address with the first address or the second address in accordance with the address structure select signal.

55. The method according to claim 54, wherein the memory device includes a common address generation circuit for generating the first and second addresses, further comprising the step of switching where to supply the first and second addresses in accordance with the address structure select signal.

56. The method according to claim 54, wherein the memory device includes a first and second address generation circuits for generating the first and second addresses in accordance with the external address, further comprising the step of supplying the external address to one of the first and second address generation circuits in accordance with the address structure select signal.

57. The method according to claim 50, further comprising the steps of:
receiving the first address via the plurality of address input terminals; and
receiving an i-bit increment address, which increases in accordance with a change in the logical address map, after fetching of the first address.

58. The method according to claim 57, wherein the step of receiving the first address receives the first address in synchronism with a clock signal, and wherein
the step of receiving the increment address includes the step of executing address latency control for receiving the i-bit increment address in synchronism with the clock signal.

59. The method according to claim 57, wherein the step of executing address latency control includes the step of receiving, beforehand, data of a predetermined number of clocks of the clock signal after fetching of the first address in order to generate a control signal for receiving the i-bit increment address.

60. The method according to claim 59, wherein the step of receiving data of the predetermined number of clocks is executed before or at a same time as the first address is received.

61. The method according to claim 60, further comprising the step of fetching an i-bit increment address, which increases in accordance with a change in the logical address map, in accordance with a next command after reception of an activation command of fetching the first address.

62. The method according to claim 61, wherein the step of fetching the increment address simultaneously receives the i-bit increment address and a read or write command after reception of the activation command.

63. The method according to claim 62, wherein the memory device includes a command detection circuit for detecting a first read or write command after reception of the activation command and generating a detection signal, further comprising the step of setting CAS latency corresponding to the first read or write command in accordance with the detection signal.

64. The method according to claim 63, wherein the memory device includes a plurality of word lines at least one of which is selected by the first address and a predetermined-time detection circuit for generating a fetch signal for fetching the i-bit increment address after a predetermined time passes since fetching of the first address, further comprising the step of enabling at least one word line in accordance with the detection signal from the command detection circuit or the fetch signal from the predetermined-time detection circuit.

65. The method according to claim 64, wherein the memory device includes a plurality of sense amplifiers at least one of which is selected by the second address, further comprising the step of enabling at least one sense amplifier in accordance with the detection signal from the command detection circuit or the fetch signal from the predetermined-time detection circuit.

66. The method according to claim 59, wherein the step of receiving data of the predetermined number of clocks includes setting a command signal to be supplied to the memory device in a mode register and receiving data of the predetermined number of clocks of the clock signal beforehand in accordance with the command signal.

67. The method according to claim 59, wherein the step of receiving data of the predetermined number of clocks is executed before the first address is received in accordance with a command signal including an address code or at a same time as the first address is received in accordance with two kinds of activation commands.

68. The method according to claim 50, further comprising the step of receiving an i-bit increment address, which increases in accordance with a change in the logical address map, and the second address of (N−i) bits at a same time.

69. The method according to claim 50, further comprising the steps of:
fetching the second address of (N−i) bits; and
receiving an i-bit increment address, which increases in accordance with a change in the logical address map, from at least one address input terminal which is not used when the second address of (N−i) bits is fetched.

70. An internal control method for changing a logical address map of a memory device having a memory array including a plurality of memory cells arranged in accordance with a first address and a second address and a plurality of address input terminals for receiving an external address for generating the first address or the second address, the logical address map being defined in accordance with the first address and the second address and indicating a logical shape of the memory array, the plurality of address input terminals including input terminals corresponding to either the first address of M bits or the second address of N bits whichever has a greater number of bits or input terminals for simultaneously receiving the first address of M bits and the second address of N bits, the method comprising the steps of:
receiving the external address;
receiving access information for changing the logical address map; and
invalidating at least a part of the external address in accordance with the access information.

71. The method according to claim 70, further comprising the step of generating an address structure select signal according to a change in the logical address map by a control signal including the access information or a combination of a plurality of control signals, wherein the invalidation step invalidates at least a part of the external address in accordance with the address structure select signal.

72. A system comprising:
a memory device; and
a control device operatively coupled to the memory device for supplying the memory device with from-moment-to-moment access information, wherein
the memory device including:
a memory array including a plurality of memory cells arranged in accordance with a first address and a second address which define a logical address map indicating a logical shape of the memory array,
a plurality of address input terminals for receiving an external address for generating the first address or the second address, and
an address control circuit, operatively coupled to the plurality of address input terminals and the memory array, for generating the first address in accordance with the external address and changing the logical address map of the memory array in accordance with the access information,
whereby the address control circuit generates an increment address of a predetermined number of bits in accordance with a change in the logical address map after generation of the first address.

73. The system according to claim 72, wherein the control device supplies the access information by means of either code information originated from address data or code information originated from a control signal.

74. The system according to claim 72, wherein the control device supplies the access information at a same time as or before the external address is provided.

75. A control method for a memory device in a system including the memory device and a control device, which is operatively coupled to the memory device and supplies from-moment-to-moment access information to the memory device, the memory device including a memory array including a plurality of memory cells arranged in accordance with a first address and a second address which define a logical address map indicating a logical shape of the memory array, the method comprising the steps of:
causing the control device to change the logical address map of the memory array in accordance with the from-moment-to-moment access information; and
generating an increment address of a predetermined number of bits in accordance with a change in the logical address map after generation of the first address.

76. A memory device comprising:
a memory array including a plurality of memory cells arranged in a matrix form in accordance with a first address and a second address which define a logical address map indicating a logical shape of the memory array;

a plurality of address input terminals for receiving a plurality of address signals for generating the first address or the second address;

an access information receiving circuit for receiving access information for changing the logical address map; and an address control unit, operatively coupled to the plurality of address input terminals and the access information receiving circuit, for changing at least one of a depth of the first address and a depth of the second address in accordance with an address change signal to be supplied from at least one of the plurality of address input terminals, in response to the access information.

77. The memory device according to claim 76, further comprising:

a plurality of main word lines at least one of which is selected by the first address;

plural groups of sub word lines which are respectively operatively coupled to the main word lines and one of which is selected by the address change signal; and a plurality of sense amplifiers provided in association with the plural groups of sub word lines, whereby when one of the plural groups of sub word lines is selected, the address control unit enables the selected group of sub word lines and a plurality of sense amplifiers associated with the selected group of sub word lines.

78. A memory device comprising:

a memory array including a plurality of memory cells arranged in accordance with a first address and a second address which define a logical address map indicating a logical shape of the memory array;

a plurality of address input terminals for receiving a plurality of address signals for generating the first address or the second address;

an address change terminal for receiving an address change signal for changing at least one of a depth of the first address and a depth of the second address;

an access information receiving circuit for receiving access information for changing the logical address map; and an address control unit, operatively coupled to the plurality of address input terminals and the access change terminal, for changing at least one of the depth of the first address and the depth of the second address in accordance with the address change signal in response to the access information.

79. The memory device according to claim 78, further comprising:

a plurality of main word lines at least one of which is selected by the first address;

plural groups of sub word lines which are respectively operatively coupled to the main word lines and one of which is selected by the address change signal; and a plurality of sense amplifiers provided in association with the plural groups of sub word lines, whereby when one of the plural groups of sub word lines is selected, the address control unit enables the selected group of sub word lines and a plurality of sense amplifiers associated with the selected group of sub word lines.

80. The memory device according to claim 79, wherein the address control unit receives the address change signal and the first address at a same time.

\* \* \* \* \*